US007305671B2

(12) United States Patent
Davidov et al.

(10) Patent No.: US 7,305,671 B2
(45) Date of Patent: *Dec. 4, 2007

(54) CONVERSION OF AN OBJECT MODEL TO A SOURCE FILE GENERATION MODEL

(75) Inventors: Eran Davidov, Nahariya (IL); Natan Linder, Herzlia (IL); Eyal Toledano, Kiryat Ata (IL); Omer Pomerantz, Herzlia (IL); Daniel Blaukopf, Ra'anana (IL)

(73) Assignee: Sun Microsystems, Inc., Menlo Park, CA (US)

( * ) Notice: Subject to any disclaimer, the term of this patent is extended or adjusted under 35 U.S.C. 154(b) by 643 days.

This patent is subject to a terminal disclaimer.

(21) Appl. No.: 10/348,893

(22) Filed: Jan. 23, 2003

(65) Prior Publication Data
US 2003/0225774 A1    Dec. 4, 2003

Related U.S. Application Data

(60) Provisional application No. 60/366,890, filed on Mar. 22, 2002.

(51) Int. Cl.
*G06F 9/44*    (2006.01)
*G06F 9/45*    (2006.01)

(52) U.S. Cl. .................. 717/172; 717/108
(58) Field of Classification Search ............. 717/109, 717/105, 143, 100, 172, 108; 715/764, 733, 715/744, 762, 765
See application file for complete search history.

(56) References Cited

U.S. PATENT DOCUMENTS 5,922,079 A    7/1999    Booth et al.
5,970,490 A   10/1999    Morgenstern ............. 707/10
6,002,868 A   12/1999    Jenkins et al.
6,026,437 A    2/2000    Muschett et al.
6,066,181 A *  5/2000    DeMaster ............... 717/148
6,167,352 A   12/2000    Kanevsky et al.
6,199,195 B1   3/2001    Goodwin et al. ........ 717/104
6,199,203 B1*  3/2001    Saboff .................. 717/168
6,219,829 B1   4/2001    Sivakumar et al.
6,321,274 B1  11/2001    Shakib et al. ............ 719/330
6,378,088 B1   4/2002    Mongan (Continued)

OTHER PUBLICATIONS

XML-based Hypertext Functionalities of Software Engineering, Luca Bompani et al, 13 pages, 2000.*

(Continued)

*Primary Examiner*—Todd Ingberg
(74) *Attorney, Agent, or Firm*—Sonnenschein Nath & Rosenthal LLP

(57) ABSTRACT

An infrastructure is provided for creating applications for mobile information devices, using a tag-based markup language. Developers can use the markup language to define applications and content based on easily manipulated textual tags, rather than having to write specific source code. A compiler, processes the tags in several phases. In one phase, a hierarchical object model of the application is populated with objects. Then, in another phase, a generator traverses the object model hierarchy in a top-down manner, producing source code files corresponding to objects in the object model. The code files may include various elements, for example screens, forms, and servlets. For each element required to be generated, an appropriately configured generator class is invoked. The output code can be Java source code.

68 Claims, 49 Drawing Sheets

U.S. PATENT DOCUMENTS

| | | | |
|---|---|---|---|
| 6,385,741 | B1 | 5/2002 | Nakamura |
| 6,397,378 | B1 | 5/2002 | Grey et al. |
| 6,442,754 | B1 * | 8/2002 | Curtis ........................ 717/175 |
| 6,449,731 | B1 | 9/2002 | Frey, Jr. |
| 6,560,721 | B1 | 5/2003 | Boardman et al. |
| 6,573,907 | B1 * | 6/2003 | Madrane ...................... 715/719 |
| 6,598,052 | B1 * | 7/2003 | Saulpaugh et al. ......... 707/102 |
| 6,604,209 | B1 | 8/2003 | Grucci et al. |
| 6,611,844 | B1 * | 8/2003 | Saulpaugh et al. ..... 707/103 R |
| 6,636,242 | B2 * | 10/2003 | Bowman-Amuah ......... 715/764 |
| 6,708,324 | B1 | 3/2004 | Solloway et al. |
| 6,742,175 | B1 | 5/2004 | Brassard ...................... 707/107 |
| 6,757,530 | B2 * | 6/2004 | Rouse et al. ............. 455/412.1 |
| 6,839,647 | B2 | 1/2005 | Volkov et al. |
| 6,847,916 | B1 | 1/2005 | Ying |
| 6,868,508 | B2 | 3/2005 | Grey |
| 6,877,155 | B1 | 4/2005 | Lindsey ...................... 717/108 |
| 6,901,583 | B1 | 5/2005 | Park ........................... 717/134 |
| 6,925,631 | B2 * | 8/2005 | Golden ....................... 717/115 |
| 6,957,417 | B2 * | 10/2005 | Turner et al. ............... 717/108 |
| 6,980,916 | B1 | 12/2005 | Katz et al. |
| 6,983,400 | B2 | 1/2006 | Volkov |
| 7,000,230 | B1 * | 2/2006 | Murray et al. .............. 717/172 |
| 7,017,148 | B2 | 3/2006 | Kumar ........................ 717/114 |
| 7,051,315 | B2 * | 5/2006 | Artzi et al. ................. 717/103 |
| 7,055,143 | B2 | 5/2006 | Ringseth et al. ............ 717/143 |
| 7,096,419 | B2 | 8/2006 | Barnes et al. ............... 715/513 |
| 7,127,705 | B2 * | 10/2006 | Christfort et al. ........... 717/113 |
| 2002/0087729 | A1 | 7/2002 | Edgar ......................... 709/246 |
| 2002/0108101 | A1 | 8/2002 | Charisius et al. |
| 2002/0131404 | A1 | 9/2002 | Mehta et al. |
| 2002/0184610 | A1 | 12/2002 | Chong et al. ............... 717/109 |
| 2003/0009539 | A1 | 1/2003 | Hattori ....................... 709/219 |
| 2003/0050932 | A1 | 3/2003 | Pace et al. .................. 707/100 |
| 2003/0051039 | A1 | 3/2003 | Brown et al. |
| 2003/0093769 | A1 | 5/2003 | Kumar |
| 2003/0131285 | A1 | 7/2003 | Beardsley et al. |
| 2003/0208743 | A1 | 11/2003 | Chong et al. |
| 2003/0236657 | A1 | 12/2003 | Ryzl |
| 2004/0015834 | A1 | 1/2004 | Mestre et al. |
| 2004/0015908 | A1 | 1/2004 | Giel et al. |
| 2004/0064503 | A1 | 4/2004 | Karakashian et al. ....... 709/203 |
| 2004/0153774 | A1 | 8/2004 | Gavish et al. |
| 2004/0215740 | A1 | 10/2004 | Frank et al. |
| 2004/0243381 | A1 | 12/2004 | Kuturianu et al. |
| 2004/0249885 | A1 | 12/2004 | Petropoulakis et al. |
| 2005/0172268 | A1 | 8/2005 | Kuturianu et al. |

OTHER PUBLICATIONS

JAVA and XML, Brett McLaughlin, pp. v-xvi, 1-199, 349-378, Jun. 5, 2000.*

Graphic Java 2 Mastering the JFC 3rd Edition vol. II Swing, David M. Geary, pp. vii-xxxvii, 1-151, 248-315, 628-714, 792-870, Mar. 12, 1999.*

Enterprise Development with VisualAge for Java version 3, Dale R. Nilsson et al, pp. vii-xxv, 1-127, 353-435, May 15, 2000.*

Programming Languages for Mobile Code, Tommy Thorn, ACM Computing Surveys, vol. 29, No. 3, Sep. 1997, 213-239.*

Mobile Information Device Profile (JSR-37), JCP Specification, Java 2 Platform, Micro Edition, 1.0a (Sun Microsystems Inc.)., Palo Alto, California, Dec. 2000.

Java™ 2 Platform, Micro Edition, by Sun Microsystems, 2002.

Mobile Information Device Profile (MIDP), (http://java.sun.com/products/midp/), 2002.

Mobile Information Device Profile (MIDP), (http://java.sun.com/products/midp/fag.html), 2002.

JavaServer Pages™, (http://java.sun.com/products/jsp/), 2002.

Developing XML Solutions with Pages™ Technology, (http://java.sun.com/products/jsp/html/JSPXML.html), 2002.

Java™ Technology and the New World of Wireless Portals and mCommerce, (http://java.com.sun.com/j2me/docs/html/mcommerce.html), 2002.

A white paper, "Applications for Mobile Information Devices", by Sun Microsystems, Nov. 2000.

Testscape script generator, IBM technical disclosure Bulletin, Jul. 2001, UK, issue No. 447, p. No. 1220, published Jul. 1, 2001.

Testharness for use in a distributed environment, IBM technical Discourse Bulletin, Dec. 1999, UK, issue No. 428, p. No. 1728, published Dec. 1, 1999.

Sarkar, et al, Code generation using XML based document transformation, The server Side : Nov. 2001, pp. 1-20.

Richard A. Stallman, "Using and Porting GNU CC", 1998, Free Software Foundation.

Donald E. Knuth, "The art of computer programming, vol. 1, fundamental algorithms", 1997, third edition, Addison Wesley Longman.

* cited by examiner

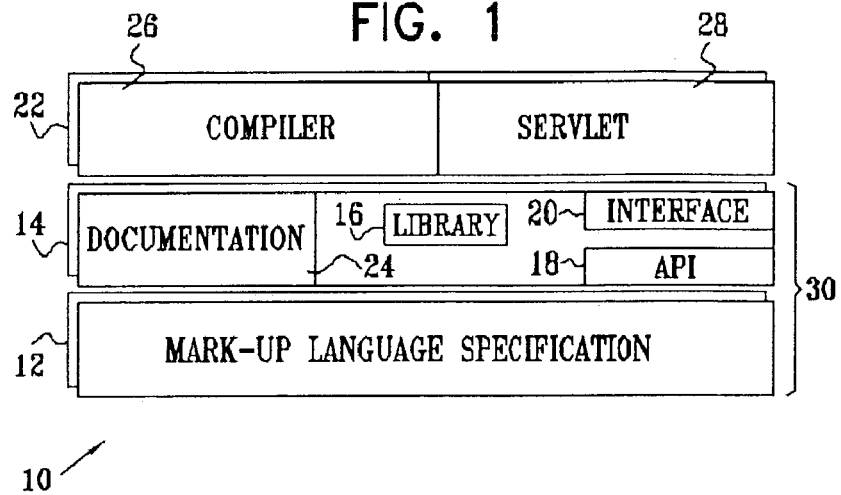
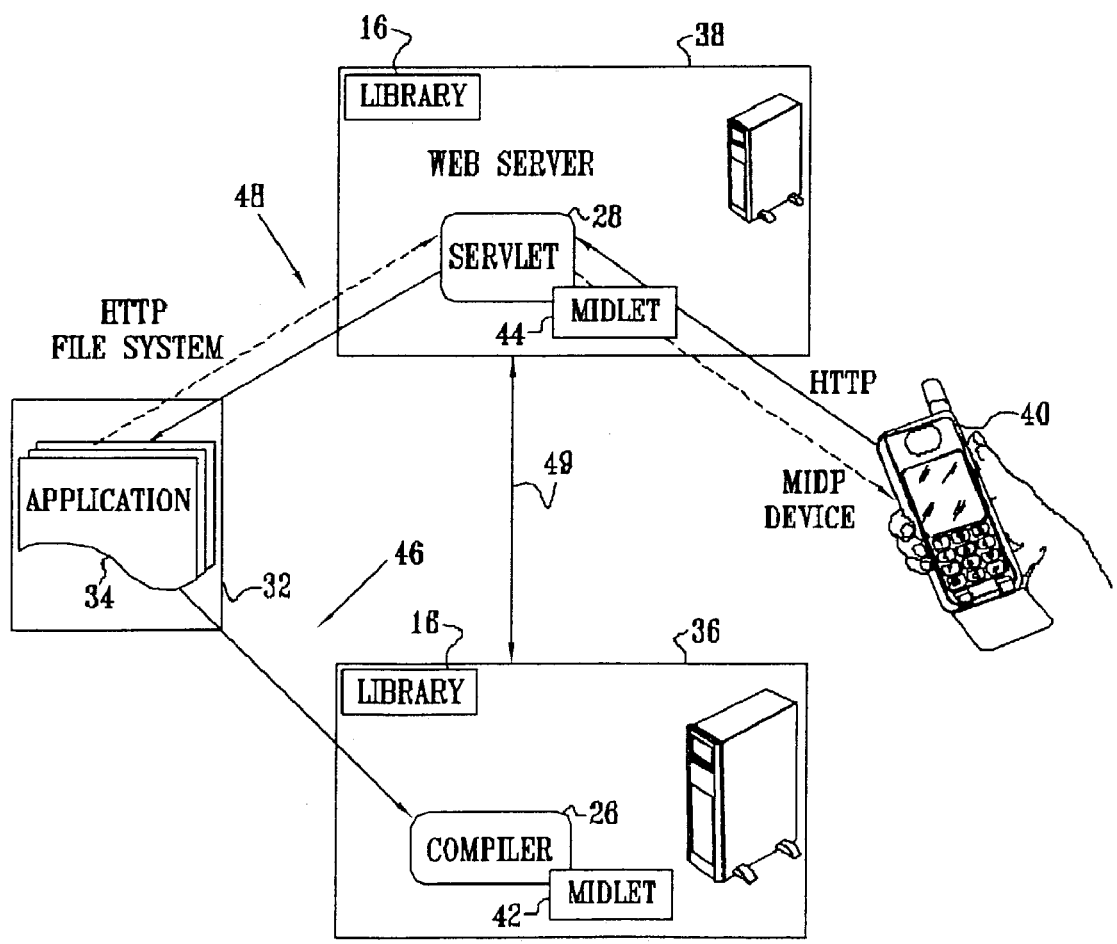

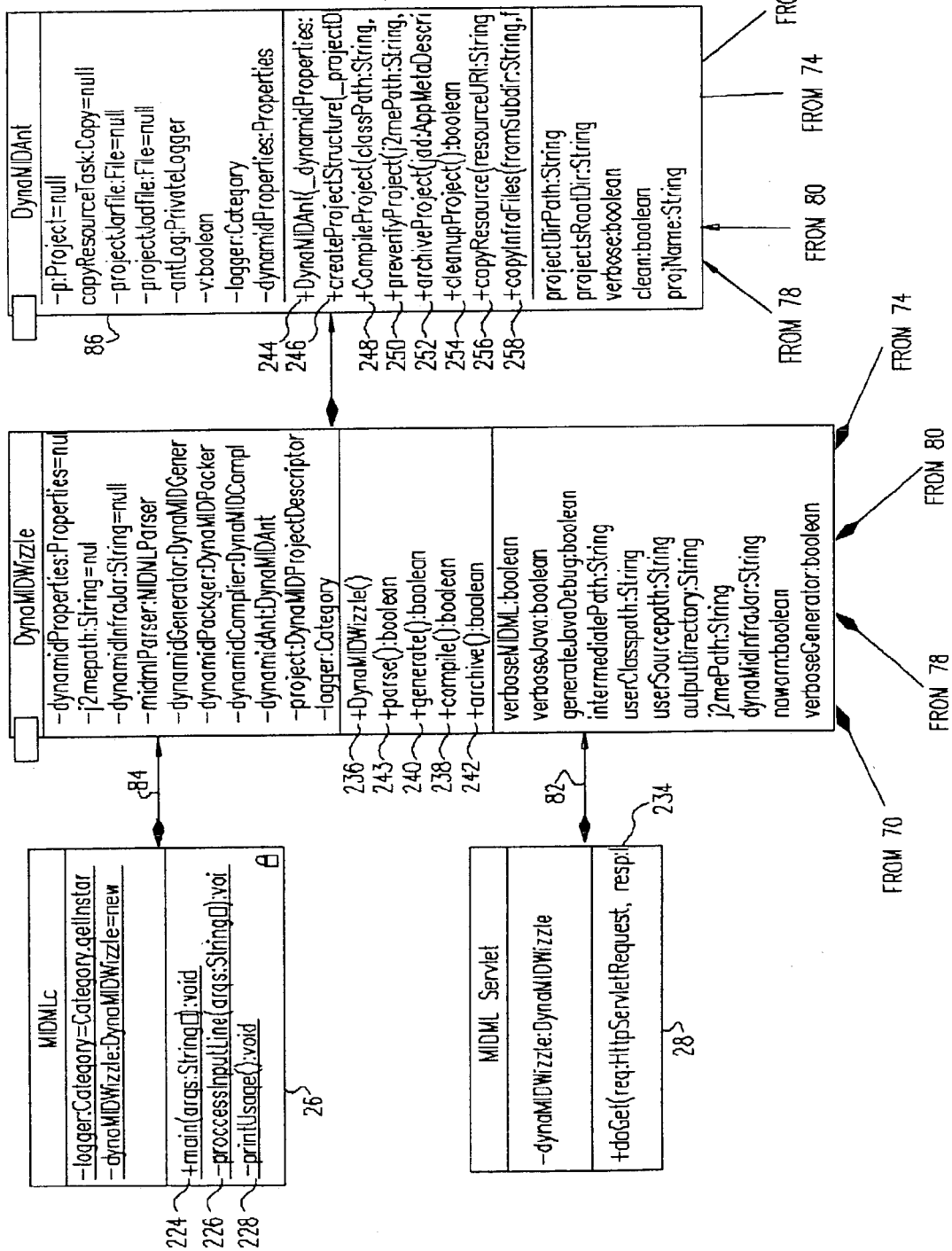

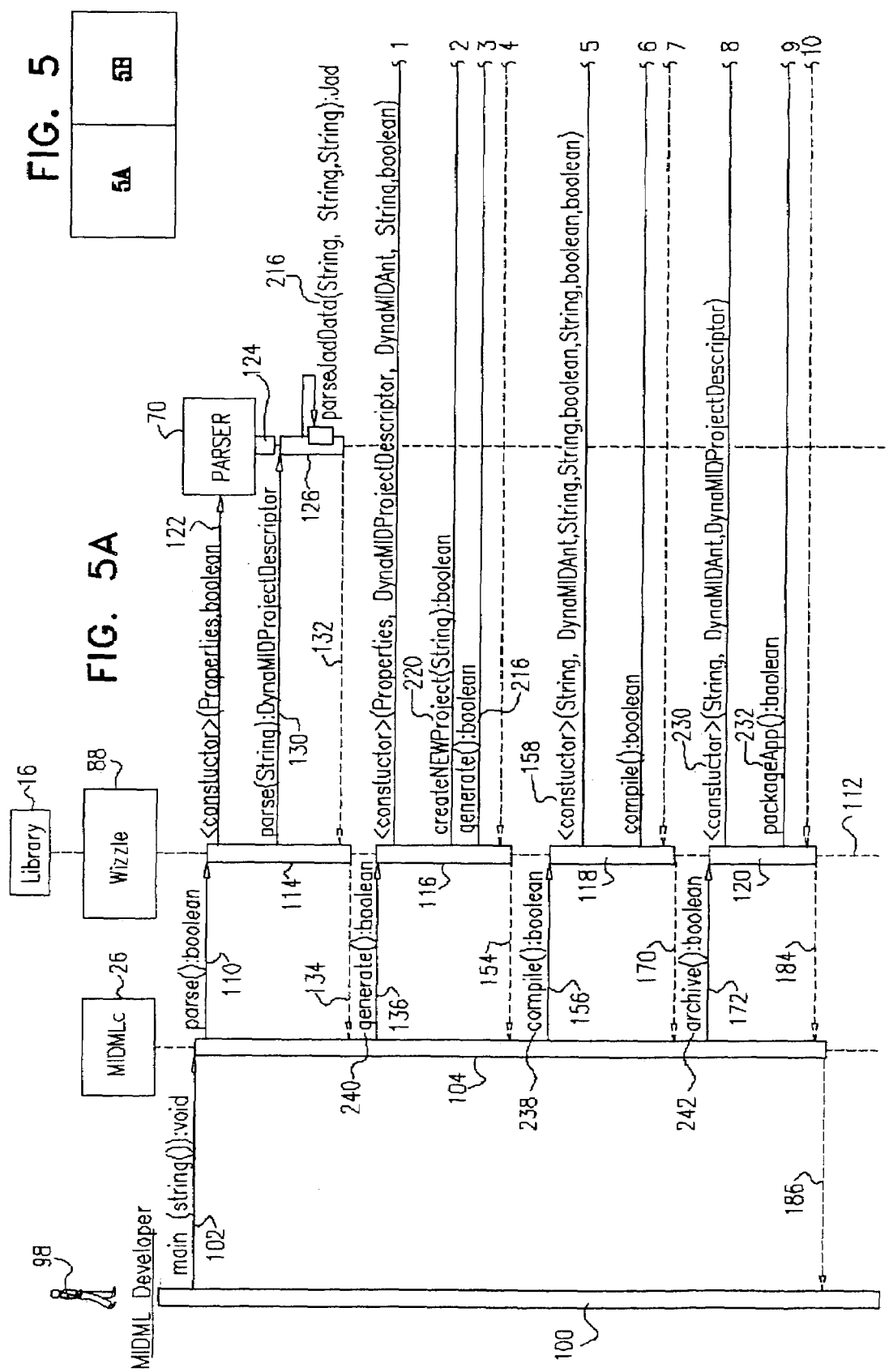

FIG. 12

| 12AA | 12AB | 12AC | 12AD |
|------|------|------|------|
| 12BA | 12BB | 12BC | 12BD |
| 12CA | 12CB | 12CC | 12CD |
| 12DA | 12DB | 12DC | 12DD |
| 12EA | 12EB | 12EC | 12ED |
| 12FA | 12FB | 12FC | 12FD |
| 12GA | 12GB | 12GC | 12GD |

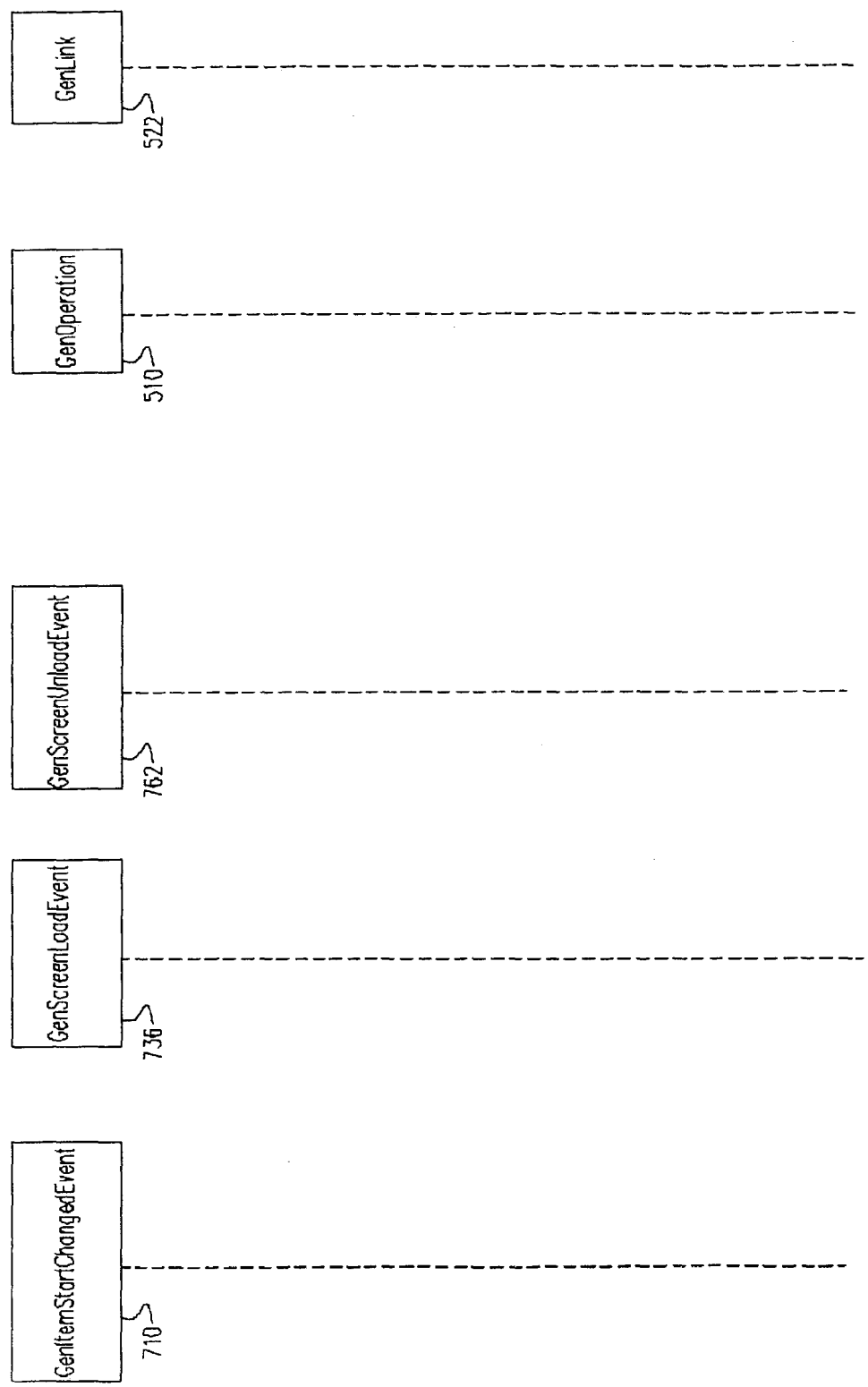

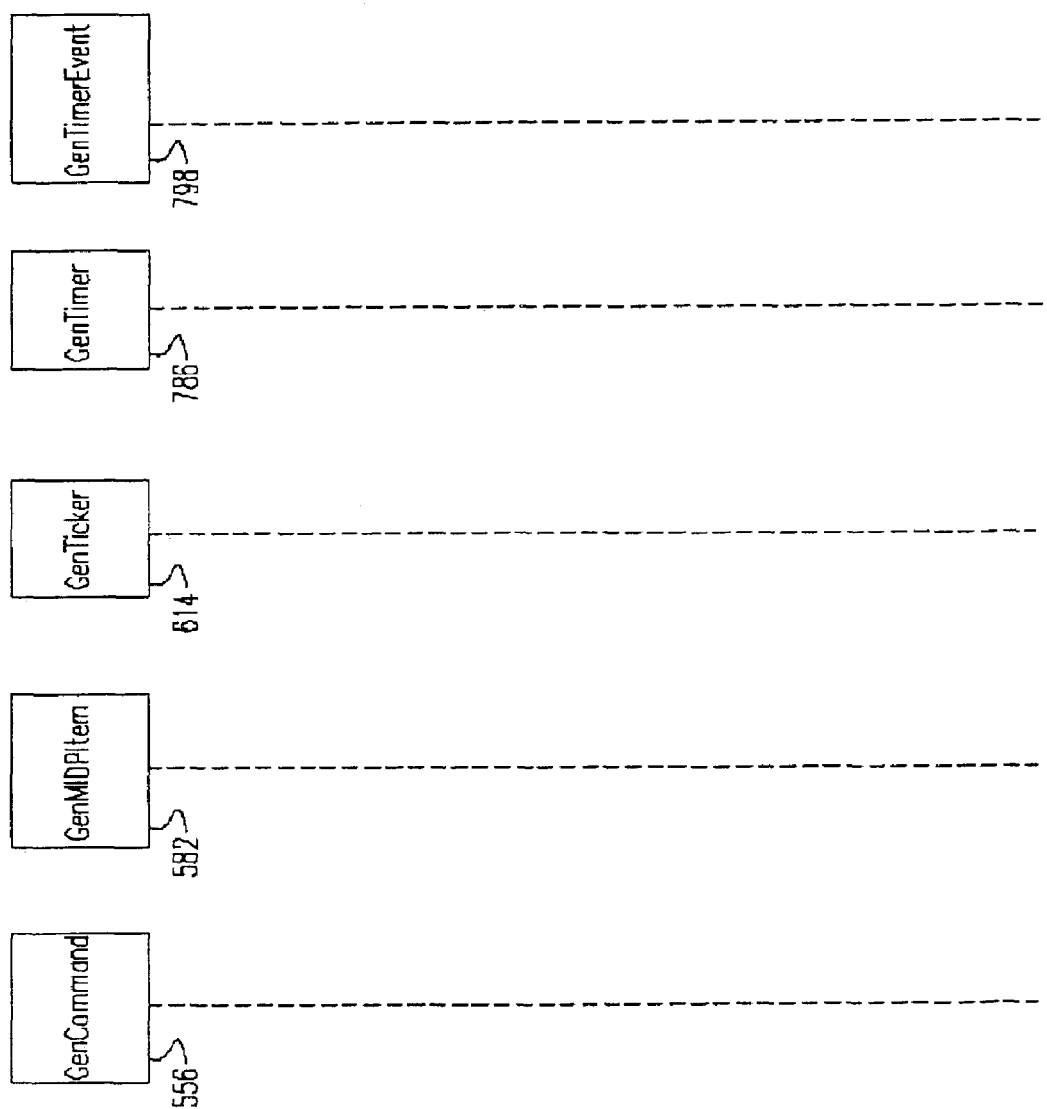

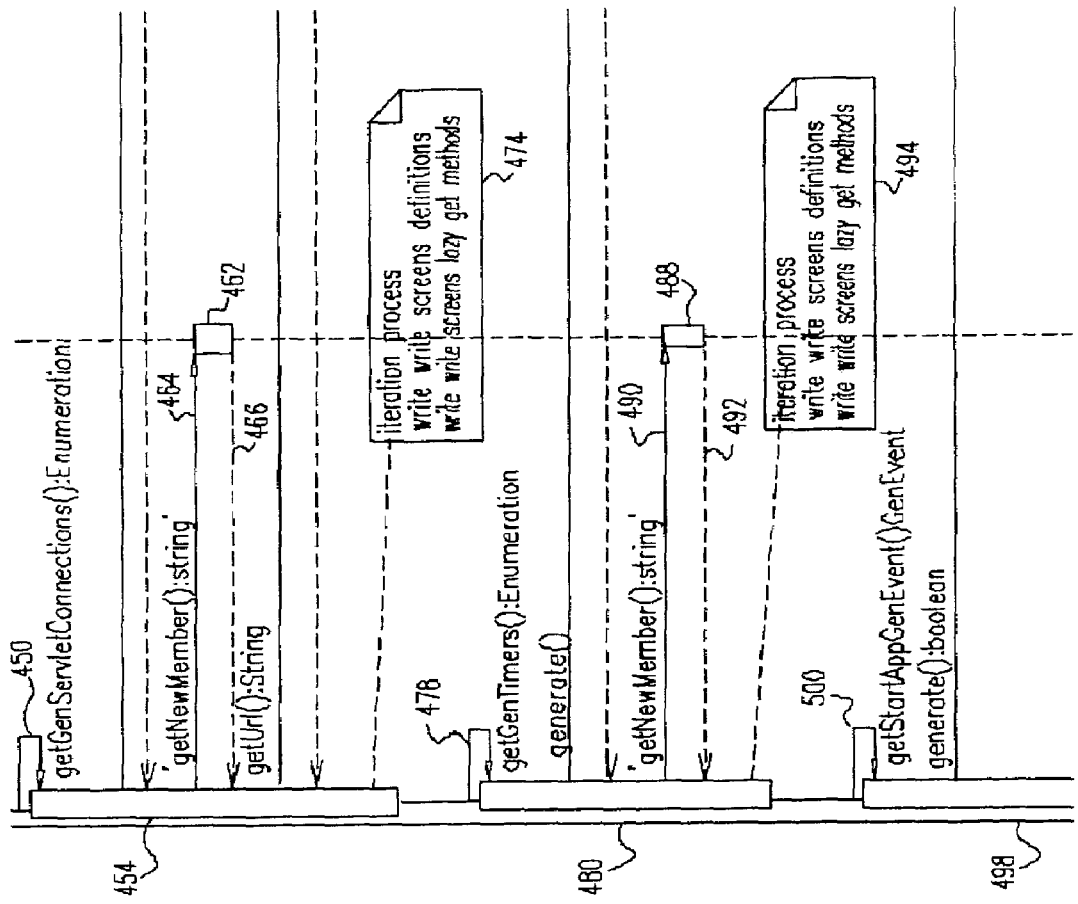

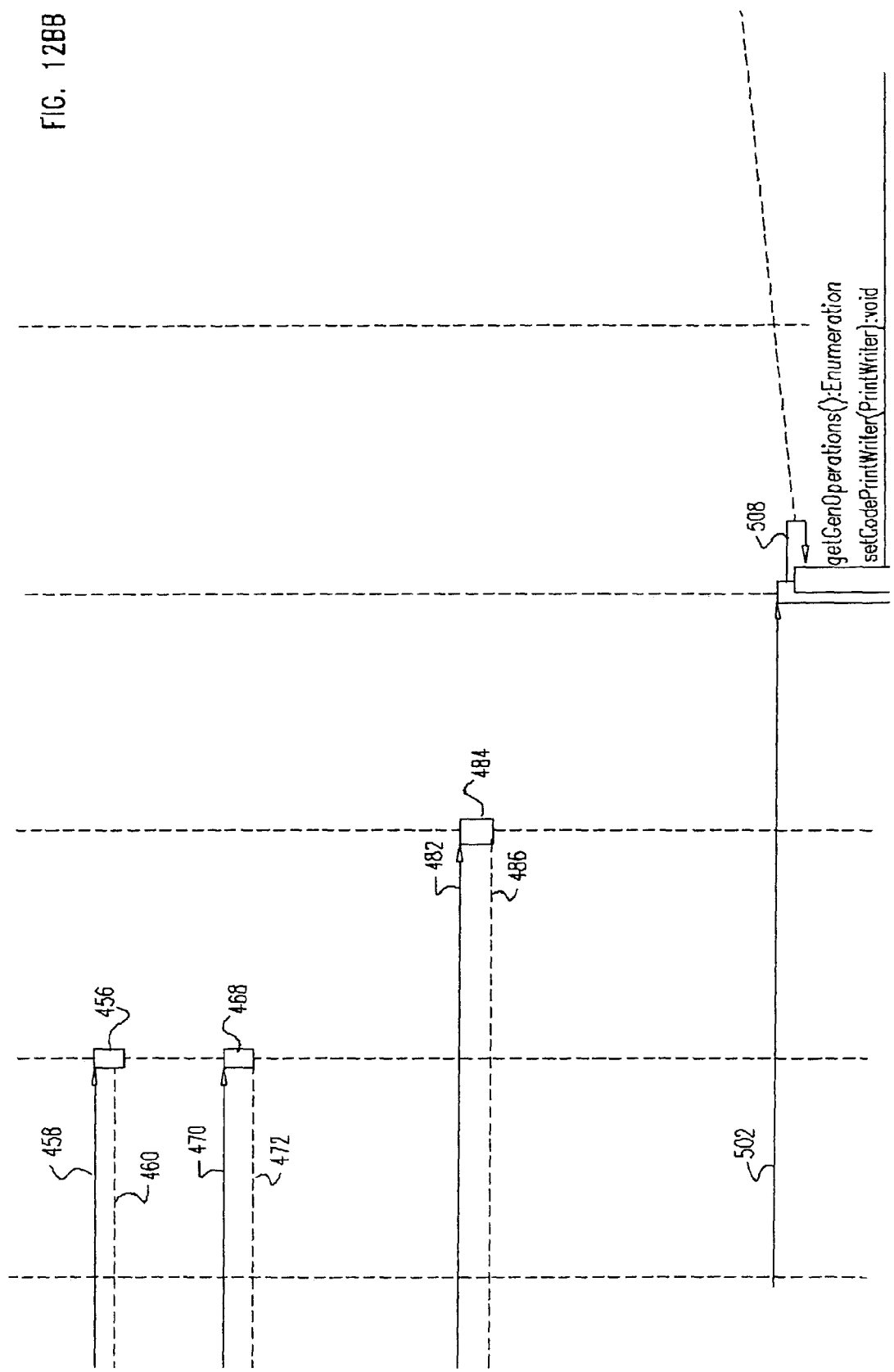

iteration process
write operations in the
startApp() method
last operation must be lin
generated differently

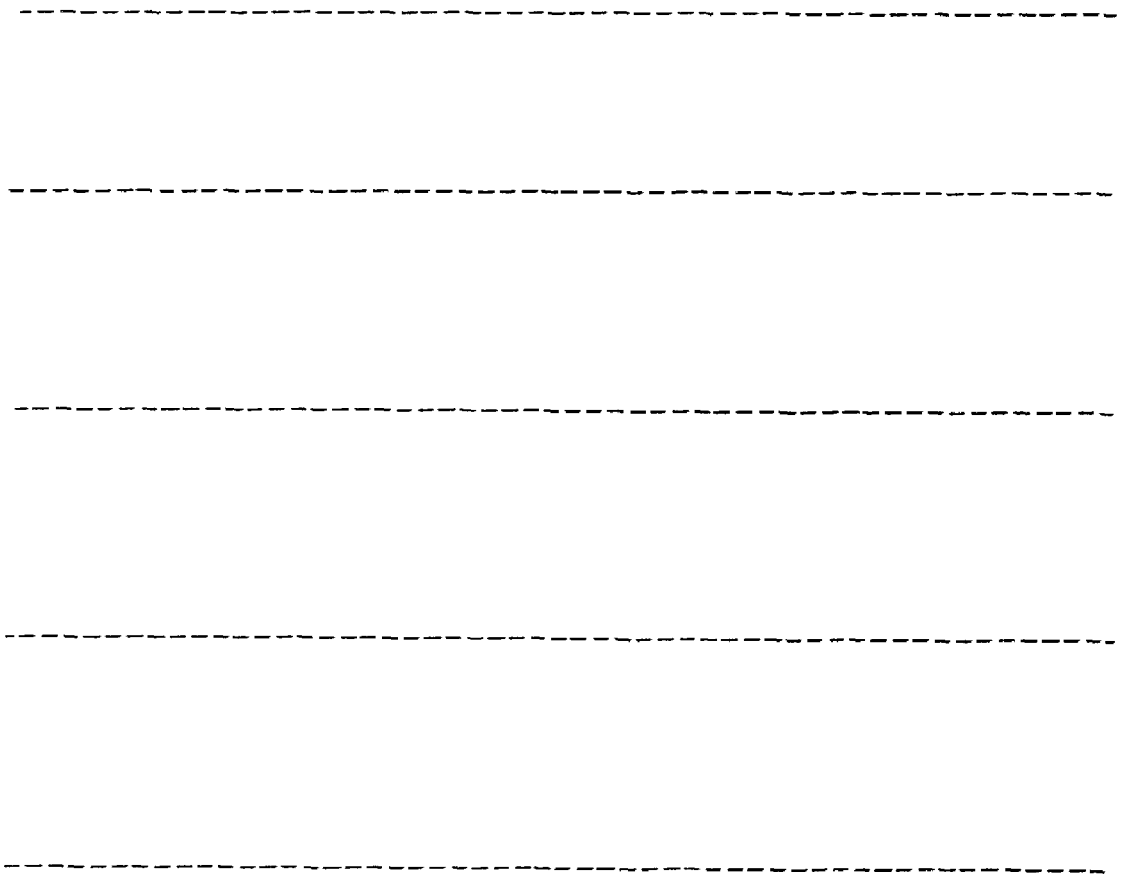

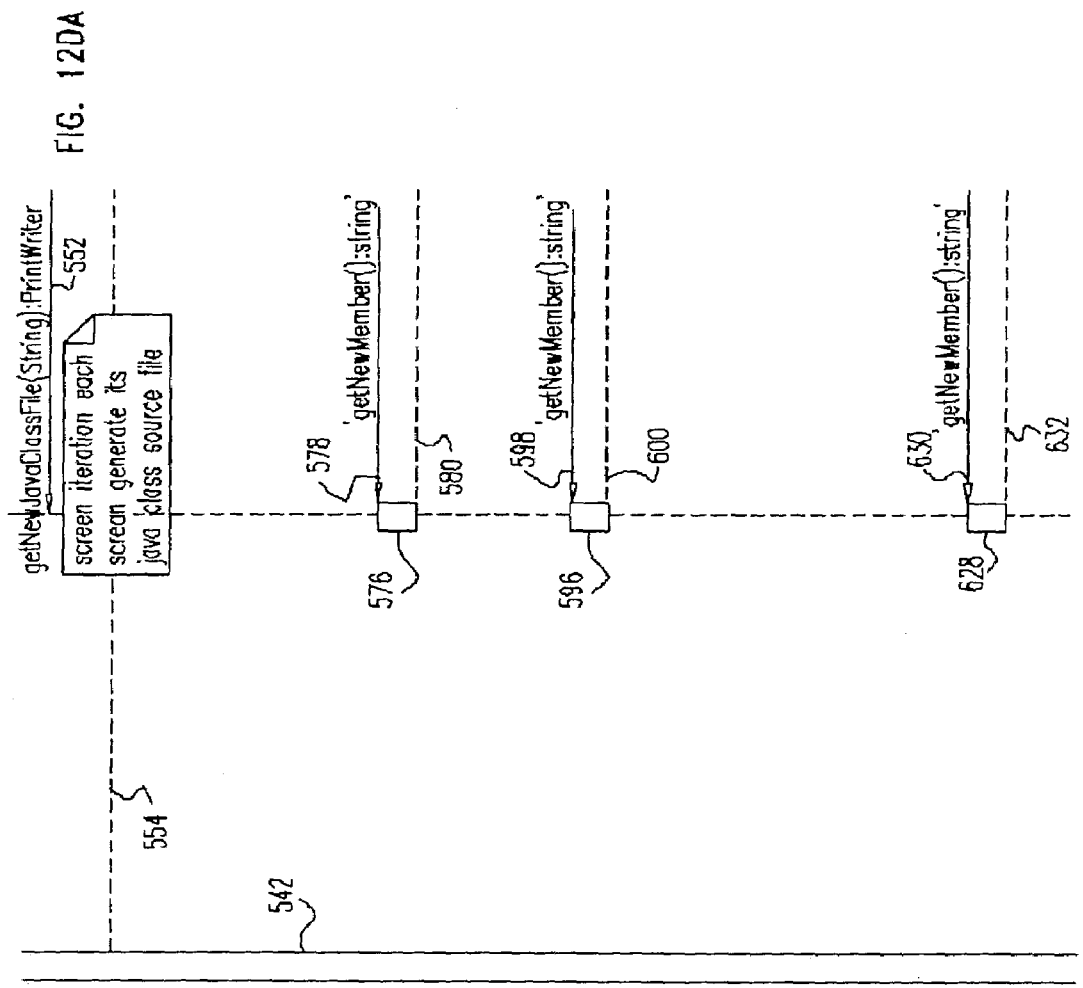

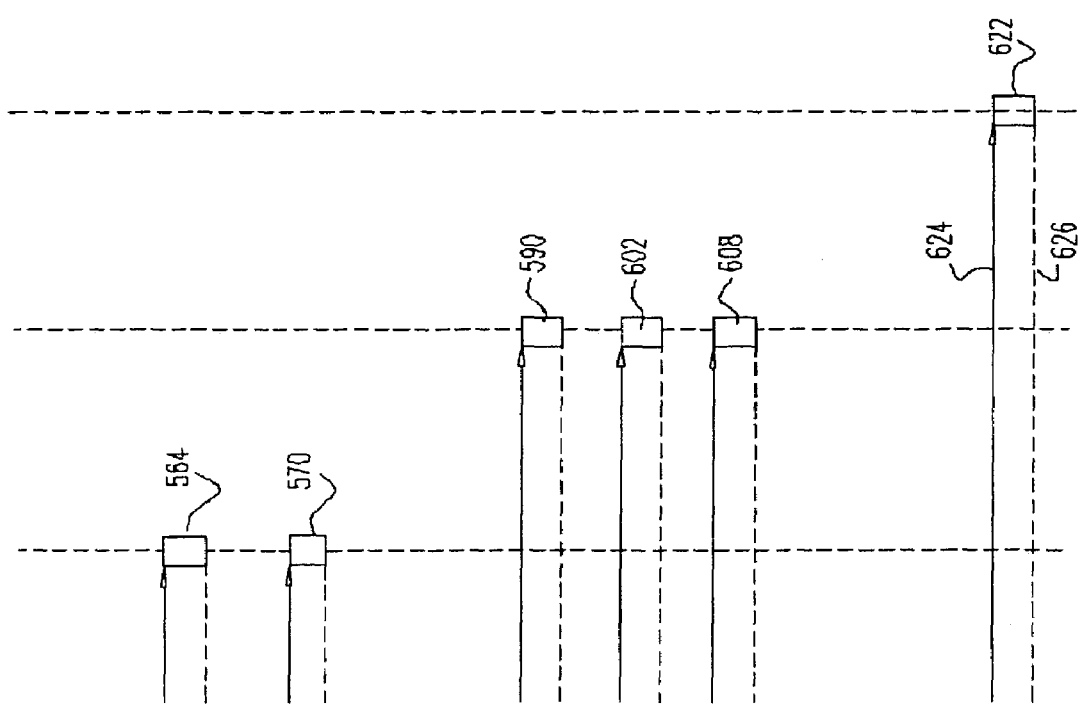

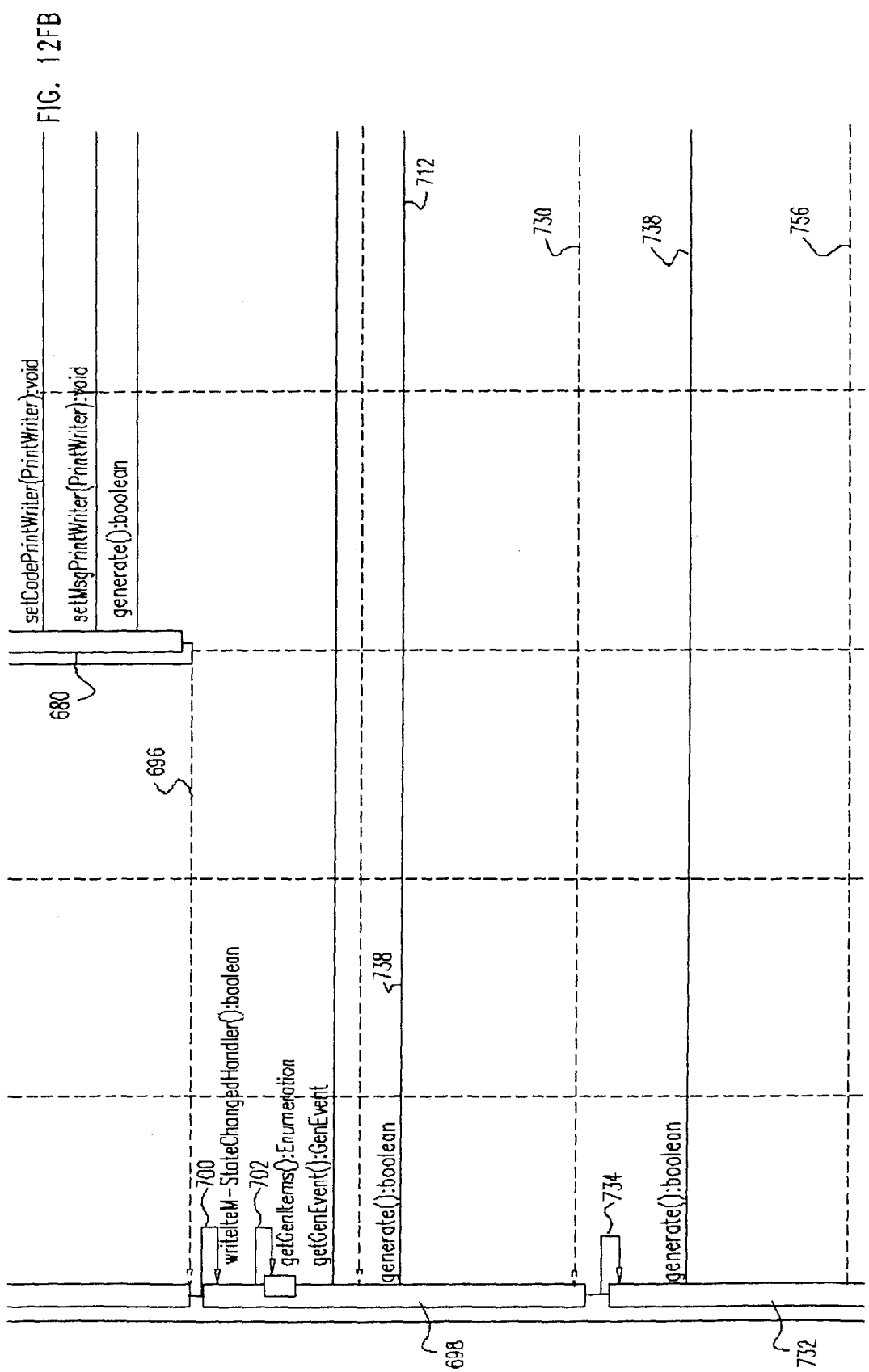

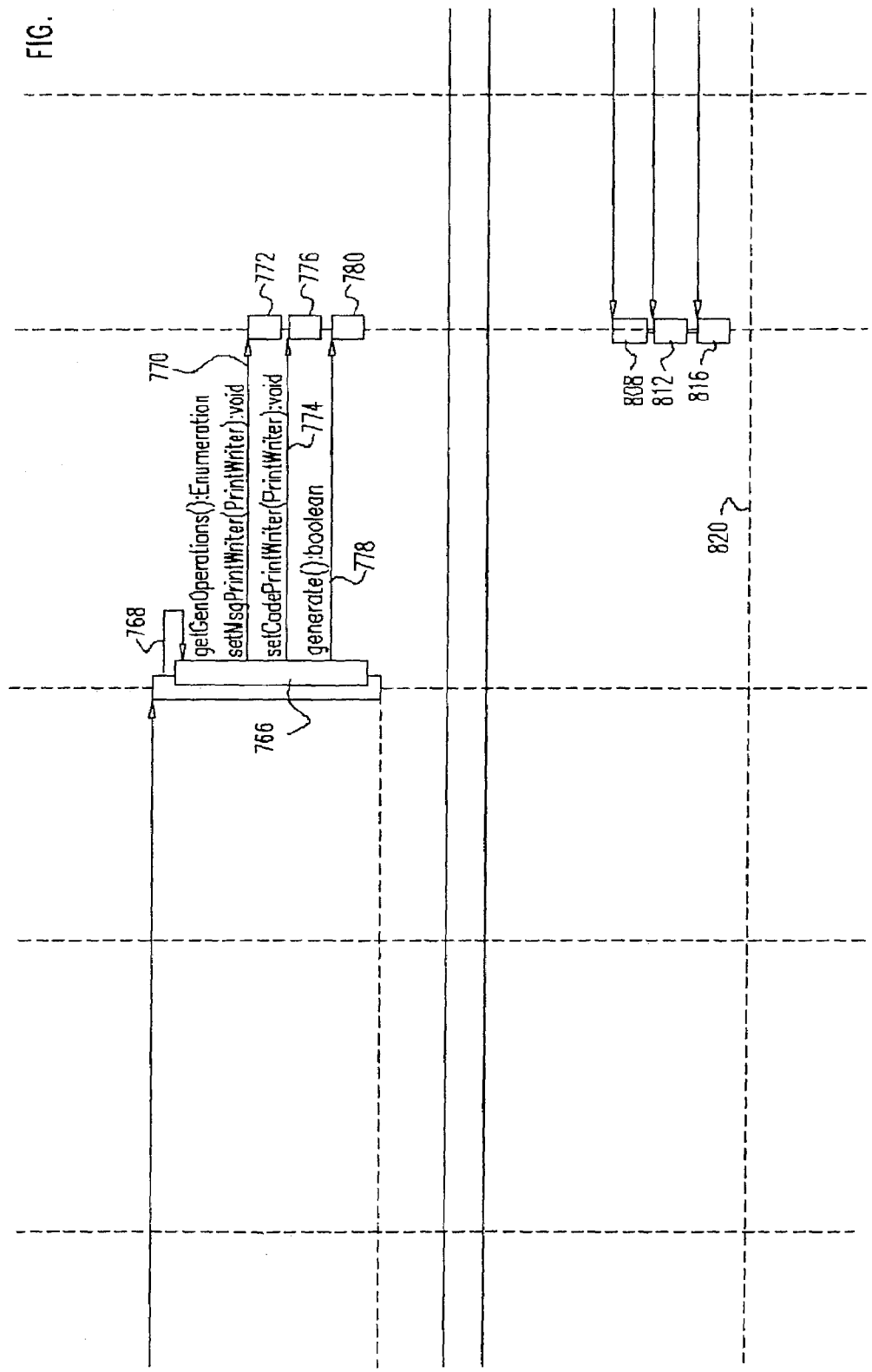

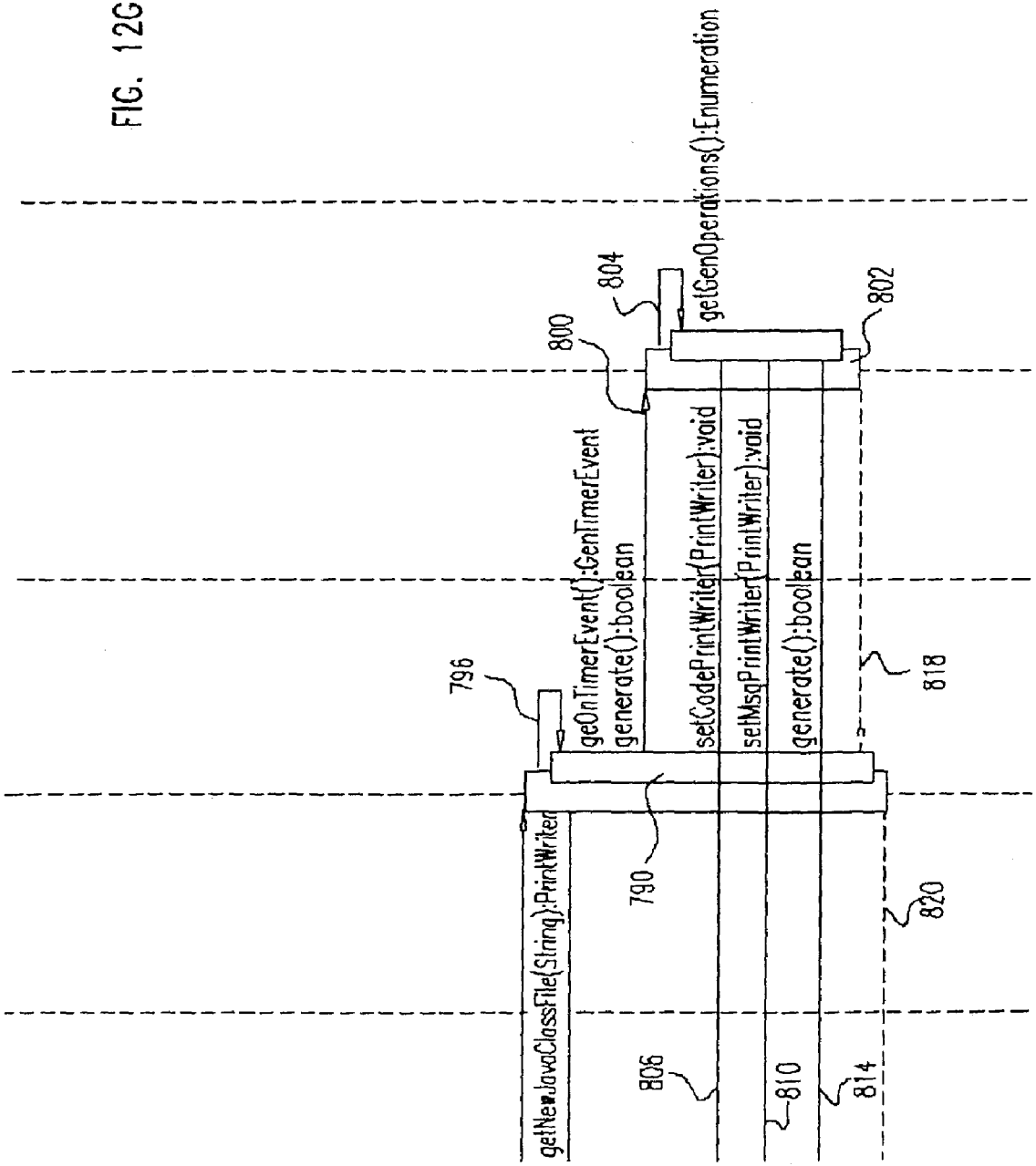

CONVERSION OF AN OBJECT MODEL TO A SOURCE FILE GENERATION MODEL

CROSS-REFERENCE TO RELATED APPLICATIONS

This Application claims the benefit of Provisional Application No. 60/366,890, filed Mar. 22, 2002.

This Application is related to the following Applications filed on even date herewith: application Ser. No. 10/349,005, entitled "Extensible Framework for Code Generation from XML Tags"; Ser. No. 10/348,892, entitled "Markup Compiler that Outputs MIDlets"; Ser. No. 10/349,004, entitled "Language and Object Model for Describing MIDlets"; and Ser. No. 10/349,010, entitled "On-Demand Creation of MIDlets".

REFERENCE TO ELECTRONIC DOCUMENTS

A Computer Program Listing Appendix is submitted herewith on one compact disc and one duplicate compact disc. The total number of compact discs including duplicates is two. The file on the compact disc is an ASCII text file. Their names, dates of creation, directory locations, and sizes in bytes are:

The root folder contains the file 45439LST.TXT (which include Listing 1 through and including Listing 43) of Jul. 13, 2006 and of length 46,734 bytes.

The files are referred to herein as the Appendix. The material on the compact discs is incorporated by reference herein.

BACKGROUND OF THE INVENTION

1. Field of the Invention

This invention relates to communication between a host server and a mobile information device. More particularly, this invention relates to improvements in the provision of applications and resources to a mobile information device by a host server.

2. Description of the Related Art

The meanings of acronyms and certain terminology used herein are given in Table 1 and Table 2. Sun, Sun Microsystems, the Sun logo, Java, J2EE, J2ME, and J2SE are trademarks or registered trademarks of Sun Microsystems, Inc. in the United States of America and other countries. All other company and product names may be trademarks of their respective companies.

TABLE 1

| | |
|---|---|
| API | Application programming interface |
| CISC | complex instruction set computer |
| CLDC | connected, limited device configuration |
| DOM | document object model |
| GSM | global system for mobile communication |
| HTTP | hypertext transfer protocol |
| IDE | Integrated development environment |
| J2EE | Java 2 Enterprise Edition |
| J2ME | Java 2 Micro Edition |
| J2SE | Java 2 Standard Edition |
| JAD | Java application descriptor |
| JAM | Java Application Manager |
| JAR | Java archive |
| JAVAC | Java compiler |
| JAXP | Java API for XML Processing |
| MIDML | mobile information device markup language |
| MIDP | mobile information device profile |
| OTA | over the air user initiated provisioning for MIDP |
| PNG | portable network graphics |

TABLE 1-continued

| | |
|---|---|
| RISC | reduced instruction set computer |
| RTL | run time library |
| SDK | software development kit |
| URL | uniform resource locator |

TABLE 2

| | |
|---|---|
| CLASSPATH | A fundamental definition in Java environments, informing the Java virtual machine where to search for Java classes. |
| Java Service | An end-user service that is made up of at least one client-side component written in Java. Additional server-side components, servers, software or otherwise can also be part of the service. |
| MIDlet | A MIDP compliant application |
| MIDML Application | A set of MIDML files structured as an application to be generated as a MIDlet |
| MIDP Device | A device running CLDC with MIDP |
| MIDSP | MIDML Java code embedding extensions |
| use case | A computer software product methodology used in system analysis to identify, clarify, and organize system requirements. |
| Widget | A small program that is written in order to implement the appearance and behavior of an element of a graphical user interface. |
| JAVAX | Javax is a common package name for standard Java extensions. |

The use of mobile and portable wireless devices has expanded dramatically in recent years. Many such devices having varying functions, internal resources, and capabilities now exist, including, but not limited to mobile telephones, personal digital assistants, medical and laboratory instrumentation, smart cards, and set-top boxes. All such devices are collectively referred to herein as mobile information devices. They tend to be special purpose, limited-function devices, rather than the general-purpose computing machines that have been previously known. Many of these devices are connected to the Internet, and are used for a variety of applications, such as banking and financial transactions, ticketing applications, wireless collaboration, and interactive games. Furthermore, in modern networks, such as GSM networks, an increasing variety of mobile information devices supports remote management and configuration. For example, using existing over-the-air protocols, it is possible to download data to memory remotely, and to reconfigure mobile information devices, such as mobile telephones.

A specification known as the Mobile Information Device Profile defines a set of Java application programming interfaces that provide an application run time environment for mobile information devices, such as mobile telephones. MIDP is defined in Mobile Information Device Profile (JSR-37), JCP Specification, Java 2 Platform, Micro Edition, 1.0a (Sun Microsystems Inc., Palo Alto, Calif., December 2000), and is also referred to herein as "MIDP-1.0".

MIDP builds on the Connected Limited Device Configuration (CLDC) of the Java 2 Platform, Micro Edition (J2ME) (available from Sun Microsystems Inc., Palo Alto, Calif.). CLDC and J2ME specifically address the devices used in the vast market, which covers mobile information devices ranging from small devices, such as smart cards or pagers, to powerful set-top boxes. CLDC technology includes a virtual machine (KVM), which is a small Java virtual machine that is adapted to the constraints of small mobile information devices. CLDC is suitable for devices with 16/32-bit RISC/

CISC microprocessors/controllers, having as little as 160 KB of total memory available, as little as 128 KB of which can be reserved for the storage of the virtual machine and its libraries. MIDP applications that use the MIDP and CLDC APIs are known as MIDlets.

Other documents relevant to this invention include the following publications, available from Sun Microsystems, Inc.: *Java 2 Platform Micro Edition, Wireless Toolkit; Over The Air User Initiated Provisioning Recommended Practice Addendum to the Mobile Information Device Profile; Connected Limited Device Configuration Specification; Java Servlet Specification*; and *JavaServer Pages Specification*.

Notwithstanding the existing technology of MIDP and CLDC, there remains a need for content and service providers to more easily create, modify and update MIDlet applications that can be requested by mobile information device for download. An unmet need also exists for content providers to easily port their content to the MIDP environment. Existing tools allow programmers to use integrated development environments and compilers to statically generate applications. However, these applications then need to be manually moved to a location accessible by a MIDP platform.

SUMMARY OF THE INVENTION

According to the invention, an infrastructure is provided for creating applications for mobile information devices, using a tag-based markup language. Developers can use the markup language to define applications and content based on easily manipulated textual tags, rather than having to write specific code. A compiler, which is optionally controllable via a command line interface, processes the tags in several phases. Initially, the input is parsed in order to check for errors. Next, a hierarchical object model of the application is populated with objects corresponding to the tags. Then, source code files are generated, which include supporting resource files (such as images) corresponding to the objects in the hierarchy. In producing the source code files, a generator traverses the object model hierarchy in a top-down manner, producing a source file for different elements, for example, screens, forms, and servlets. For each element required to be generated, an appropriately configured generator class is invoked in order to generate appropriate code from the data stored in the object model.

For each type of tag provided by the extended markup language, the compiler has two specific components: a reader, for reading the tag and appropriate elements accompanying it from the document written in the extended markup language into the objects in memory; and a code-generating class for each object type. The readers and generators are registered using a factory method, to be instantiated as required in processing extended markup language files. This model enables the application capabilities of the system to be easily extended, simply by adding new tags, readers and code generators to the existing factory set.

In embodiments of the invention described herein, the extended markup language is based on XML, and is referred to as MIDML.

In one embodiment of the invention, the generated code is Java source code.

The invention provides a method for generating a computing application for a mobile information device, which is carried out by preparing a descriptor object model of the application from a specification thereof. The descriptor object model is organized as a hierarchical tree. The method further includes performing an incremental traversal of the descriptor object model and at each of a plurality of increments of the traversal identifying a descriptor object that requires an output code file for an application element, calling a generator class corresponding to the descriptor object, generating the output code file using the generator class, and arranging the output code file in a hierarchical file collection of output code files produced in other increments of the traversal.

According to an aspect of the method, the traversal is a top-down traversal of the tree.

According to another aspect of the method, a subsequent increment of the traversal is performed only following a successful performance of an immediately preceding increment thereof.

According to an additional aspect of the method, the descriptor object is an application descriptor.

According to one aspect of the method, the application element is a screen. The generator class includes programs for loading and unloading the screen.

In an additional aspect of the method, generating the output code file includes generating code for a command that is displayed on the screen.

According to a further aspect of the method, the descriptor object is a user defined object.

According to another aspect of the method, the application element is a servlet.

According to yet another aspect of the method, the generator class includes a program for establishing a connection to the servlet.

According to a further aspect of the method, the application element is a timer.

According to a further aspect of the method, the generator class includes a program for handling an event that is triggered by expiration of a delay interval.

According to one aspect of the method, the application element is a ticker.

Another aspect of the method generating the output code file includes generating a program for identifying a state event of an item.

Yet another aspect of the method generating the output code file includes generating an event handler for a start event.

Still another aspect of the method generating the output code file includes generating an event handler for a pause event.

An additional aspect of the method generating the output code file includes generating an event handler for a destroy event.

Still another aspect of the method generating the output code file includes generating a screen linking program that enables navigation from a first screen to a second screen.

According to one aspect of the method, the specification includes tags of a markup language that correspond to functions of the application, and the markup language includes a plurality of schemas and a root element. The tags may include a directory tag that specifies a location of source code, which can be Java source code.

According to yet another aspect of the method, the tags include a user-defined tag that extends the markup language.

The invention provides a computer software product, including a computer-readable medium in which computer program instructions are stored, which instructions, when read by a computer, cause the computer to perform a method for generating a computing application for a mobile information device, which is carried out by preparing a descriptor object model of the application from a specification thereof, the descriptor object model being organized as a hierarchical tree, performing an incremental traversal of the descriptor object model. At each of a plurality of increments of the traversal the method includes identifying a descriptor object of the descriptor object model that requires an output code file for an application element to be generated, calling a generator class corresponding to the descriptor object, generating the output code file using the generator class, and arranging the output code file in a hierarchical file collection of output code files produced in other increments of the traversal.

The invention provides a data processing system for generating a mobile information device computing application, including a computer readable memory having a data structure stored therein. The data structure includes a descriptor object model that is derived from a specification of the application, the descriptor object model being organized as a hierarchical tree, a generator that is linked to the descriptor object model for generating generator classes and output code. A generator object model produced by the generator has generator objects that correspond to descriptor objects of the descriptor object model, wherein the output code is generated by the generator according to directives in the generator object model, and the descriptor objects are adapted to induce generation of different application elements.

According to still another aspect of the data processing system, the output code is Java source code.

An additional aspect of the data processing system includes a link between the generator and a build tool. The generator has a program for accessing the build tool to obtain an identification of a project directory.

According to one aspect of the data processing system, the generator has a program for structuring the project directory.

According to a further aspect of the data processing system, the specification including tags of a markup language that correspond to functions of the application, the markup language including a plurality of schemas and a root element.

According to another aspect of the data processing system, the generator includes a generation object factory, and the generator objects are registered in the generation object factory.

According to a further aspect of the data processing system, the generator object model includes a class structure that is created by the generation object factory.

According to yet another aspect of the data processing system, at least a portion of the generator objects is reused by the generator when generating the output code.

According to still another aspect of the data processing system, the generation object factory is adapted to register a user-defined generator object that corresponds to an extension of the markup language.

BRIEF DESCRIPTION OF THE DRAWINGS

For a better understanding of the present invention, reference is made to the detailed description of the invention, by way of example, which is to be read in conjunction with the following drawings, wherein like elements are given like reference numerals, and wherein:

FIG. 1 is a block diagram of a core set of software components for the dynamic creation of MIDlet applications for mobile information devices in accordance with a disclosed embodiment of the invention;

FIG. 2 is a block diagram illustrating architectural relationships and logical aspects of the set of software components shown in FIG. 1 in further detail in accordance with a disclosed embodiment of the invention;

FIGS. 4A-4D, referred to collectively as FIG. 4, are a class diagram describing the structure of a layer shown in FIG. 1 in further detail in accordance with a disclosed embodiment of the invention;

FIGS. 5A and 5B, referred to collectively as FIG. 5, are a sequence diagram featuring the activity of the compiler and the servlet shown in FIG. 1 in typical web service in accordance with a disclosed embodiment of the invention;

DETAILED DESCRIPTION OF THE INVENTION

Figure 3:
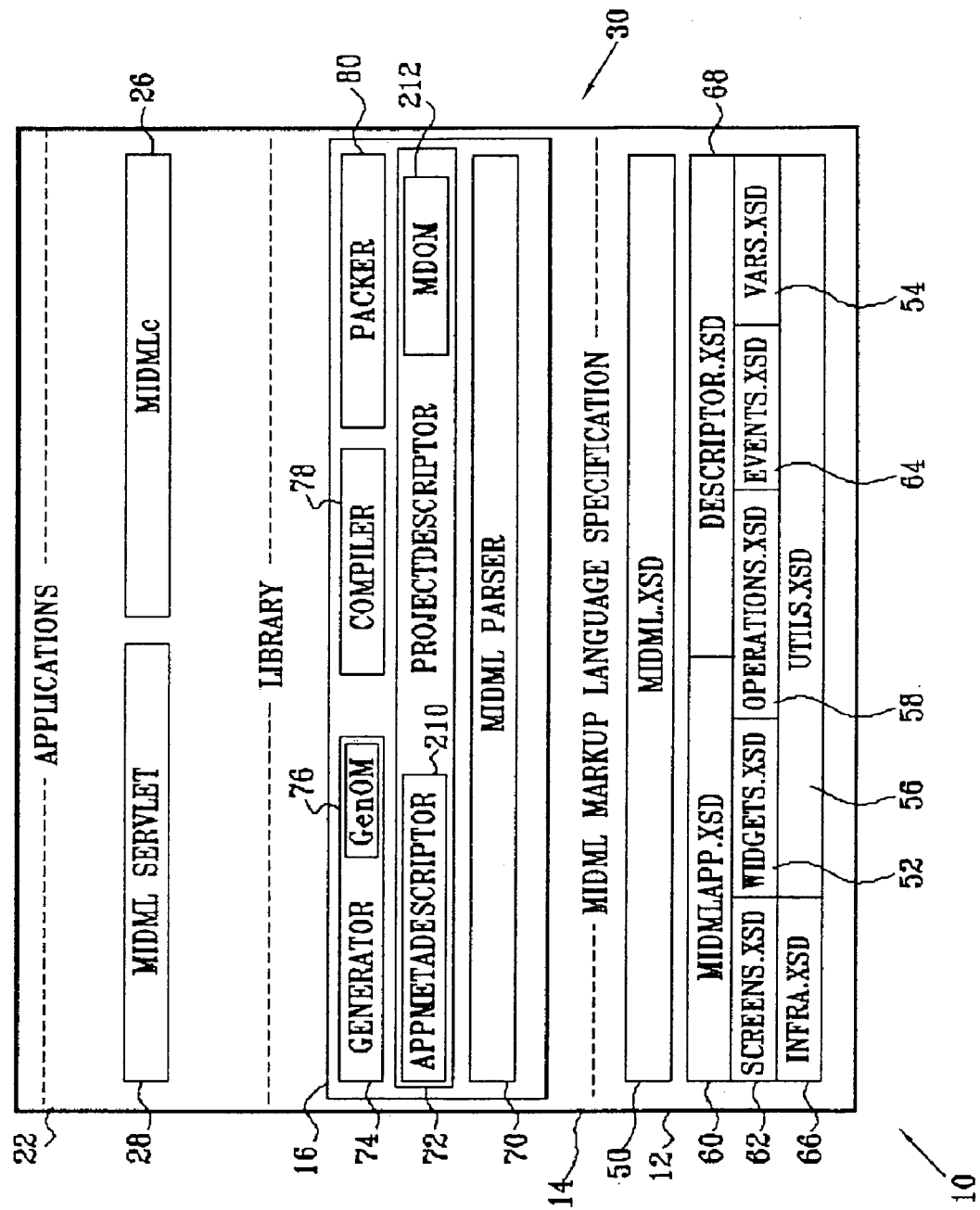
FIG. 3 is a block diagram illustrating architecture aspects of the set of software components shown in FIG. 1 in further detail in accordance with a disclosed embodiment of the invention.

In the following description, numerous specific details are set forth in order to provide a thorough understanding of the present invention. It will be apparent to one skilled in the art, however, that the present invention may be practiced without these specific details. In other instances well-known circuits, control logic, and the details of computer program instructions for conventional algorithms and processes have not been shown in detail in order not to unnecessarily obscure the present invention.

Software programming code, which embodies aspects of the present invention, is typically maintained in permanent storage, such as a computer readable medium. In a client/server environment, such software programming code may be stored on a client or a server. The software programming code may be embodied on any of a variety of known media for use with a data processing system. This includes, but is not limited to, magnetic and optical storage devices such as disk drives, magnetic tape, compact discs (CDs), digital video discs (DVDs), and computer instruction signals embodied in a transmission medium with or without a carrier wave upon which the signals are modulated. For example, the transmission medium may include a communications network, such as the Internet.

Although the embodiments described herein make use of particular features and vocabulary of the Java and XML languages, operating environments and application programming interfaces, the present invention is not limited to these languages or to the particular implementation tools described here. Rather, the principles of the present invention may be applied using other object-oriented programming languages and markup languages.

In class and sequence diagrams referenced herein, the symbols "+" or "−" preceding an item respectively indicate that the item is public or private.

Overview.

Turning now to the drawings, reference is initially made to FIG. 1, which is a block diagram of a core set of software components 10, which is designed for the dynamic creation of MIDlet applications for devices that support the mobile information device profile in accordance with a disclosed embodiment of the invention. The set of software components 10 is not static, but is extensible, supporting incremental addition of features. It can best be understood as a layered architecture. A lowermost layer 12 represents a specification written in a markup language, which in the current embodiment is MIDML. MIDML is an extension of the known markup language XML that facilitates the dynamic creation of MIDlets. It is an easily extensible, strongly typed object-oriented markup language. It is possible to practice the invention using many different markup languages.

As explained in further detail hereinbelow, MIDlets are parsed, compiled, packaged and delivered over-the-air to a client, which typically is a mobile information devices, by other members of the set of software components 10.

An intermediate layer 14 includes a library 16, which includes code for handling MIDlet creation tasks based on a MIDML application created in the layer 12. The library 16 is typically an extensible component library, which provides for parsing, code generation, compilation and packing of the generated MIDlet. The layer 14 also includes an application programming interface 18 with the layer 12, and an interface 20 with a layer 22. The layer 14 includes detailed documentation 24 relating to components of the library 16. The run time component of the library 16 is sometimes referred to herein as the run time library. As is disclosed in further detail hereinbelow, the functionality of the library 16 is exposed to the application developer, which is typically a Java developer.

The MIDML specification may be conveniently regarded as a source code. An upper application layer 22 includes a standalone compiler 26 that compiles MIDML applications into an intermediate code, which in the current embodiment is Java source code, from which MIDlets are ultimately generated. It is possible for the intermediate code to be source code of many other computer languages. The compiler 26 has access to the facilities of the library 16. A feature of MIDML is the use of tags corresponding to different functions of a MIDML application. For each type of tag provided by MIDML, the compiler 26 has two specific components: a reader, for reading the tag and appropriate elements accompanying it from the MIDML document into the objects in memory; and a code-generating class for each object type. Typically, the compiler 26 is a J2SE standalone console application. Also included in the layer 22 is a servlet 28. The servlet 28 is a HTTP service interface that extends the functionality of a Web server to handle client requests that result in dynamic creation of MIDlets from MIDML applications. The servlet 28 can be a J2EE web service application.

It is helpful to regard the layers 12, 14 as an infrastructure 30 of the set of software components 10, and the layer 22 as its application layer. The infrastructure 30 and the compiler 26 are intended to function as a software developer's kit for the development of MIDlets. The software developer can exchange MIDML tags with the infrastructure 30, and can supply pre-compiled descriptors and generators if desired.

The set of software components 10 can be realized in different development environments, which may support computer languages other than Java. For example, the embodiments disclosed herein can be implemented for use with object-oriented languages, such as C++ as the intermediate code, by appropriately modifying the compiler 26, the servlet 28, and the library 16 to support a particular object-oriented language, using programming techniques known in the art.

System Architecture.

Reference is now made to FIG. 2, which is a block diagram illustrating the architectural relationships of the set of software components 10 (FIG. 1) and logical aspects of the system in further detail, in accordance with a disclosed embodiment of the invention. A content provider or developer, operating from a site 32, uses a markup language, such as MIDML, to write applications 34. In the current embodiment, the applications 34 are expressed as MIDML code, and are intended to be ultimately executed by mobile information devices. The site 32 has access to other elements of the set of software components 10 (FIG. 1), typically via a HTTP web server. The site 32 can be remote from, or co-located with a site housing one or more of the other elements.

The set of software components 10 (FIG. 1) may be physically distributed among sites 36, 38, which are linked in a network, typically using one or more HTTP file systems. In the example of FIG. 2, the compiler 26 is located at the site 36, and the servlet 28 is located at the site 38. The library 16 is replicated on both sites 36, 38. However, many other physical distributions of the set of software components 10 are possible. Indeed, each element of the set of software components 10 could be resident at a different site. The network may be the Internet, a corporate intranet, or other suitable network. The sites 36, 38 may be remote from one another, or may be co-located. The site 38 is typically a Java enabled Web server that is accessible to a mobile information device 40. The library 16 typically includes J2SE, J2EE and J2ME components.

Using the infrastructural facilities of the sites 36, 38, the MIDML document is compiled by the compiler 26 into a MIDlet 42. Upon a request of the mobile information device 40 for the MIDlet 42, the servlet 28, running on the site 38, finds any required resources, such as MIDML files and resource files, and instructs the compiler 26 to generate up-to-date archive files, which are typically JAR files, for the MIDlet 42. JAD files are also prepared, and portions of the JAD files are incorporated into a manifest file of the JAR file. An updated MIDlet 44 is then assembled, and downloaded to the mobile information device 40.

The embodiments of FIG. 1 and FIG. 2 are subject to several general requirements. The specification of MIDML, which is disclosed in further detail herein below, is implemented using XML. The library 16, the compiler 26, and the servlet 28 are developed using the Java programming language and relevant Java technologies. The library 16 requires the J2ME platform and either a J2EE platform or a J2SE platform for its operation. The compiler 26 requires the library 16, and runs on a J2SE platform. The servlet 28 requires the library 16 and runs on a J2EE platform. The MIDlet 44 requires a device that is compliant with MIDP Version 1.0a (or higher) and with an over-the-air protocol.

FIG. 2 illustrates two logical paths of data flow. A path 46 (MIDMLc flow), illustrated in the lower portion of FIG. 2, is developer oriented. It shows the basic features of the compilation of MIDML applications 34, which are developed at the site 32, and ultimately transformed into the MIDlet 42.

A path 48 (MIDMLServlet), illustrated in the upper portion of FIG. 2, is oriented to MIDP devices, and to some extent to end-users. When the servlet 28 is triggered to generate a new, dynamically created MIDlet 44 upon the HTTP request of an end user, the servlet 28 locates and processes MIDML source code to return the MIDlet 44 to the requesting mobile information device 40. If the MIDlet 44 is already up-to-date, it may simply be downloaded. Otherwise, the facilities of the site 36 are invoked by the servlet 28 to generate an up-to-date version of the MIDlet and transfer it to the servlet 28 for download as an updated MIDlet 44, as indicated by a path 49.

Reference is now made to FIG. 3, which is a block diagram illustrating the architecture of the set of software components 10 (FIG. 1) in further detail. In the layer 12, MIDML is enabled by XML schemas that define the MIDML specification. A schema 50 (midml.xsd) is a MIDML root element that contains MIDML application data elements, for example, an appdescriptor element, which is the MIDML project descriptor. The MIDML root element also contains the MIDlet application and its contained data, or a screen and its data. The schema 50 is disclosed in detail in Listing 1.

A schema 52 (widgets.xsd) defines all MIDML widgets. The widgets are objects, which can be MIDP 1.0 mapped or can be MIDML-specific widget commands. The schema 52 also defines an item's inheritance and its XML substitution group. The schema 52 is disclosed in detail in Listing 2.

A schema 54 (vars.xsd) defines the project's global variable elements. The schema 54 is disclosed in detail in Listing 3.

A schema 56 (utils.xsd) defines all general data types that can be used by other MIDML types. The schema 56 is disclosed in detail in Listing 4.

A schema 58 (operations.xsd) is an operations types definition file, which supports the following MIDML operations: assign; if; timer (activate/cancel); servlet (activate); link; signal; and the event-handler type that can contain all these operations. The schema 58 is disclosed in detail in Listing 5.

A schema 60 (midmlapp.xsd) describes the MIDML MIDlet type, the top level MIDML element, as the application container. The MIDlet oriented type can contain all tags of the MIDML language. The schema 60 is disclosed in detail in Listing 6.

A schema 62 (screens.xsd) defines available screens in MIDML. The schema 62 defines a screen base type and all derived specific screens, e.g., form, list, textbox, alert, the global element of the screen and its substitution group. The schema 62 is disclosed in detail in Listing 7. Screens are disclosed in further detail hereinbelow.

A schema 64 (events.xsd) describes an event type, which contain an event handler as an action sub-element. This type is the base class for future events that can be developed as MIDML evolves. The schema 64 is disclosed in detail in Listing 8. Events are disclosed in further detail hereinbelow.

A schema 66 (infra.xsd) describes added components in the infrastructure 30, such as servlet connection and timer elements. The schema 66 is disclosed in detail in Listing 9.

A schema 68 (descriptor.xsd) defines types and a JAD descriptor MIDML element. These derive their properties from the JAD file. The schema 68 is disclosed in detail in Listing 10.

In the layer 14, the components of the library 16 are designed to be highly independent of one another. The library 16 includes a MIDML parser 70 for parsing MIDML application files. A project descriptor object 72 is built during operation of the parser 70. A generator 74 accepts the output of the parser 70 and produces Java source. A generation object model 76 (GenOM) is created by the generator 74 during its operation. The library 16 includes run time support for a Java compiler 78. The Java compiler 78 is responsible for compilation and pre-verification of the Java source code, and produces class files. The library 16 includes a packer 80, which assembles the class files and associated resources into a MIDlet JAR file and creates an associated JAD file. The various components of the library 16 are disclosed in further detail hereinbelow.

In the layer 22, the compiler 26 (MIDMLc) is designed as a standalone compiler application, having a standard command line user interface. Command line options or directives for the compiler 26 are disclosed in Table 3. The compiler 26 is a developer-oriented application, outputting messages relating to parsing, generation, compilation and packing to the user. Using the compiler 26, dynamic creation of MIDlets is conveniently accomplished, using a single application.

TABLE 3

| Directive | Description |
| --- | --- |
| -g | Generate all Java debug info |
| -g: none | Generate no Java debug info |
| -g: {lines,var,source} | Generate debug info according to line, variables and source file |
| -intermediate <path> | Save intermediate Java source and class files |
| -nowarn | Generate no JAVAC warnings |
| -v: all | Verbose all outputs |
| -v: java | Verbose JAVAC output |
| -v: midml | Verbose MIDML parsing and generator output |
| -classpath <path> | Specify user class file location |
| -log <file> | Save log file to the specified file |
| -d <path> | Specify where to place generated.jad.jar files.default <project>/bin/ |
| -encoding <encoding> | Specify MIDML source code encoding |
| -vm <vm-flags> | Specify Java VM flags |

The servlet 28 is a web service interface to the library 16, allowing dynamic MIDlets to be served over the Internet using an over-the-air protocol. The function of the servlet 28 is to dynamically generate a MIDlet in response to specifications in a HTTP request. The HTTP request contains a URL for the requested MIDlet, and user specific parameters, e.g., a query string, or parameters for a HTTP POST operation. The output of the servlet 28 is another HTTP response containing the dynamically generated MIDlet application descriptor (JAD file). The servlet 28 invokes the parser 70, the generator 74, the Java compiler 78, and the packer 80 in order to generate the MIDlet.

The web server hosting the servlet 28 supports the above-noted Java Servlet Specification (Ver. 2.3 or higher). The servlet 28 uses the web server's log file to log its operations and error states. Sessions are managed by the web server, using query string hashing. Using the same mechanism, the servlet 28 creates user specific JAR files. This prevents multiple requests from overriding one another. The parameters shown in Table 4 define the server side behavior of the servlet 28.

TABLE 4

| Parameter name | Description |
| --- | --- |
| debug = [all;none;{lines, var, source}] | Generate all Java debug info to the web server |
| nowarn = [true; false] | Generate no javac warnings: |
| Intermediate = [{true, path};false] | Save intermediate Java source files: true = generate all intermediate files and save to the specified path; false = do not generate intermediate files |
| verbose = [all;midml;java] | Verbose to web server log modes: all = all outputs javac = javac outputs midml = midml parsing and generation outputs |
| classpath = [URL] | Specify user class file URL |
| Encoding = [encoding-type] | Specify midml source code encoding |
| Directory = [path] | Specify where to place the generated packed MIDlet executable (*.jad /*.jar files), the default is <Project-Dir>\bin |

Static MIDlet requests are handled in a straightforward manner by a web server. Thus, if a JAD file describing the requested MIDlet or the MIDlet's JAR file already exists on the web server, they are returned to the requesting MIDP device. The JAR file need not be recreated if the application source code has not changed.

Dynamic MIDlet requests are mapped by the web server to the context of the servlet 28. In form, a dynamic request is similar to a static request, but is modified when the requested JAD file does not physically exist on the server. The dynamic request is then propagated to the servlet 28, with the file name of the needed JAD file name being an initial generation parameter. Dynamic MIDlet creation then begins. After the MIDlet is created, a newly generated JAD file is returned to the requesting MIDP device. An exemplary static URL request and a dynamic URL request are given in Listing 11. A simple usage example is given in Listing 12. An exemplary query string in a HTTP request is given in Listing 13.

Figure 4B:
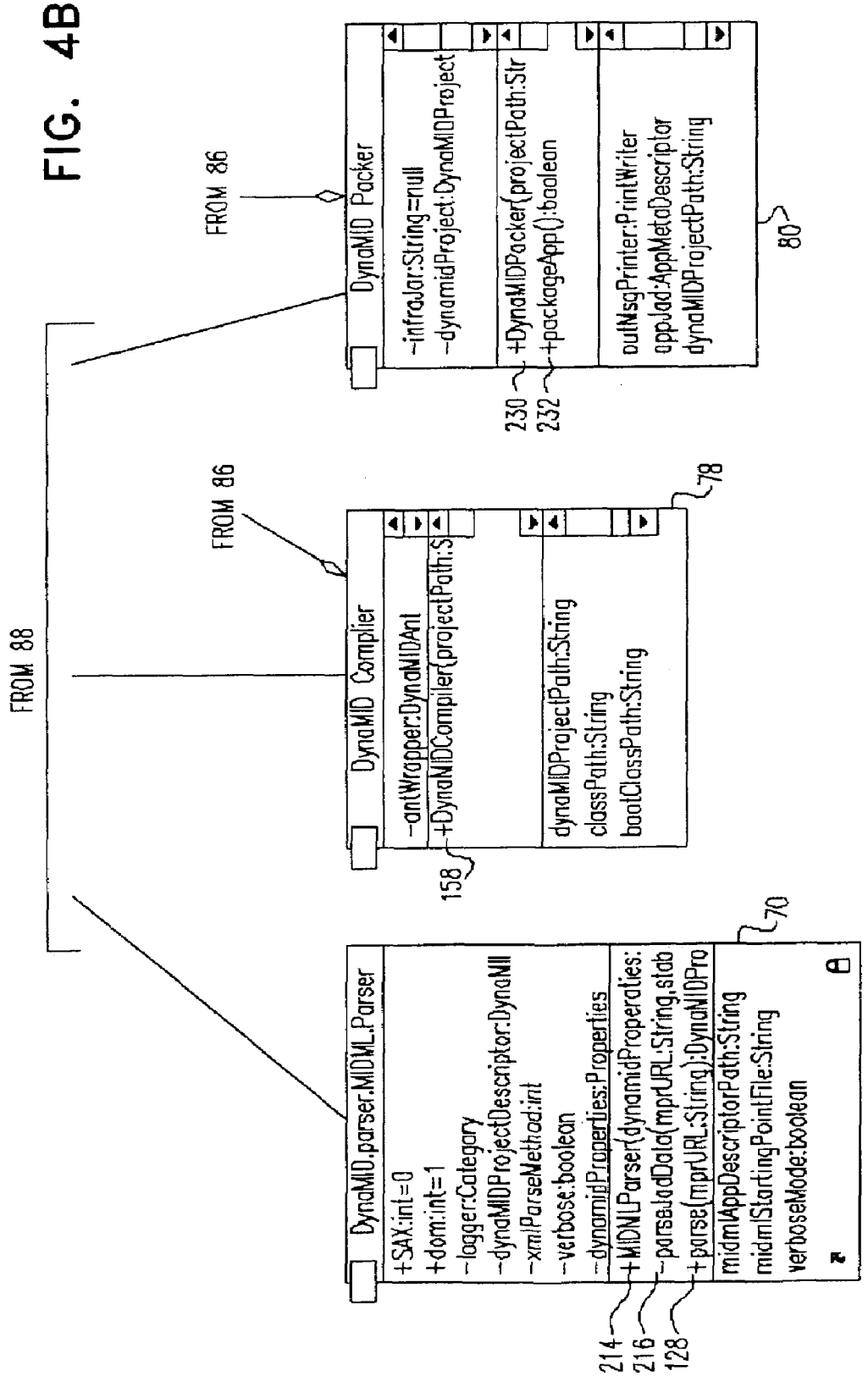
Figure 4C:
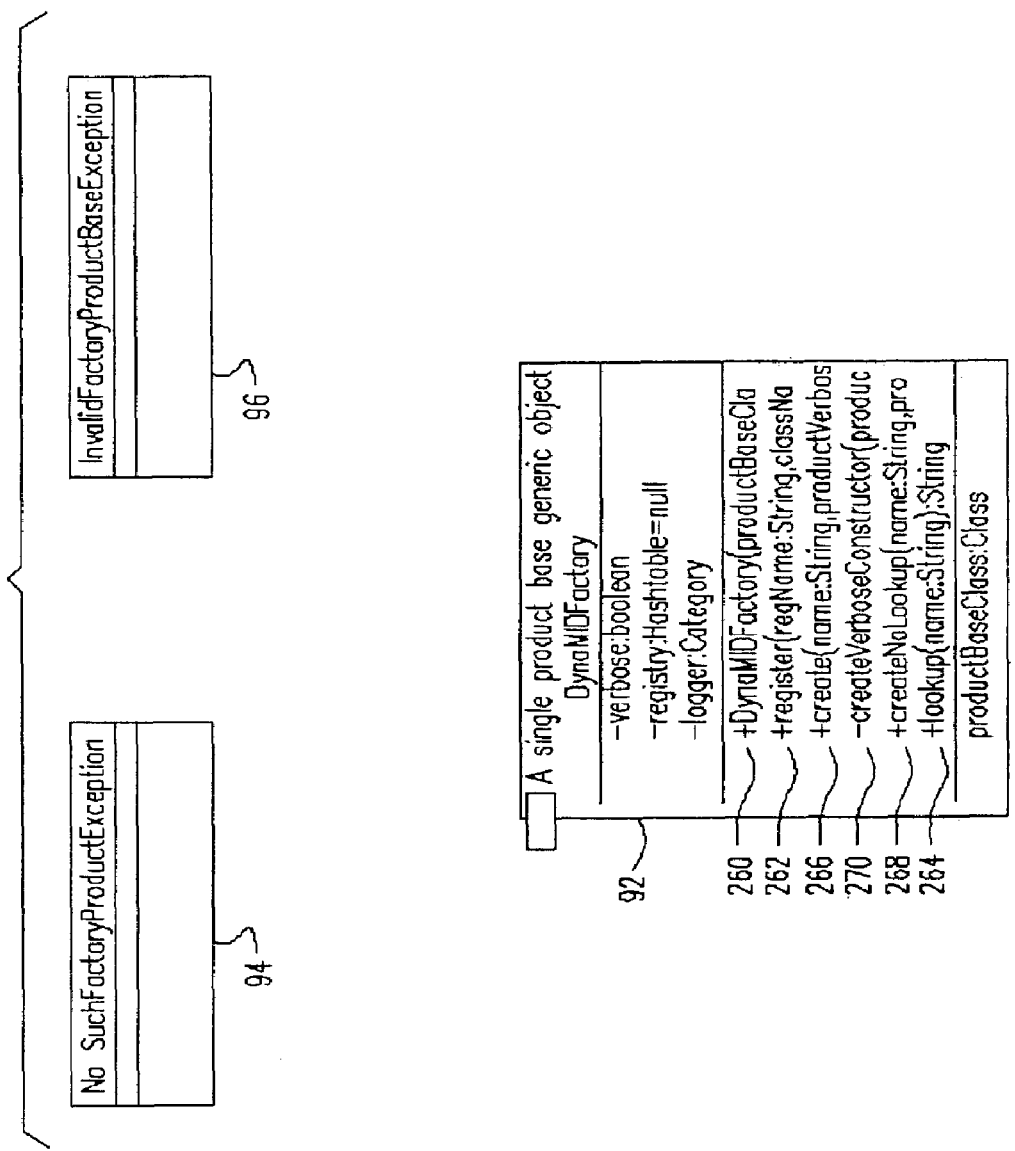
Figure 4D:
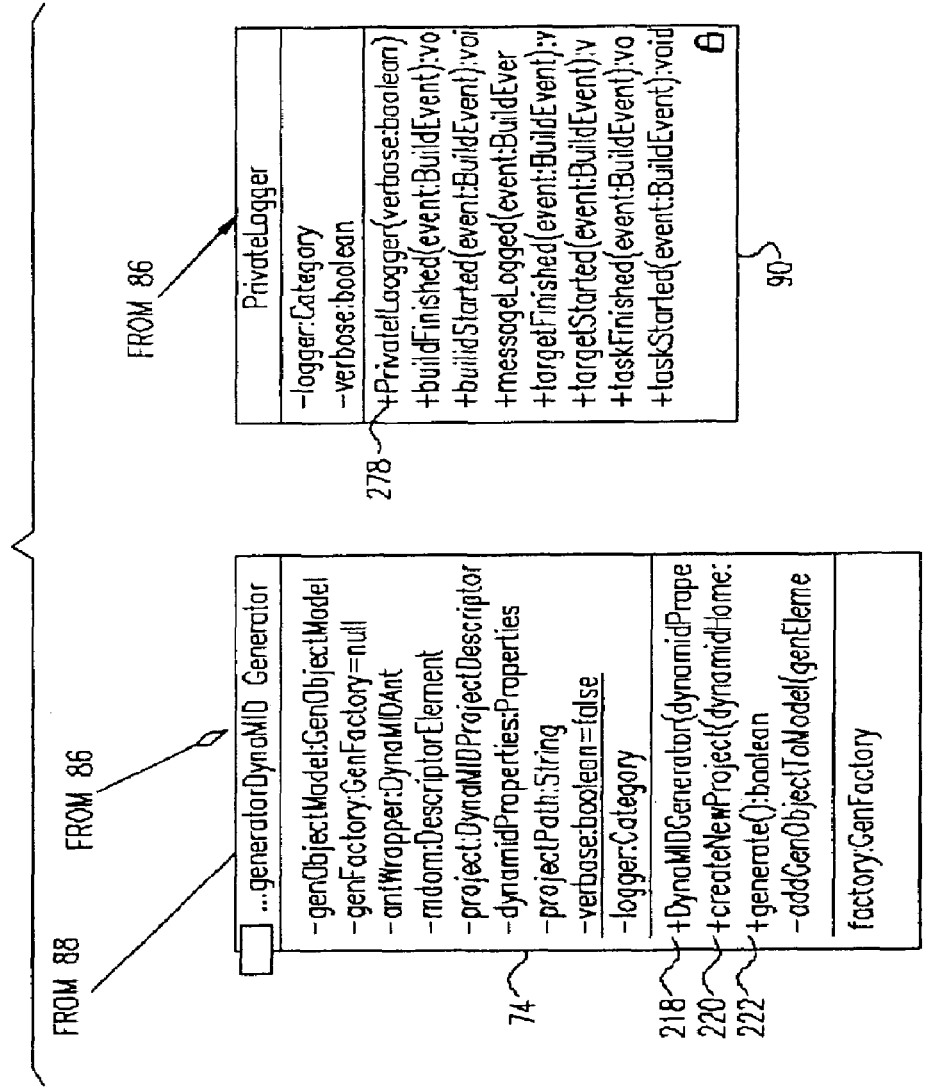

Reference is now made to FIG. 4, which is a class diagram describing the structure of the layer 22 (FIG. 1) in further detail. The disclosure of FIG. 4 should be read in conjunction with FIG. 1 and FIG. 3. Both the compiler 26 and the servlet 28 use the same classes in order to construct the parser 70 and the generator 74, as indicated for example by a line 82 and a line 84. The Java compiler 78 and the packer 80 are also constructed, using a build tool 86. The build tool 86 can be, for example, the Apache Ant, available from the Apache Software Foundation, 1901 Munsey Drive, Forest Hill, Md. 21050-2747, (www.apache.org). A wizzle 88 is a helper class, which is linked with the compiler 26 and the servlet 28 in the application layer, that is the layer 22 (FIG. 1), and with the elements or classes of the library 16, including the parser 70, the generator 74, the Java compiler 78, and the packer 80. A private logger class PrivateLogger 90 is provided to communicate with a logging unit (not shown). A factory class 92 is an infrastructural class used by DescriptorFactory and the GenFactory classes, which are disclosed in further detail hereinbelow. The factory class 92 facilitates the creation of other objects and classes. Two exception classes 94, 96 are used by the factory class 92.

Behavioral Aspects.

Figure 5B:
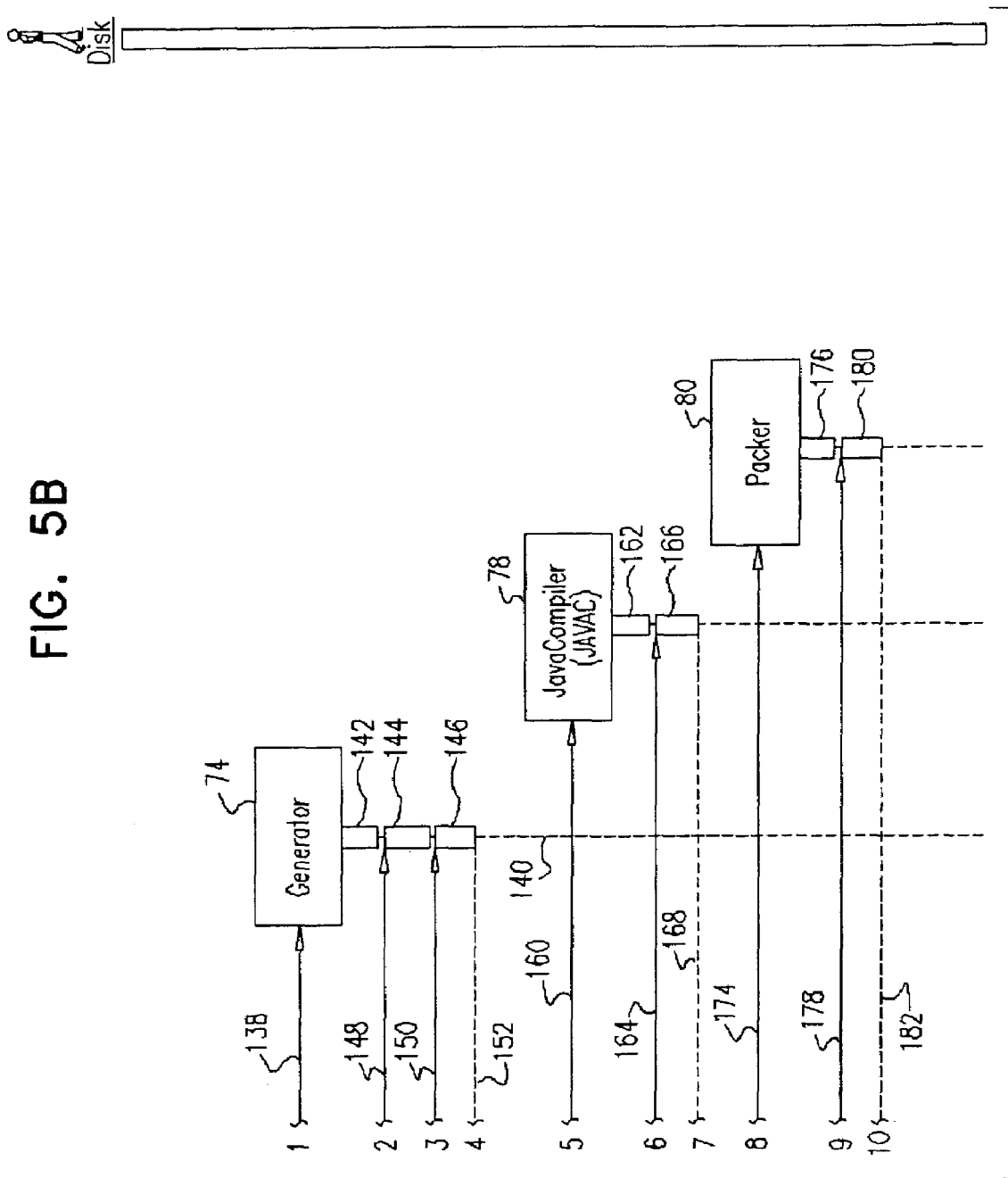

Reference is now made to FIG. 5, which is a sequence diagram applying to the compiler 26 and to the servlet 28 as well, in typical web service. The disclosure of FIG. 5 should be read in conjunction with FIG. 3. FIG. 5 illustrates the program flow of the compiler 26, and servlet 28 with the infrastructure 30. It shows the complete flow from a MIDML application to a dynamically created MIDlet JAR and JAD, including activation of various components, interactions of the components, and data passing. The compiler 26 and the servlet 28 interact substantially identically with the infrastructure 30. Their external interfaces differ, the compiler 26 usually being invoked via the command line, while the servlet 28 is typically invoked via a HTTP request. It will be understood by those skilled in the art that references to activities of the library 16 mean references to processes using library modules or code or processes generated using the library. In some embodiments, the wizzle 88 is used. In other embodiments, the wizzle 88 can be omitted.

At the left of FIG. 5, a developer 98 initiates the program flow in an activation 100 of an appropriate process in a computer device (not shown). Data is passed to the compiler 26, as indicated by a message line 102. As noted above, this can be done using a command line interface. The compiler 26 operates during an activation 104. Interaction between the compiler 26 and other elements of the library 16 when a method parse() 243 of the wizzle 88 is invoked by the compiler 26 on a message line 110. The wizzle 88 is activated several times along its object lifetime 112, shown as activations 114, 116, 118, 120.

During an activation 114, the wizzle 88 interacts with the parser 70. The constructor of the parser 70 is invoked on a message line 122 to produce activation 124. In a subsequent activation 126, a method parse() 128 of the parser 70 is then invoked on a message line 130. This is accomplished using method parseJadData() 216 (FIG. 4), which operates during the activation 126, and results in JAD file information. The information is then returned to the wizzle 88 on a message line 132, which awaits in the activation 114, and thereupon relays a result to the compiler 26 along a message line 134.

Next, method generate() 240 (FIG. 4) of the wizzle 88 is invoked by the compiler 26 along a message line 136. During the activation 116, the wizzle 88 invokes the method DynaMIDGenerator() 218 (FIG. 4), the constructor of the generator 74 along a message line 138. An object lifeline 140 of the generator 74 indicates activations 142, 144, 146. Upon receiving the message on the message line 136, the generator 74 begins operation in activation 142. Additional invocations of method createNewProject() 220 (FIG. 4) and method generate() 222 (FIG. 4) on message lines 148, 150 result in activations 144, 146, respectively. Then, in activation 146, a completion message is returned to the wizzle 88 on a message line 152. The wizzle 88 then reports completion of the generation task to the compiler 26 on a message line 154. Java source code for the project is now available.

Next, the compiler 26 initiates compilation of the Java source code by invoking method compile() 238 (FIG. 4) of the wizzle 88 on a message line 156, which results in activation 118. The wizzle 88 then invokes method DynaMIDCompiler() 158, the constructor of the Java compiler 78 on a message line 160, which results in activation 162 of the Java compiler 78. The wizzle 88 then invokes the method compile() 238 (FIG. 4) of the Java compiler 78 on a message line 164, resulting in activation 166. The Java compiler 78 reports completion of the Java compilation task to the wizzle 88 on a message line 168. The wizzle 88 then reports completion of the Java compilation task to the compiler 26 on a message line 170.

Next, the compiler 26 initiates the assembly of an archive file, which is typically a JAR file. Method archive() 242 (FIG. 4) of the wizzle 88 is invoked on a message line 172, which results in activation 120. The wizzle 88 then invokes the constructor of the packer 80, method DynaMIDPacker() 230 (FIG. 4) on a message line 174, which results in activation 176. The wizzle 88 then invokes method packageApp() 232 (FIG. 4) of the packer 80 on a message line 178, resulting in activation 180. The packer 80 reports completion of the archival task to the wizzle 88 on a message line 182. The wizzle 88 reports completion of the packaging task on a message line 184.

Finally, the compiler 26 reports availability of the MIDlet to the developer 98 on message line 186 via the servlet 28.

Interfaces.

Figure 6:
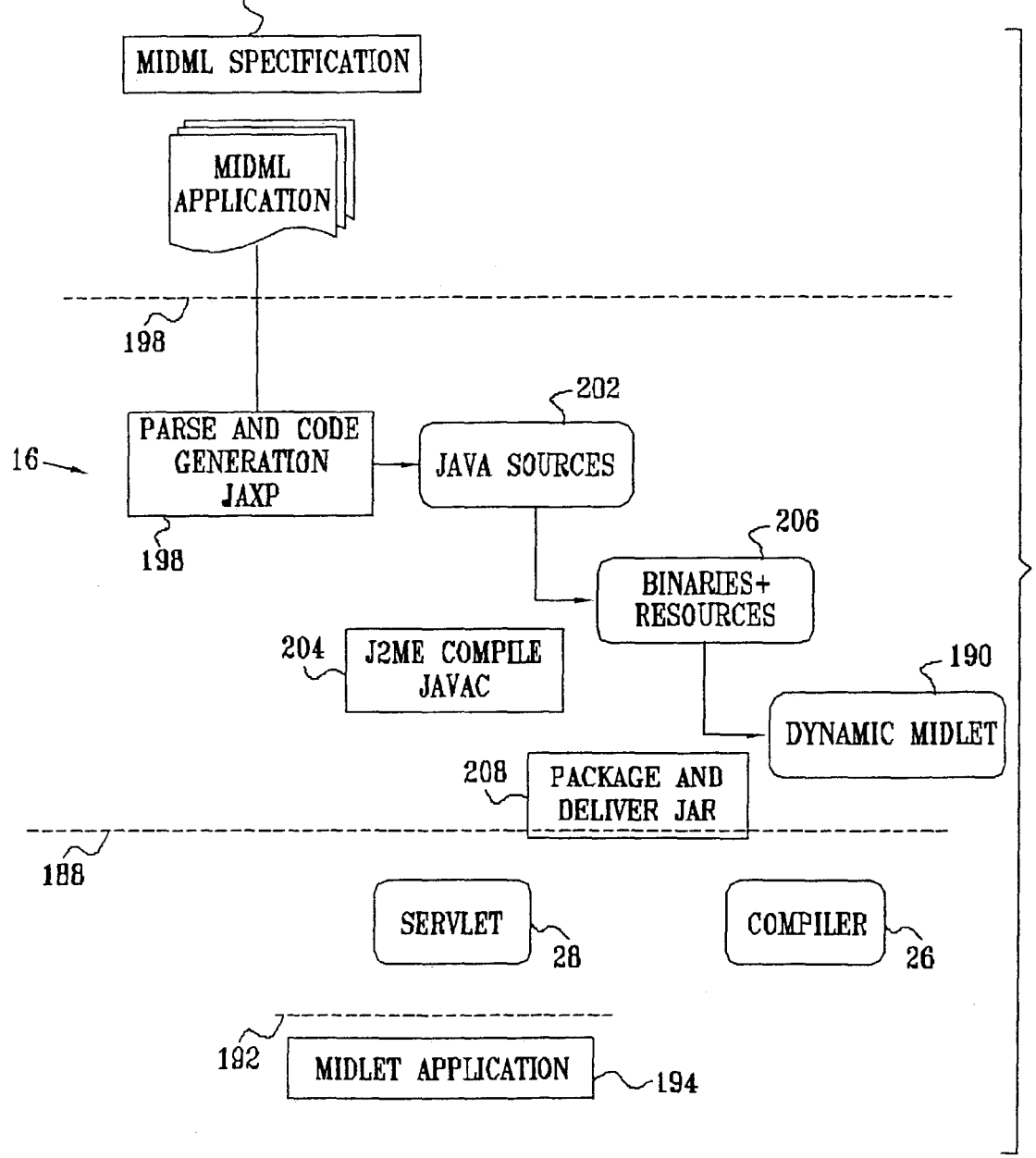
FIG. 6 is a block diagram illustrating software interfaces and other relationships of the set of software components shown in FIG. 1 in accordance with a disclosed embodiment of the invention.

Reference is now made to FIG. 6, which is a block diagram illustrating software interfaces and certain other aspects of the set of software components 10 (FIG. 1) in further detail. The layered architecture of the set of software components 10 (FIG. 1) mandates three user interfaces for the different users of the infrastructure 30, each of which involves different functionality. The compiler 26 provides the MIDML/MIDSP developers with a command line interface 188 to a dynamically created MIDlet 190. The servlet 28 provides MIDML/MIDSP developers and end-users with a web service interface 192 to a MIDlet application 194 downloaded from the MIDlet 190. The library 16 provides the Java developer with a programming API 196. The command line interface 188, the API 196, and the web service interface 192 are represented by dashed lines in FIG. 6. In this embodiment, the servlet 28 is implemented using the JAVAX.servlet package, the specification of which is available from Sun Microsystems, Inc., and is optionally adapted for servlet web access service according to requirements of a particular application.

In this embodiment, the library 16, as part of the infrastructure 30 (FIG. 1), is a Java based solution, utilizing several Java technologies. The library 16 provides a XML parser and generator 198, employing JAXP, which operates using a MIDML specification 200 (Appendix 1). The API 196, which can be the MIDP 1.0a API JAVAX.microedition, available from Sun Microsystems, Inc., is used for the Java code generation components of the library 16. Java source code is emitted as an intermediate output 202. Included in the library 16 is a J2ME module 204, which supports the compiler 26. The compiler 26, using the intermediate output 202, emits another intermediate output 206, which includes binary files and resources. The intermediate output 206 is packaged and delivered by the compiler 26 as the MIDlet 190 as a JAR file and a corresponding JAD file using a library module 208.

Functional Requirements.

Referring again to FIG. 1 and FIG. 2, detailed functional requirements of MIDML are disclosed in Appendix 1. Detailed functional requirements of the library 16 are disclosed in Appendix 2. Detailed functional requirements of the compiler 26 are disclosed in Appendix 3. The functional requirements, operation modes and Web application behavior of the servlet 28 are disclosed in Appendix 4. A MIDlet developed using MIDML has the same look, feel, and power of a statically developed MIDlet.

Application Structure and MIDML Support.

MIDML Applications have the following file structure definitions. A MIDML project file (*.mpr) contains the MIDlet application descriptor, and a pointer to an application starting point file. The project file has a valid URI pointer to a project starting point MIDML source file, which contains a <midlet> tag (Listing 15), and defines the MIDML application starting point.

A MIDML source file (*.midml) contains actual MIDML source code. A MIDML application may have additional MIDML source files. However, such additional MIDML source files are typically limited to defining additional application screens using the <screen> tag type, which is disclosed hereinbelow. All MIDML file content, regardless of type, is written within the scope of a MIDML tag, an example of which is shown in Listing 14. The MIDML tags contain sufficient information to enable code for elements such as timers, screens, and events to be generated. For example, a <timer> tag type specifies what occurs after a MIDP timer fires. In another example, mappings of Pause and Resume methods may be mapped to MIDP methods. Such mappings are specified MIDML in tags relating to Pause and Resume events.

The MIDlet application descriptor has the following general structure. A tag <app-start-file> contains the pointer to the application starting point MIDML source file. A tag <descriptor> contains all the related metadata of the MIDlet. An exemplary MIDlet application descriptor is given in Listing 15.

Listing 16 is a code template, which illustrates the general structure of a MIDlet in MIDML. A single instance tag <midml app> is shown. This tag appears at the project starting point. The order of appearance of other MIDML tags is important to the schema validation. Comments in Listing 16 indicate the correct order of appearance of the MIDML tags.

Events.

MIDML supports MIDP-1.0 MIDlet native events. An event StartApp occurs upon initiation of an application. It includes a <link> tag indicating the application's first screen. An exemplary link tag is shown in Listing 17, which directs the parser 70 to include a specified MIDML source file. In Listing 17, an identifier "href" is a URI indicating a file to be included. Event handler techniques are disclosed hereinbelow.

Event Handling Model.

MIDML exposes event handlers related to specific language elements. A MIDML event handler is a special operations placeholder and is defined within the relevant language element. The following disclosure is a summary of the event-handling model applicable to MIDML. Specific details are disclosed in further detail in the discussion of particular language elements.

At the Application level, the following events are adapted from MIDP-1.0. An event "startApp" is triggered upon starting an application. An event "pauseApp" is triggered before the application changes its state from running to paused. The event "destroyApp" is triggered before the application changes its state from active or paused to destroyed. An event "resumeApp" is added in MIDML. It is triggered when the application changes its state to running from a paused state.

The following events apply to screens. An event "loadScreen" is triggered before each screen loads, i.e., when the screen object is displayed. An event "unloadScreen" is triggered before a form is ready to unload, i.e., when a screen is about to be removed from the display. An event "onSelect" is triggered when a List's screen choices context is updated. Lists are disclosed in further detail hereinbelow.

The following events apply to widgets, and are adapted from MIDP-1. An event "OnItemStateChanged" is triggered upon a change in the state of an item in a widget. An event "CommandAction" is triggered upon activation of a command widget. Widgets are disclosed in further detail hereinbelow.

An event "onTime" applies to timers. It is triggered upon expiration of a timer delay interval. The interval can begin upon timer activation or according to a schedule.

Navigation.

MIDML Developers require a convenient mechanism for referencing the language elements used in their applications. MIDML defines the following naming conventions. The application tag <midml-app> defines the name attribute of the application. Each MIDML language element has a name attribute. Name-driven navigation is accomplished using the following name attributes for the application, screen, widget, item and variable respectively: application-name; screen-name; widget-name; item-name; and variable-name. The character "." is used as a reference directive, for example, "MIDlet-Name.Screen-Name.Widget-Name".

MIDML predefines additional navigation possibilities for particular language elements. This feature exposes certain data to the developer. Servlet response is accessible using the reference MIDlet-Name.Screen-Name.Servlet-Name.response. A property of items is accessible using the reference MIDlet-Name.Screen-Name.Item-Name.Item-Property. Ticker text is accessible using the reference MIDlet-Name.Screen-Name.Item-Name.Item-Data.

Signals.

Signals are a feature of MIDML, which enable triggering of certain events in the application. The following signals apply to the application level (layer 22; FIG. 1).

A signal STARTAPP restarts the current application, at the point specified by the tag <onstartapp> in the tag <MIDML-APP> that applies to the current application. The following syntax illustrates this signal:

<signal>startApp</signal>.

A signal PAUSEAPP pauses the current application. Execution resumes at the point specified by the tag <ONPAUSEAPP> of the tag <MIDML-APP> that applies to the current application. The following syntax illustrates this signal:

<signal>destroyApp</signal>.

The following signals apply at the screens level.

A signal LOADSCREEN causes reloading of the current screen by a call to the screen's load event handler. The following syntax illustrates this signal:

<signal>reloadScreen</signal>.

A signal UNLOADSCREEN causes the current screen to be unloaded, by a call to the screen's unload event handler. The following syntax illustrates this signal:

<signal>unloadScreen</signal>User Interface.

Elements.

Widgets in The MIDML user interface include command widgets and ticker widgets. MIDML also defines a generic item element with the following attributes. The attribute "label" defines the item label. The attribute "name" is the programmatic identifier of the item. The attribute "persist" is a persistence flag, which is disclosed in further detail hereinbelow. An interactive MIDML item has an event handler "onItemStateChanged", which is triggered upon a change in its the internal state. All currently defined widgets are compliant with MIDP-1.0.

A command widget is the MIDML equivalent of a MIDP-1.0 command. It holds the information concerning an action, and has an attribute "label", which is the command label. An attribute "commandType" defines the command type. This attribute has one of the values BACK, CANCEL, EXIT, HELP, ITEM, OK, SCREEN, and STOP. The attribute "priority" defines the command priority, and has an integer value. A property "text" holds text field data. An exemplary command widget is presented in Listing 18.

A ticker widget implements a "ticker-tape" display, that is a text display that runs continuously across the screen. A ticker element is attached to a screen element, which is disclosed hereinbelow. The ticker widget has an attribute "maxSize", which is the size of the text field. An attribute "constraint" has one of the MIDP-1.0 text constraint values ANY, EMAILADDR, NUMERIC, PASSWORD, PHONENUMBER, and URL. The ticker widget has a property "tickerText", which is its text field data. An exemplary ticker widget is presented in Listing 19.

In addition to the above-noted widgets, MIDML features a number of items relating to the user interface.

A gauge class implements a bar graph display of a value intended for use in a form. The gauge class has an attribute "interactive", indicating whether the value of the gauge is read-only, or whether it can be changed by the user. The gauge class has a property "label", which is the gauge label. A property "maxValue" holds the bar graph's maximum value. A property "value" holds the current value of the gauge. An example of the gauge class is presented in Listing 20.

A text field is an editable text item that may be placed into a screen. The text field has an attribute "maxSize", which is the maximum length of the text field. An attribute "constraint" has one of the MIDP-1.0 text constraint values ANY, EMAILADDR, NUMERIC, PASSWORD, PHONENUMBER, and URL. A property "text" holds text field data of the text field. An example of the text field is presented in Listing 21.

A date field is an editable component for presenting date and time or calendar information that may be placed into a screen. The date field has a property "data", which can be one of the following: "dateTime", containing date and time information; "date", containing only date information; and "time", containing only time information. The date field has an additional property "timeZone", containing a time zone setting. An example of the date field is presented in Listing 22.

A "ChoiceGroup" is a group of selectable elements intended to be placed within a screen. The details of the ChoiceGroup are disclosed below.

A choice element represents an entry within a ChoiceGroup item, a list or in a screen context. A choice element is defined only within the scope of a <choices> tag (Listing 23). A choice element has an attribute "name", which is the name of the choice. An attribute "selected" is a Boolean value represents the selection status of the element. An attribute "image" specifies an image that is associated with the choice. A choice element has a property "text", representing the text of the choice element.

The ChoiceGroup has an attribute "choiceType", which is the context type. It may have one of the values SINGLE, or MULTIPLE. A property "choices" is a sequence of choices and their respective images. A property "selectedIndex" is an integer, pointing to a currently selected choice element. The value −1 indicates that no selection has been made. A property "selectedText" holds the text of the currently selected choice element. An exemplary ChoiceGroup is presented in Listing 23.

An item "StringItem" contains a string. The item StringItem is display only. The user cannot edit the contents. The item StringItem has the property "text", which contains the string data. An example of the item StringItem is given in Listing 24.

An item "ImageItem" provides layout control when image objects are added to a screen. Images are fetched from local or remote files during the MIDlet generation process, and are placed in a directory specified in a tag <Project-Dir>\res. The contents of this directory are packaged together with the generated MIDlet JAR file. It is the responsibility of the MIDML developer to make sure that the embedded resource sizes match the target device constraints. The item ImageItem has an attribute "layout", which represents the image layout type. It has one of the values LAYOUT_CENTER, LAYOUT_DEFAULT, LAYOUT_LEFT, LAYOUT_NEWLINE_AFTER, LAYOUT_NEWLINE_BEFORE, and LAYOUT_RIGHT. A property "imageSource" is an image resource URI, or a relative path to the directory specified in the tag <Project-Dir>. A property "altText" is an alternative image text. An example of the item ImageItem is given in Listing 25.

MIDML provides a facility for threads to schedule tasks for future execution in background threads. A timer element is defined within the scope of a <midlet-app> tag or a <[Type]-screen> tag, for example a login screen, <login-screen> tag. A timer element has an attribute "name", which is the name of the timer. An attribute "delay" is the timer delay interval in milliseconds. An attribute "schedule" is the scheduled start time schedule (datetime). A property "ontime" references an event handler for the timer. An exemplary timer object declaration is presented in Listing 26.

Screens.

MIDML defines a generic screen element. A screen element has an attribute "name", which is the name of the screen. An attribute "source" refers to the source MIDP-1.0/MIDML. An attribute "title" is the title of the screen. An attribute "ticker" refers to a ticker element. An attribute "persist" is a persistence flag. A screen element has an event handler "onLoad", which responds to an indication to load the screen element. An event handler "onUnload" responds to an indication to unload the screen element.

An "alert screen" is a screen that displays information to the user, and waits for a predetermined period of time before proceeding to a subsequent screen. The alert screen has an attribute "type", which is the alert type. It has one of the values ALARM, CONFIRMATION, ERROR, INFO, and WARNING. An attribute "timeOut" determines the display time. A property "message" represents a message displayed in the alert screen. A property "image" holds an image associated with the alert screen. A property "sound" represents sound associated with the alert screen. An exemplary alert screen is presented in Listing 27.

A form is a screen that contains an arbitrary mixture of items: images, read-only text fields, editable text fields, editable date fields, gauges, and choice groups. An exemplary form is presented in Listing 28.

A TextBox is a screen that allows the user to enter and edit text. The TextBox has an attribute "maxSize", which is the maximum size of the text. An attribute "constraint" holds MIDP-1.0 text constraints, and has one of the values ANY, EMAILADDR, NUMERIC, PASSWORD, PHONENUMBER, and URL. A property "message" holds the screen's message. A property "image" represents an associated image. A property "sound" represents a sound associated with the TextBox. An exemplary TextBox is presented in Listing 29.

A list or list class is a screen containing a list of choices. The list has an attribute "context", which holds one of the MIDP-1.0 choice context values SINGLE, and MULTIPLE. A property "choices" holds a list of choices. A property "selectedIndex" holds an integer, pointing to a currently selected choice element. The value −1 indicates that no selection has been made. A property "selectedText" holds the currently selected choice text. An event "onSelect" is triggered when the List-Screen choices context is updated, i.e., when the selected choice changes. The event "onSelect" can be triggered in both SINGLE and MULTIPLE choice contexts. An exemplary list is presented in Listing 30.

Persistence.

By default, application data and variables are not persistent in MIDML. All widgets and data variables are set to their default values unless otherwise specified. MIDML provides for persistent data and other elements within an application. Two types of persistence are supported.

In "application persistence", data is persistent between different executions of an application. The data is loaded when the application is started, and is saved when the application is destroyed. This type of persistence uses the device records management system (RMS), for example, non-volatile memory. An instruction specifying a persistent data variable is presented in Listing 31.

In "screen persistence", data persists between screen changing events during a single execution of an application. The data is reloaded each time the screen is reloaded, and is saved when the screen is unloaded. This type of persistence uses the device random access memory (RAM). An example of screen persistence is presented in Listing 32.

The persistence mechanism in MIDML applies to data variables, item widgets, screens, and tickers, all of which have a persistence attribute that can be optionally included in the element definition.

Resource Handling.

The current embodiment of MIDML includes a resource embedding mechanism for image resources. An image resource is embedded statically. The embedding mechanism is built in the ImageItem element tag (Listing 25).

Data Variables.

A MIDML variable can be defined within a <midml-app> tag or any screen tag definitions. MIDML supports two variable types: variant and Boolean. A variable of type variant is a string based variable. The following tag is exemplary:

<variable name="UserID">0435653887</var>.

An exemplary tag showing a variable of type Boolean follows:

<boolean name="flag"> true</boolean>.

Assignment Operation.

Assignment operations in MIDML apply to the following language elements and their respective properties: data variables (variant, Boolean); servlet responses; widgets, both widget items, and tickers; and screen properties. An assignment operation is defined by the following tag:

<assign> argumentTo=argumentFrom </assign>.

The assignment operation argument is a valid MIDML navigation path.

Flow Control.

A MIDML link operation is a basic jump operation from a source event handler to a destination displayable element. The destination of a link operation is a screens element. A link is defined by the following tag:

<link ref="MIDlet-NAME.Screen-Name"/>.

A MIDML "If" operation is a basic branch operation. In the If operation, a Boolean expression is evaluated, during which two event handlers are exposed for alternate cases. An If operation is defined in Listing 33.

Timer Support.

Activation of a previously defined timer element (Listing 26) is shown in the following exemplary tag:

<activateTimer timer="timerTest"/>.

Cancellation of the operation of a previously defined timer element is shown in the following exemplary tag:

<cancelTimer timer="timerTest"/>.

Servlet Connectivity Support.

MIDML defines a servlet element to enable a developer to create interconnected applications. MIDML is thus able to exploit the Internet. It is possible, too, for the developer to specify execution of remote process, including passing of parameters and retrieving of data.

MIDML currently supports two types of servlets. The design of the servlet mechanism is generic and is reflected in the schema definition of the servlet object (Listing 4).

The generic servlet has an attribute "protocol", which defines the protocol used by the servlet. An attribute "http-method" has one of the values GET, POST, and HEAD, which refer to standard HTTP methods. A URL of the servlet is specified by an attribute "URL".

This generic mechanism also allows activation of a servlet with no protocol. It is possible to activate the servlet without checking the servlet response, using the value "NONE" as the protocol attribute, and the POST method as the http-method attribute.

A servlet element has dynamic properties representing the servlet parameters, which are defined using a servlet parameter declaration, as shown in the following tag:

<param name="Parameter-Name">Value</param>.

Using the MIDML naming convention scheme, servlet parameters can be accessed and changed at run time. An exemplary servlet definition is presented in Listing 34. A login example for a servlet using a servlet parameter value is given by the following:

MyMIDlet.MyScreen.TestBoolServlet.login="New-Servlet-Parameter-Value".

A text servlet is a servlet, which returns simple text that can be displayed to the user using widgets. An exemplary text servlet is presented in Listing 35.

Once a servlet has been defined, it is activated using the following syntax:

<activateServlet servlet="sampleServlet"/>.

Performance Requirements.

Continuing to refer to FIG. 1 and FIG. 2, the compiler 26 and the servlet 28 cooperate to parse, generate, compile, and package MIDML applications into a MIDlet at a scheduled time, which may be application specific, and may be a function of the available hardware and communications bandwidth.

The servlet 28 allows concurrent multiple activations, in order to function as a reliable Web service.

Statically created and dynamically recreated MIDlets typically look and behave identically.

Detailed Structure of System Components.

Parser.

Referring again to FIG. 3 and FIG. 4, the parser 70 employs the Java document object model (JDOM) Java XML interface, developed under the Java Specification Request JSR-102. It is an advantage of the present design that the set of software components 10 (FIG. 1) need not rely on any particular XML parser. The MIDML specification (Appendix 1) defines strict XML schema rules for the validity of the MIDML source code. The parser 70 enforces these rules using schema validation of the syntax of MIDML source files. The parser 70 is linked to the wizzle 88.

The input to the parser 70 is one or more MIDML application source code files (*.midml). The output of the parser 70 is the project descriptor object 72. It is the responsibility of the parser 70 to validate the MIDML text, to provide a description of the application components for the code generator components, and to expose the project descriptor object 72 during the parsing task.

Figure 7:
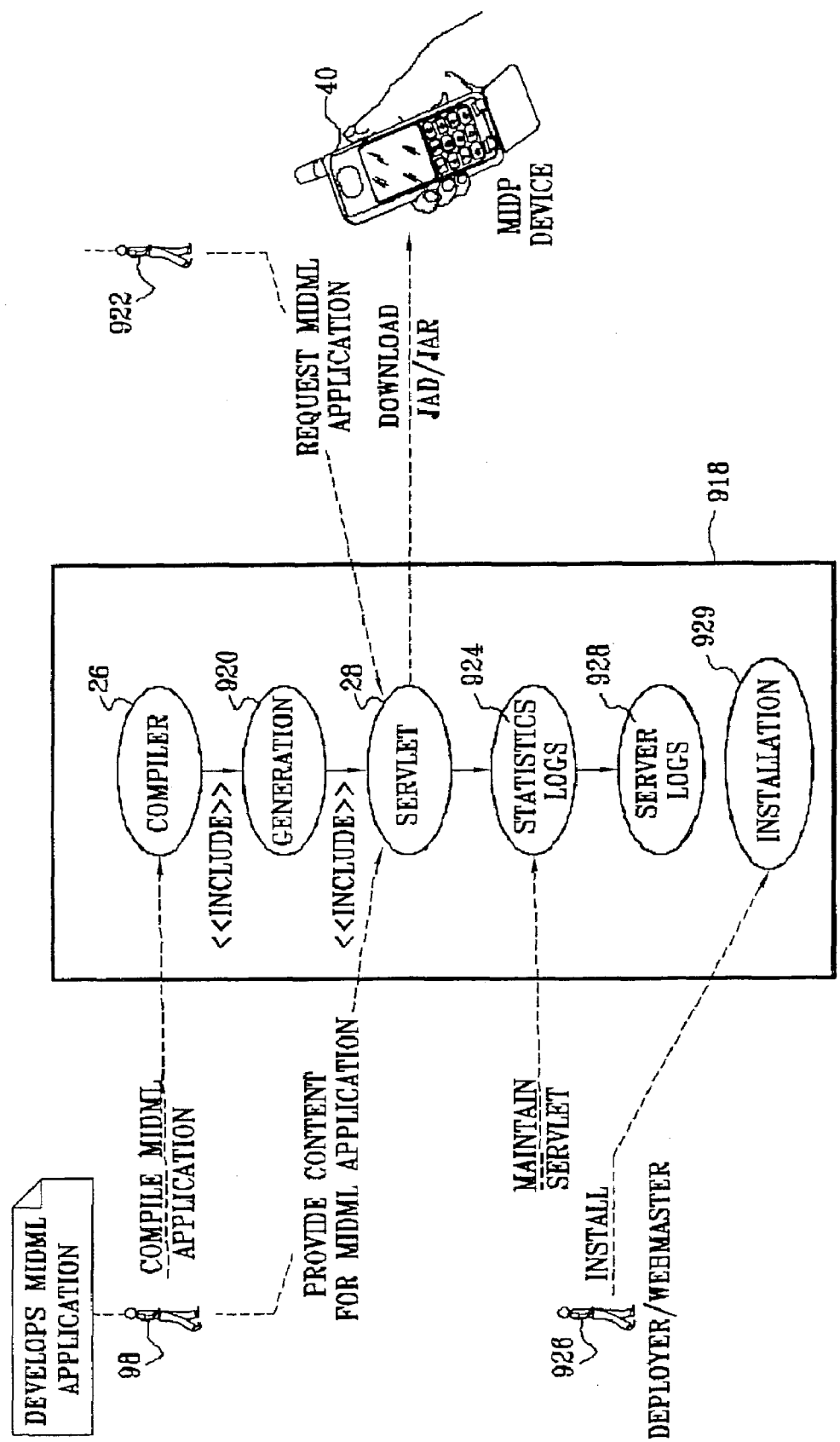
FIG. 7 is a block diagram illustrating use cases relating to the software components shown in FIG. 1 and FIG. 2 in accordance with a disclosed embodiment of the invention.

Operation of the parser 70 involves invoking a XML Parser/Validator to verify the source MIDML files against schema definitions. Once the source is validated, the parser 70 builds the project descriptor object 72 (FIG. 3). The project descriptor object 72 describes a valid and parsed MIDML application using a tree structure. The tree hierarchy is identical to the original MIDML (*.midml) source code structure. The project descriptor object 72 provides an association between the parser 70 and the generator 74, and with application meta-data in the JAD file (*.jad). The project descriptor object 72 is exposed to the developer 98 (FIG. 7). The project descriptor object 72 is thus a wrapper for an entire MIDML project. It consists of two objects: an object AppMetaDescriptor 210, which is a JAD data wrapper, and a MIDML descriptor object model 212 (MDOM), which is a tree oriented data structure that is disclosed in further detail hereinbelow. The descriptor object model 212 includes elements, or readers, that can include objects that are adapted to ultimately induce generation of the following application building blocks by a code generator: MIDlet application structure; screens; widgets; events; operations; variables; and extensible elements. The objects include instance-specific data needed to generate the code. The code generation mechanism includes additional, non-instance specific data. The objects can represent multiple versions of the same building blocks that are parametrically different. For example, parametrically different screens have parameters that may include the position of a label, and the text that is displayed on the screen. These items typically vary among different screens.

The descriptor object model 212 is the main data structure created by the infrastructure 30 (FIG. 3). The descriptor object model 212 is a composite object, built up of several hierarchies of descriptor elements. It describes the MIDML source code to the generator 74. The MIDML description is specific; each descriptor element exposes its relevant data through public methods. Descriptor elements themselves are composite structures, and a descriptor element may contain another descriptor element.

The methods of the parser 70 include a method MIDM-LParser() 214, which is a class constructor. A private method parseJadData() 216 parses the MIDML project file (*.mpr). The method parse() 128 parses the MIDML application XML files, and builds a MDOM tree.

Generator.

Continuing to refer to FIG. 3 and FIG. 4, the generator 74 is responsible for aspects of the project related to generation of Java source code. The generator 74 is linked with the build tool 86 and the wizzle 88. Code produced by the generator 74 is required to handle such matters as application flow, application screens and forms, application events, widget event handling, application data and containers, and the creation of the project directory structure.

The input to the generator 74 is the project descriptor object 72. The output of the generator 74 is a directory structure <Project-Dir>, Java source code files, and embedded resources. During operation, the generator 74 handles ambiguities and syntax errors in the input, and optimizes the Java source code. A log file is generated, and the generator 74 also inserts the Java source code files and other embedded resources into the project subdirectories.

The generation object model 76 is created by the generator 74 to generate Java source code files. The generation object model 76 links to the directory tree of the descriptor object model 212, and handles code generation logic. The generation object model 76 is specific to the MIDML tag descriptor of a current project descriptor object 72. During its operation, the generation object model 76 uses a Java source code generator object.

The generator 74 has a method DynaMIDGenerator() 218, which is a class constructor. The properties of the constructed class are those which were provided by the parser 70. The facilities of the build tool 86 are invoked by the method DynaMIDGenerator() 218 to obtain the project directory in which the project structure, source files, and resources are to be created.

A method createNewProject() 220 of the generator 74 constructs the project directory structure, either in a directory that is specified by a path at construction time, or in a temporary directory.

A method generate() 222 is the main method of the generator 74, and is responsible for actual code generation.

Compiler.

Continuing to refer to FIG. 3 and FIG. 4, the compiler 26 is implemented as a compiler abstraction object, which uses the build tool 86 as a wrapper for the Java compiler 78. The compiler 26 compiles the Java source code produced by the generator 74 according to supplied directives.

The inputs of the compiler 26 are compiler directives and workspaces, which are J2ME wireless toolkit project workspaces in this embodiment. Other inputs of the compiler 26 are starting point files and Java source code files. The outputs of the compiler 26 are class files, which can be J2ME class files, and compilation log files.

The compiler 26 locates Java source code files using an input starting point. It invokes the Java compiler 78, which compiles the source code, and stores the result in a directory specified in a tag <Project-Dir>\tmpclasses. A verification module preverify.exe is then executed using a system call. Verified classes are copied into the directory specified in the tag <Project-Dir>\classes. Compilation log files are also produced by the compiler 26.

The compiler 26 includes a public function main() 224 and two private functions: a method printprocessInputLine() 226, which processes the input command line for application flags and parameter values, and a method printUsage() 228, which outputs usage data of the compiler 26 to a system display, for example System.out.

Packer.

Continuing to refer to FIG. 3 and FIG. 4, the packer 80 creates an application descriptor file (*.jad file), and creates a JAR manifest file. The packer 80 packages the project classes and resources in a MIDlet JAR file, and is linked with the build tool 86 and the wizzle 88. The packer 80 may package additional classes, e.g., licensee open classes. The input of the packer 80 is specified in the tag <Project-Dir> directory starting point. In addition, the packer 80 packages the association object AppDescriptor, obtained from the parser 70 or another source (not shown). The packer 80 may operate in response to specific packing directives. By default, the packer 80 includes class files and resources specified by the MIDML source. The defaults are modifiable as required for a particular application. The output of the packer 80 is a packed MIDlet with its respective *.jar and *.jad file residing in the directory specified in the tag <Project-Dir>\bin.

The packer 80 includes a method DynaMIDPacker() 230, which is a class constructor. A method packageApp() 232 creates the JAR file to package the MIDlet using the standard resource java.util.jar. The method packageApp() 232 also creates the JAD file, its manifest, and adds the appropriate URL and viewer (QAZ).

Servlet.

The servlet 28 is linked to the wizzle 88. It has a public function doGet() 234, which accepts a HTTP servlet request from a user, and returns a servlet response, which can be the requested MIDlet. The MIDlet may be returned as a JAR file and a JAD file, or as a file that can be directly executed on the target device. Alternatively, the servlet may return an access code, such as a URL, which can be accessed by the user to obtain the MIDlet.

Wizzle.

The wizzle 88 is a helper class that is linked to several other classes: the compiler 26; servlet 28; build tool 86; parser 70; generator 74; Java compiler 78; and packer 80. The wizzle 88 includes several public methods. A method DynaMIDWizzle() 236 is a class constructor. A method compile() 238 activates the library object responsible for compilation and preverification. A method generate() 240 activates the library object responsible for code generation for the MIDlet. A method archive() 242 activates the library object responsible for packing the generated MIDlet and other objects together in a JAR file. The method parse() 243 activates the library object responsible for parsing input.

Build Tool (Ant).

The build tool 86 provides a number of services and performs various tasks relating to library classes, for example, copying infrastructural files. A method DynaMI-DAnt() 244 is a class constructor. A method createProjectStructure() 246 creates the project's directory structure. A method compileProject() 248 activates the Java compiler 78. A method preverifyProject() 250 is responsible for activation of a preverify tool (not shown). A method archiveProject() 252 is responsible for activating the packer 80. The archive process of the project involves writing a manifest, activating the JAR tool (not shown) and writing the project JAD file. A method cleanupProject() 254 performs project clean-up and deletion of all temporary files, including Java sources, MIDML sources, Java classes and other resources. A method copyResource() 256 facilitates the task of copying resources, typically into a designated resource directory. A method copyInfraFiles() 258 copies infrastructure files that may be packaged in the project JAR file, for example files relating to screen navigation, or to servlet connection for the generated code request.

Factory.

Figure 10:
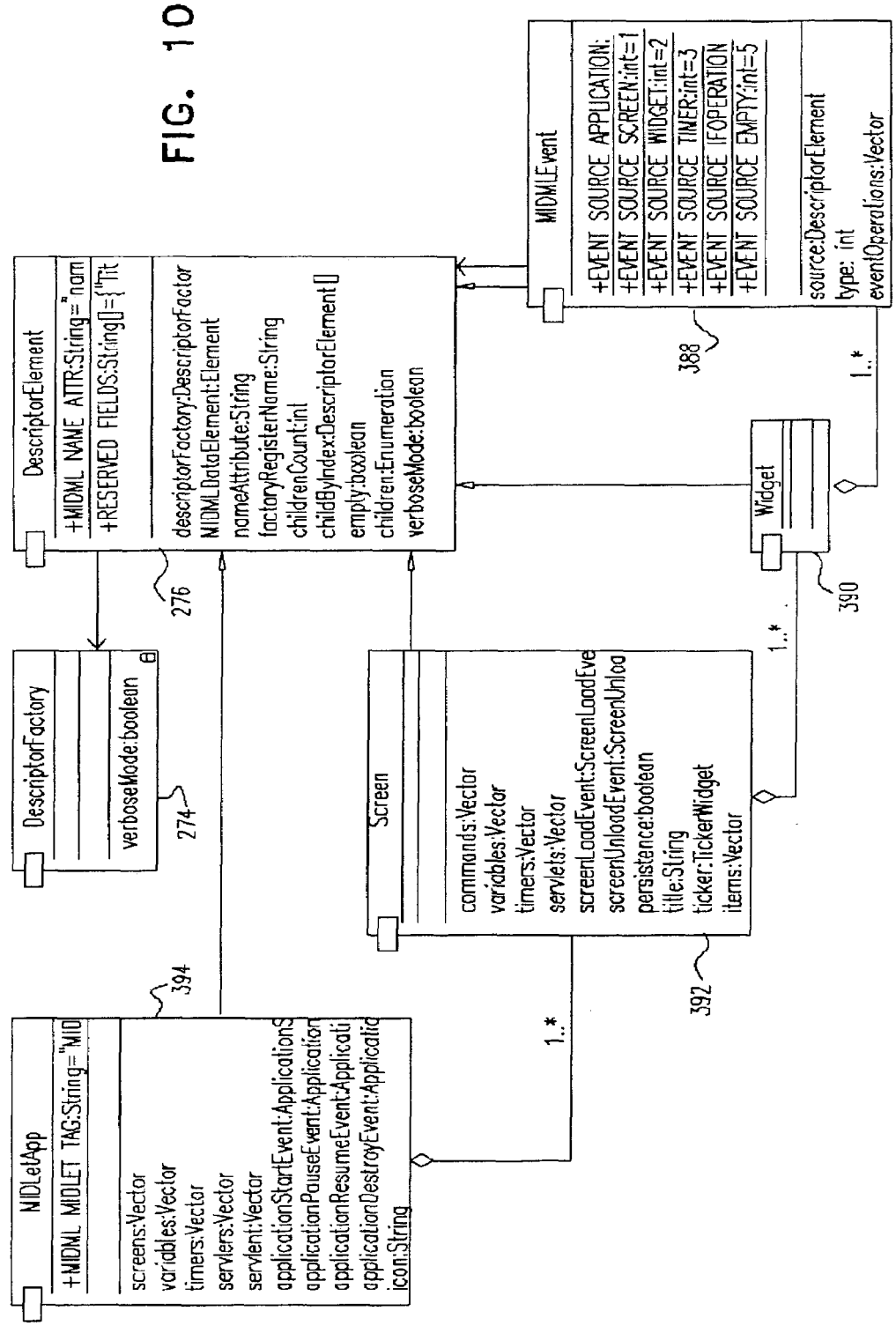
FIG. 10 is a class diagram of a descriptor object model shown in FIG. 3 in accordance with a disclosed embodiment of the invention.
Figure 11:
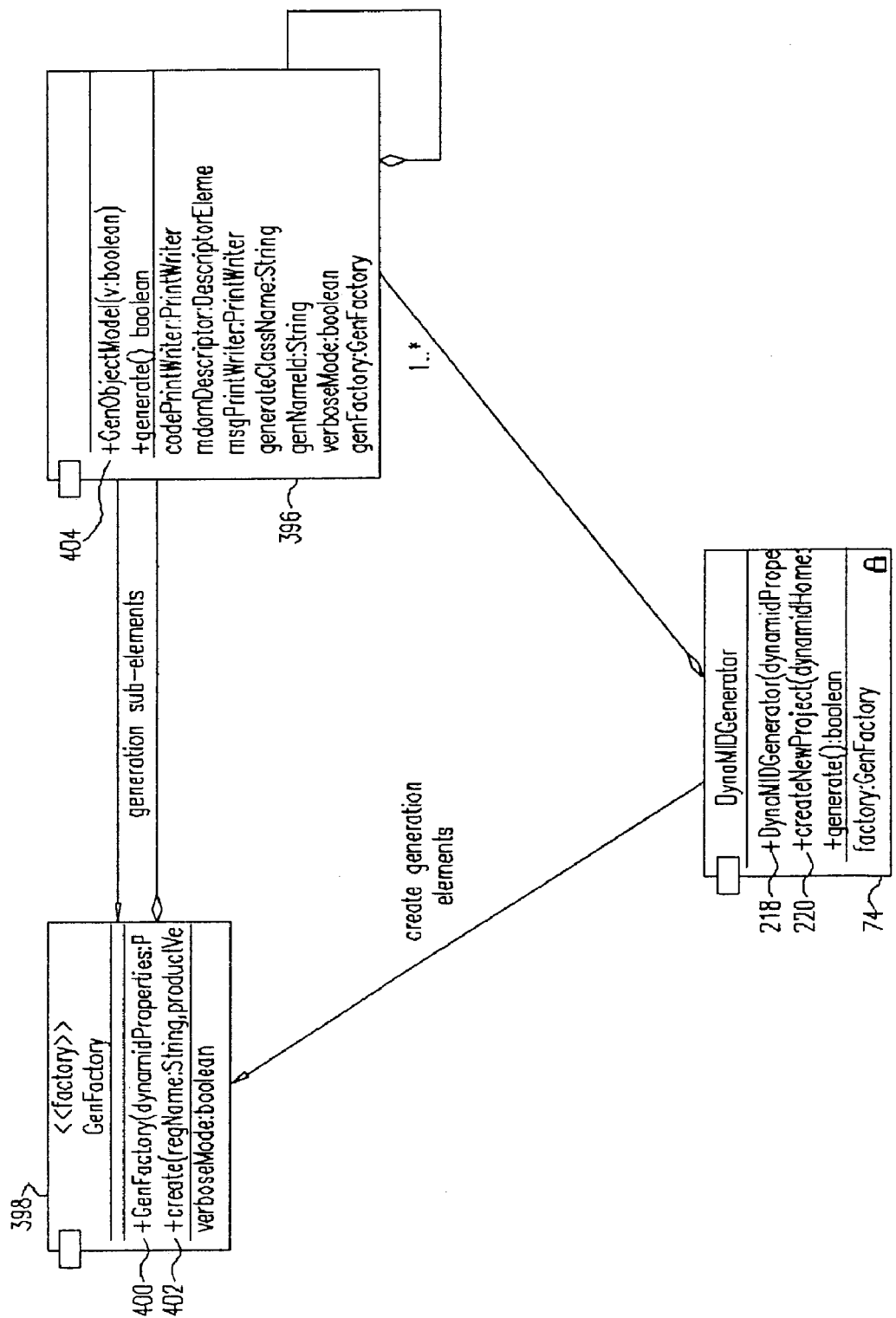
FIG. 11 is an object model class diagram showing the principal components of the working objects of a generator shown in FIG. 3 in accordance with a disclosed embodiment of the invention.
Figure 12A:
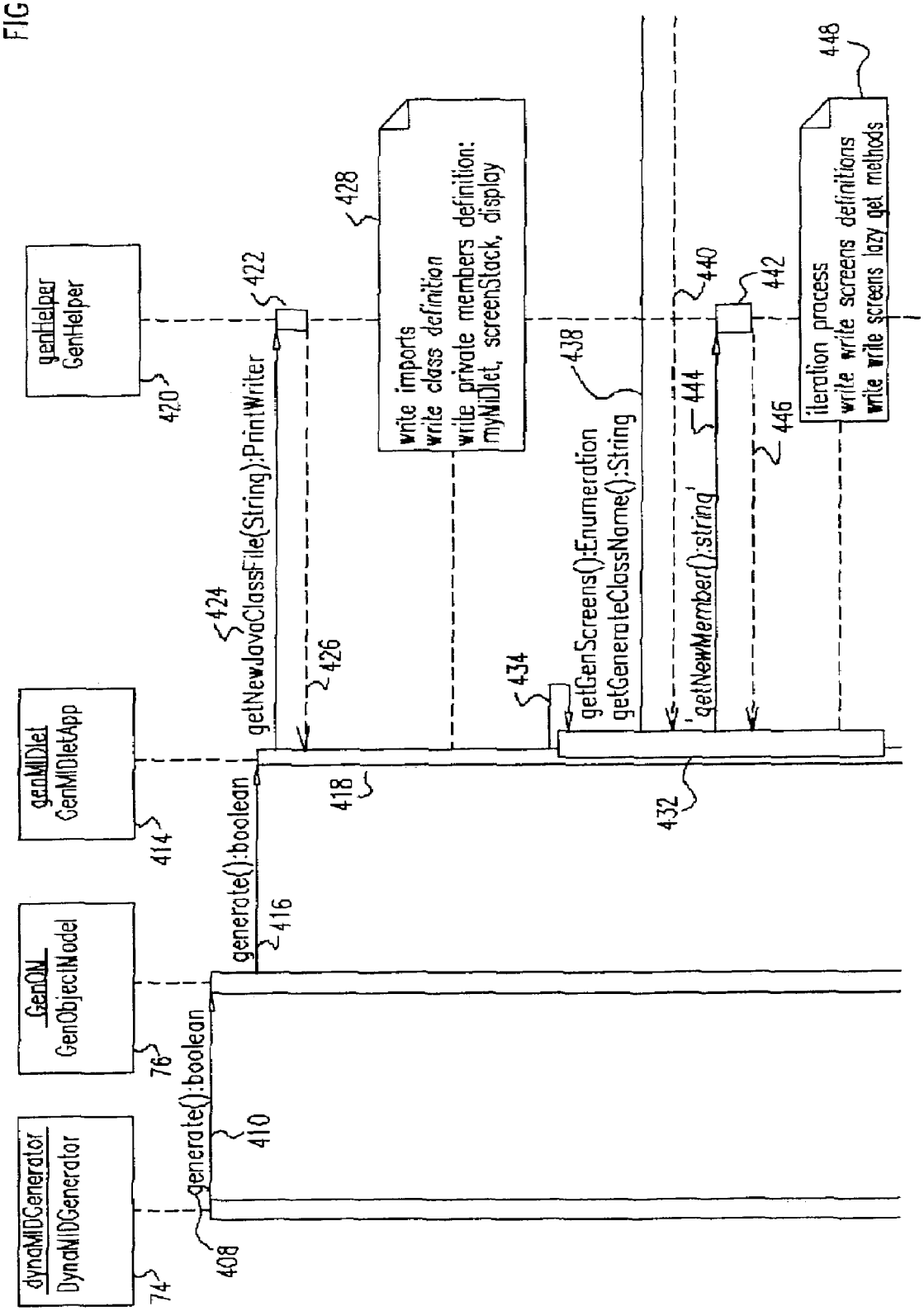
FIG. 12 and FIGS. 12AA-12GD, collectively referred to herein as FIG. 12, are respectively a small scale view of a sequence diagram of the operation of the generator illustrated in FIG. 11, and partial views thereof, wherein the small scale view indicates the positions of the parts shown in the partial views.
Figure 12A:
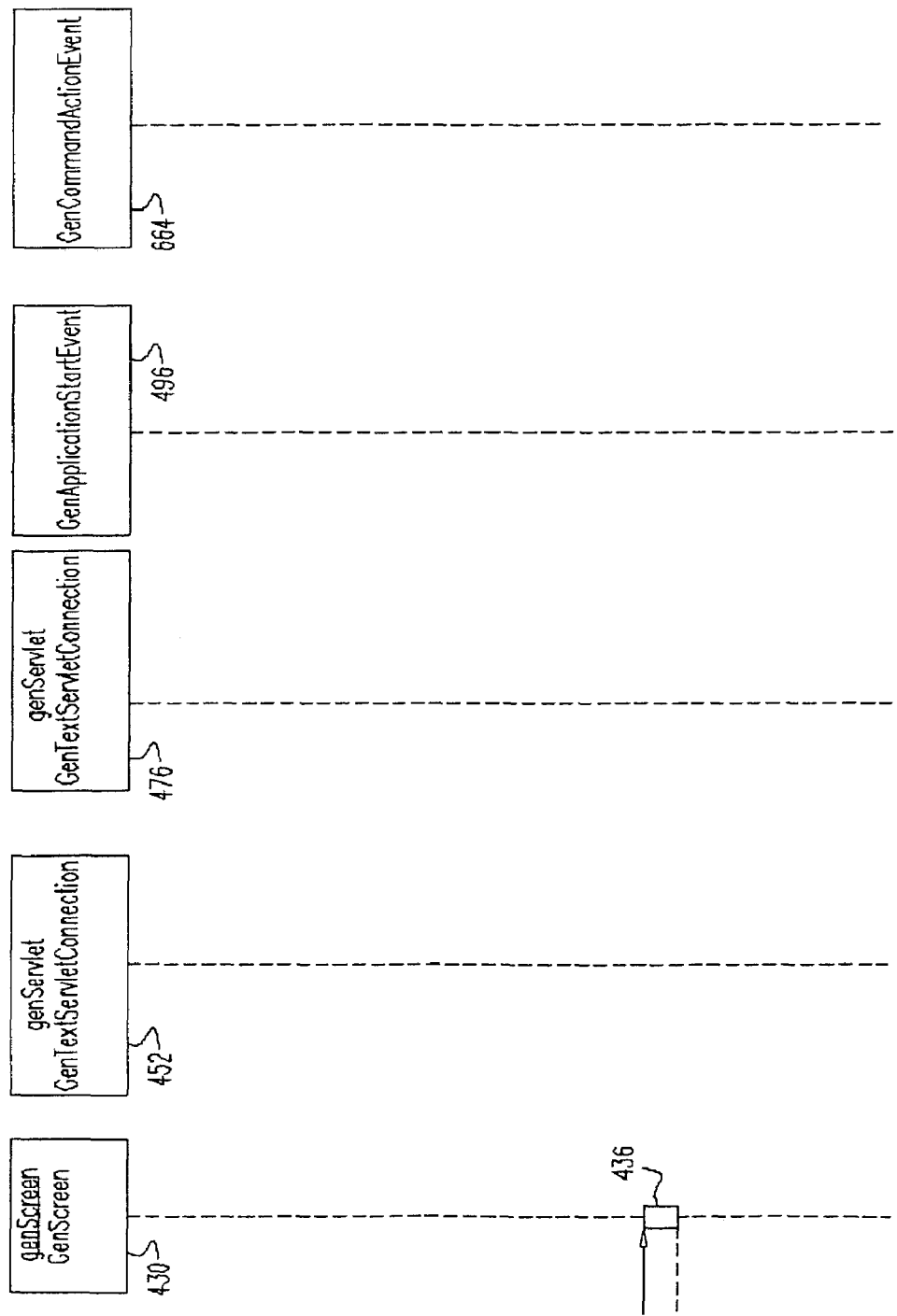
Figure 12B:
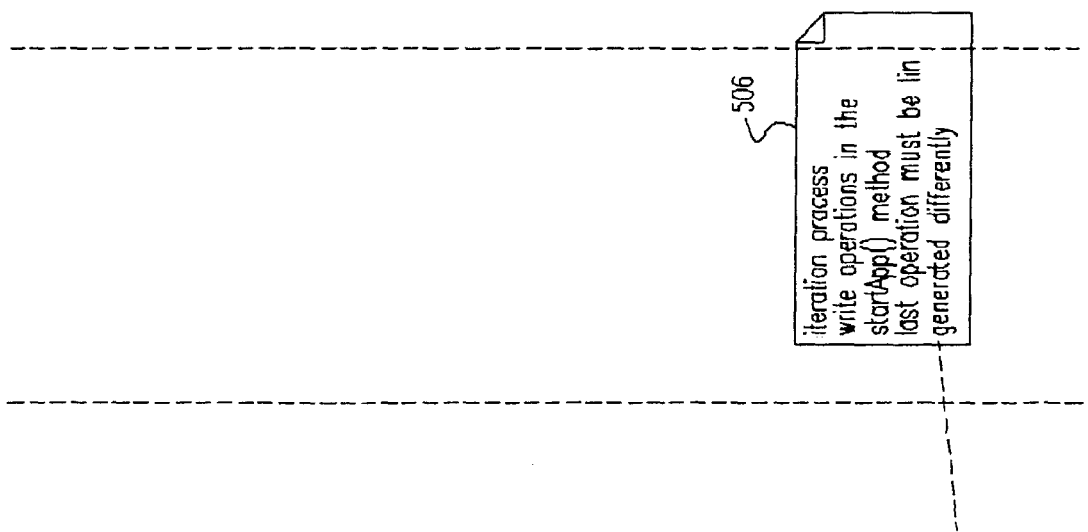
Figure 12C:
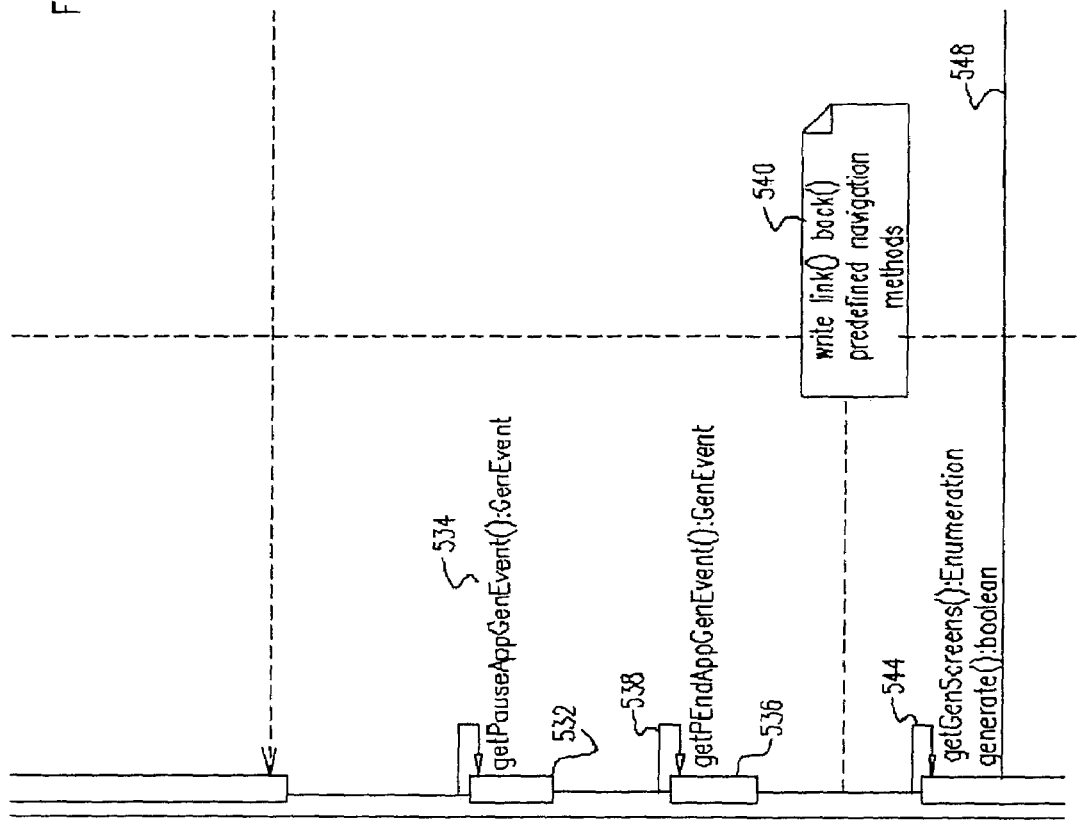
Figure 12C:
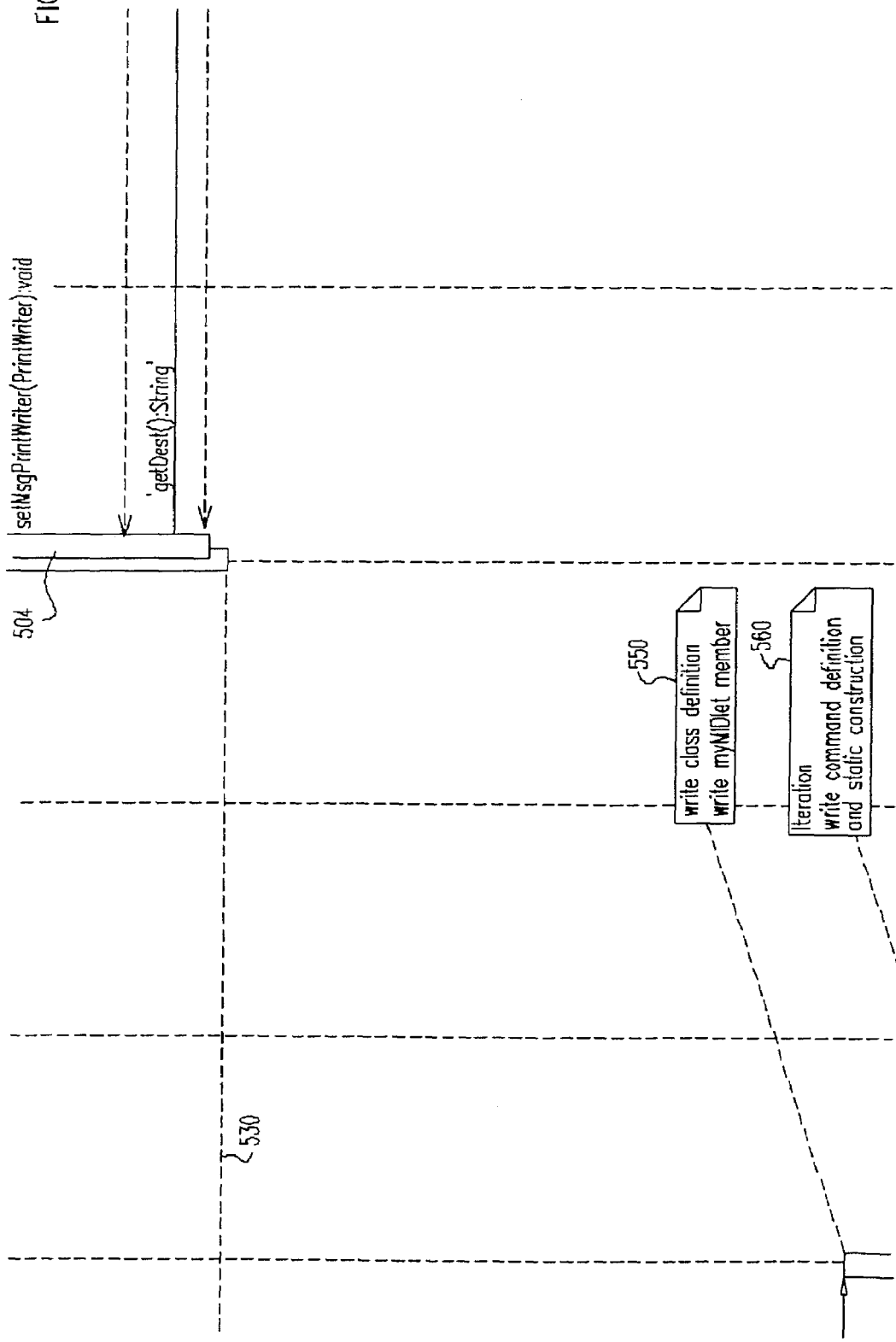
Figure 12C:
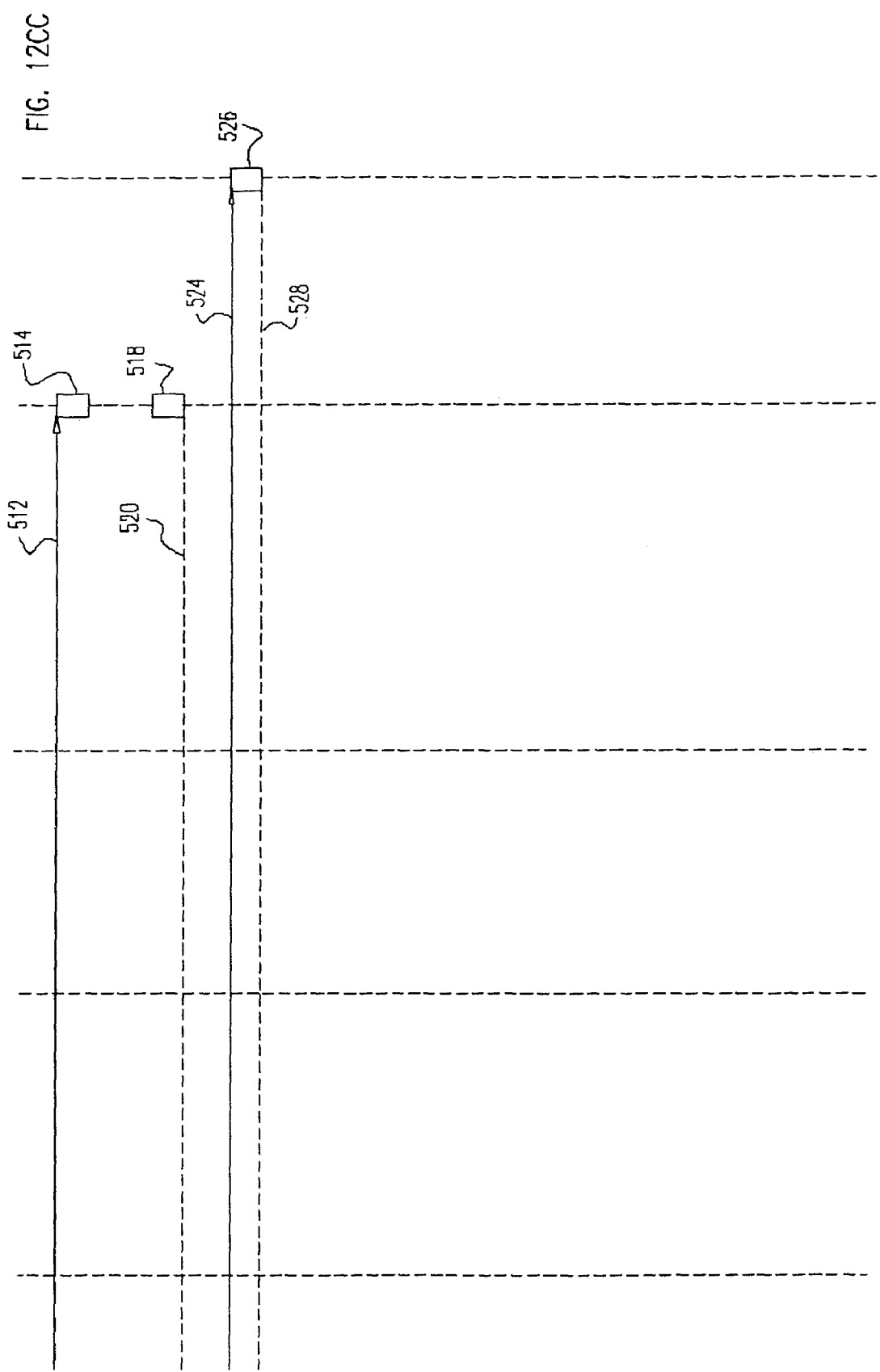
Figure 12D:
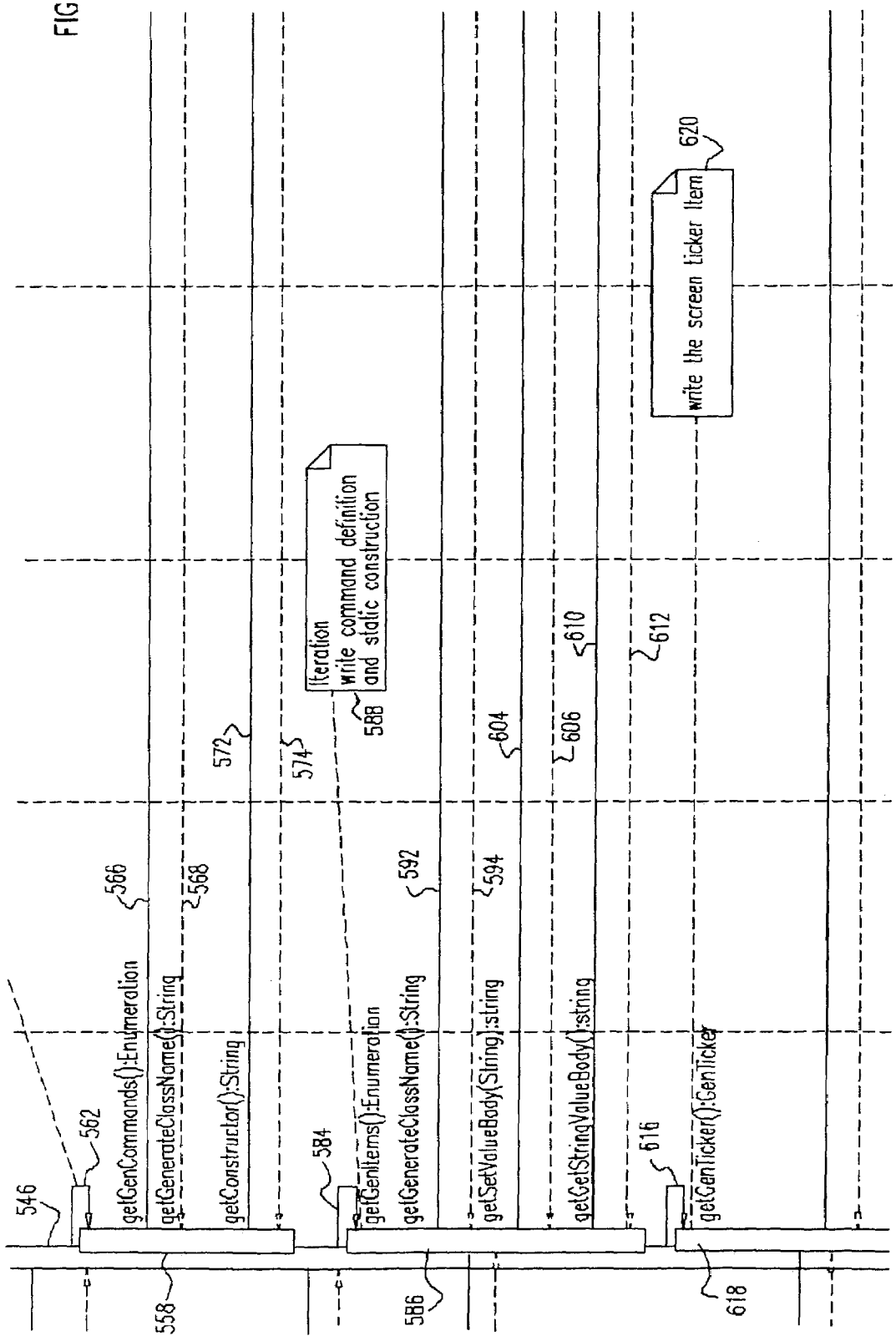
Figure 12D:
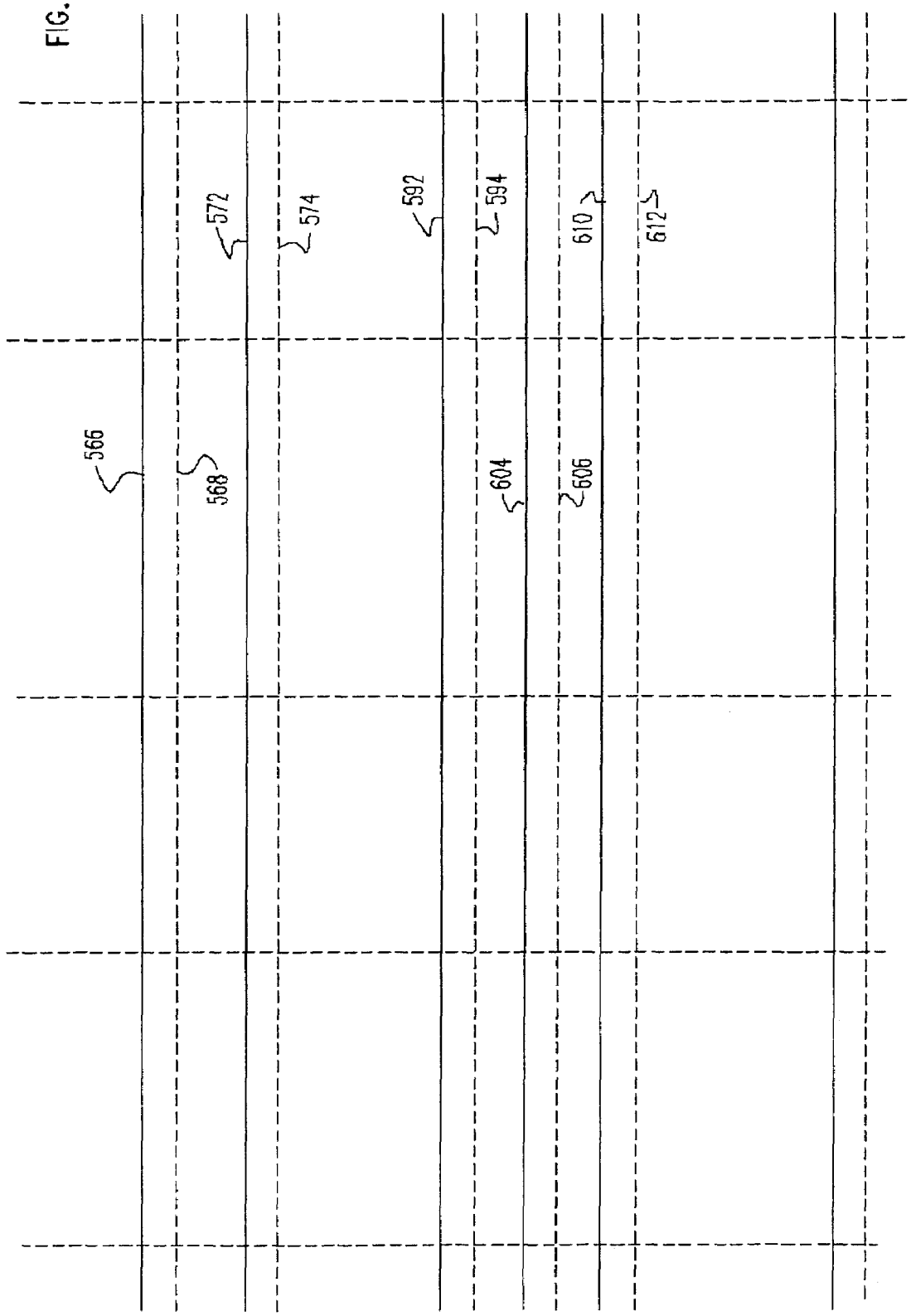
Figure 12E:
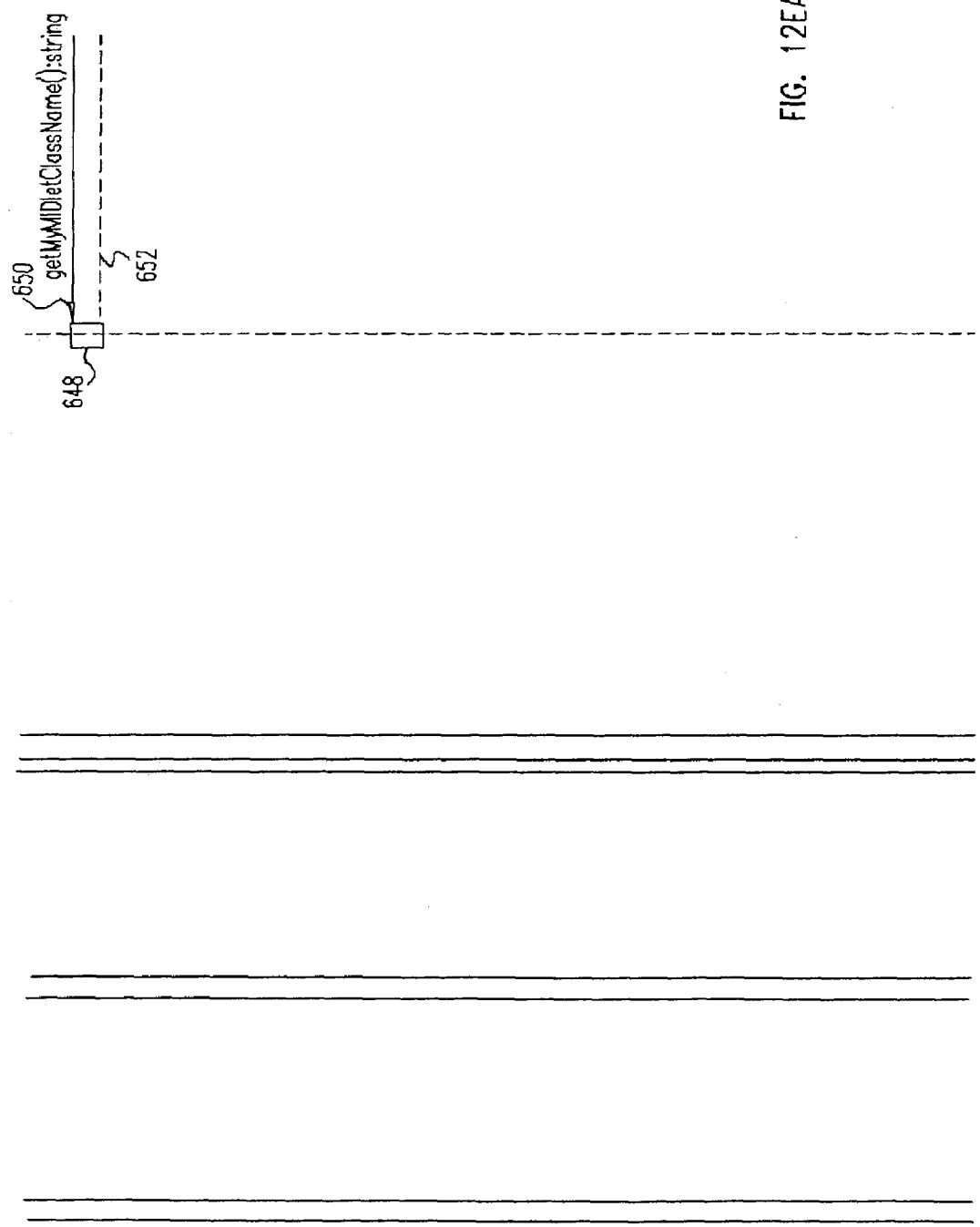
Figure 12E:
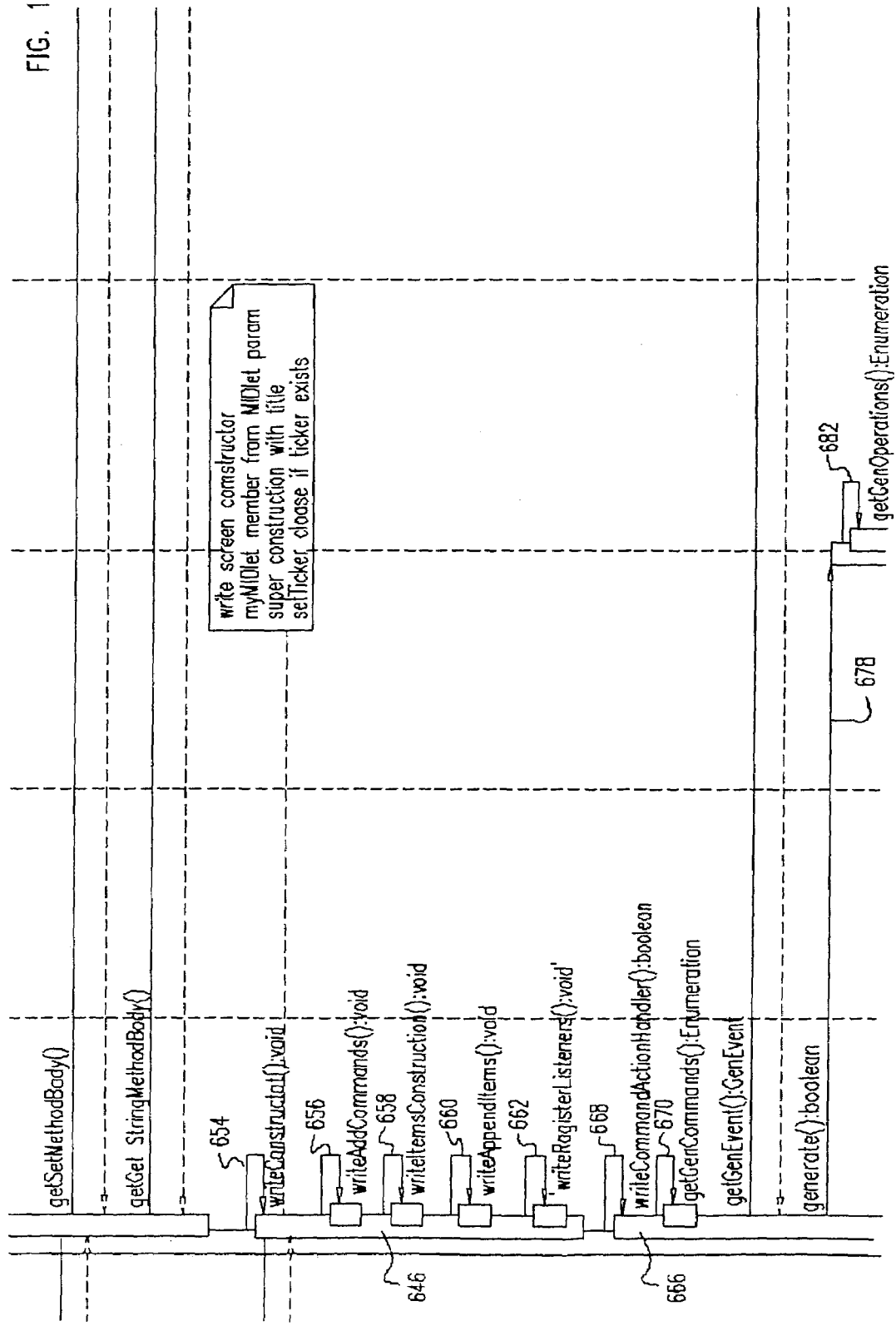
Figure 12E:
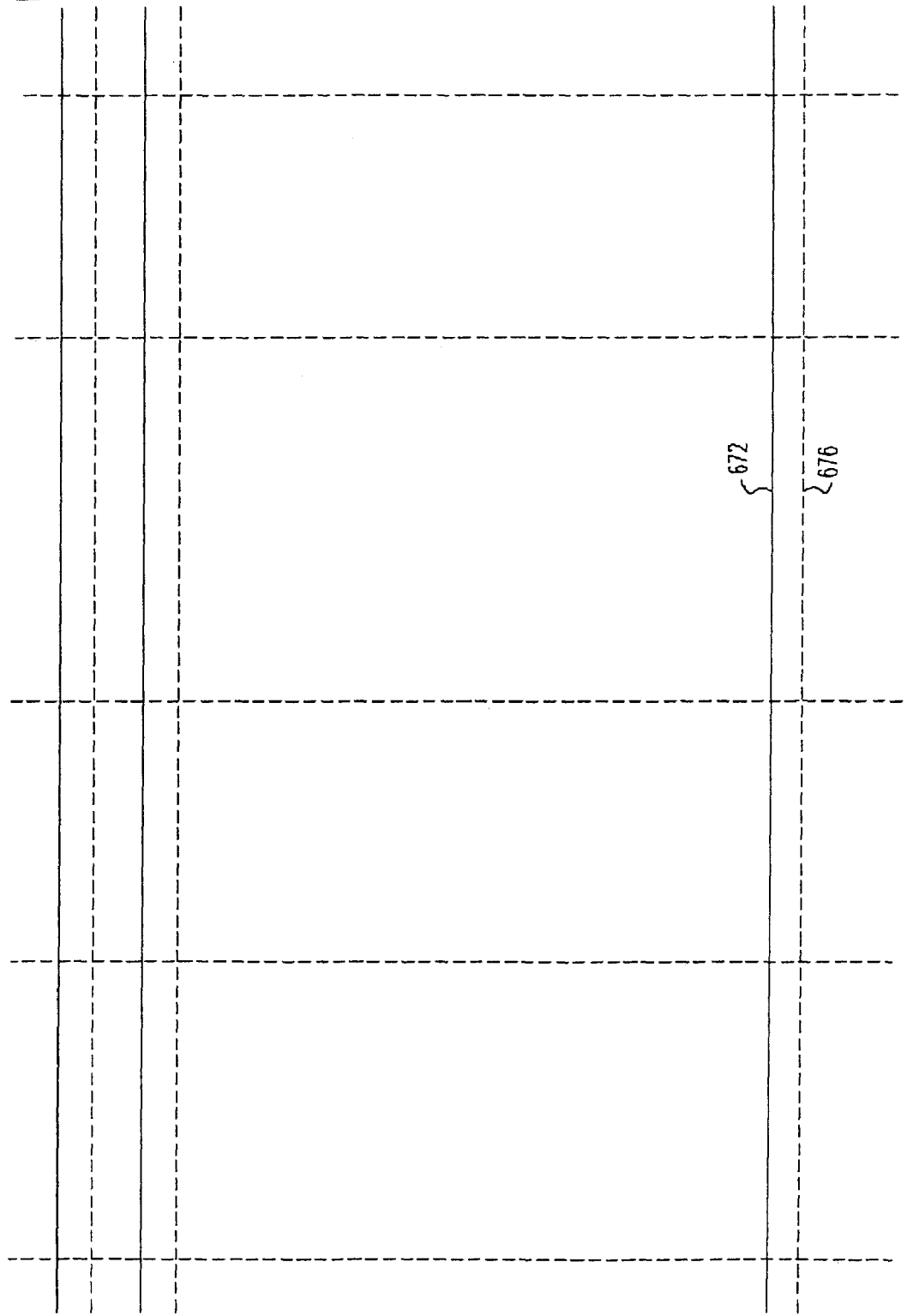
Figure 12E:
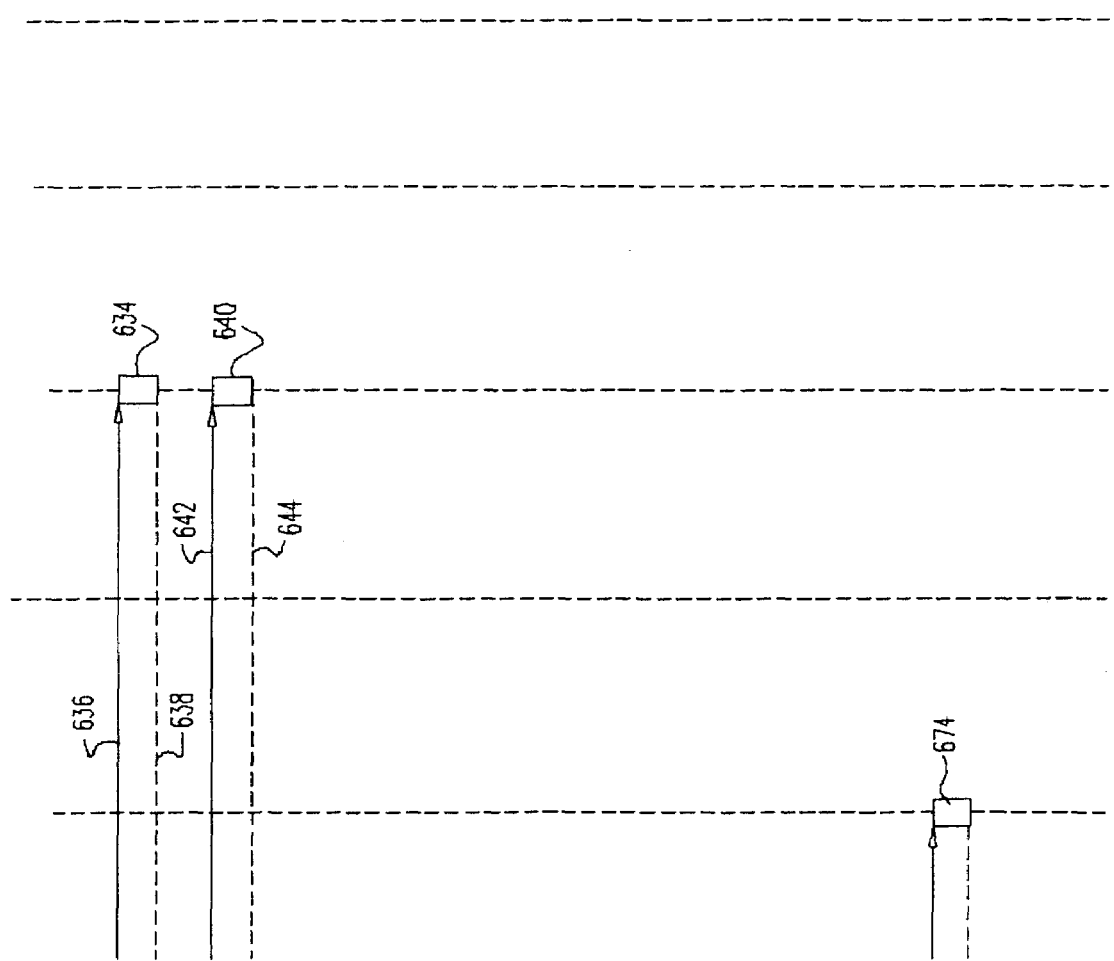
Figure 12F:
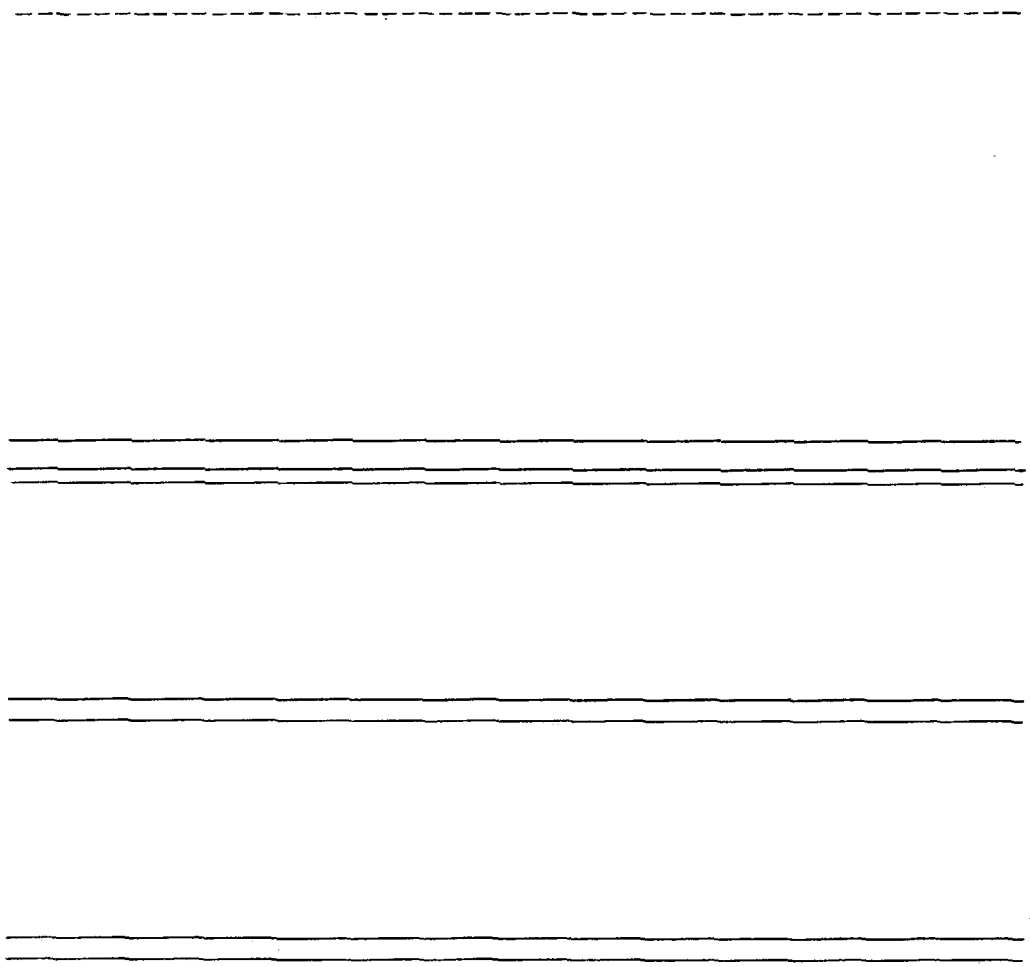
Figure 12F:
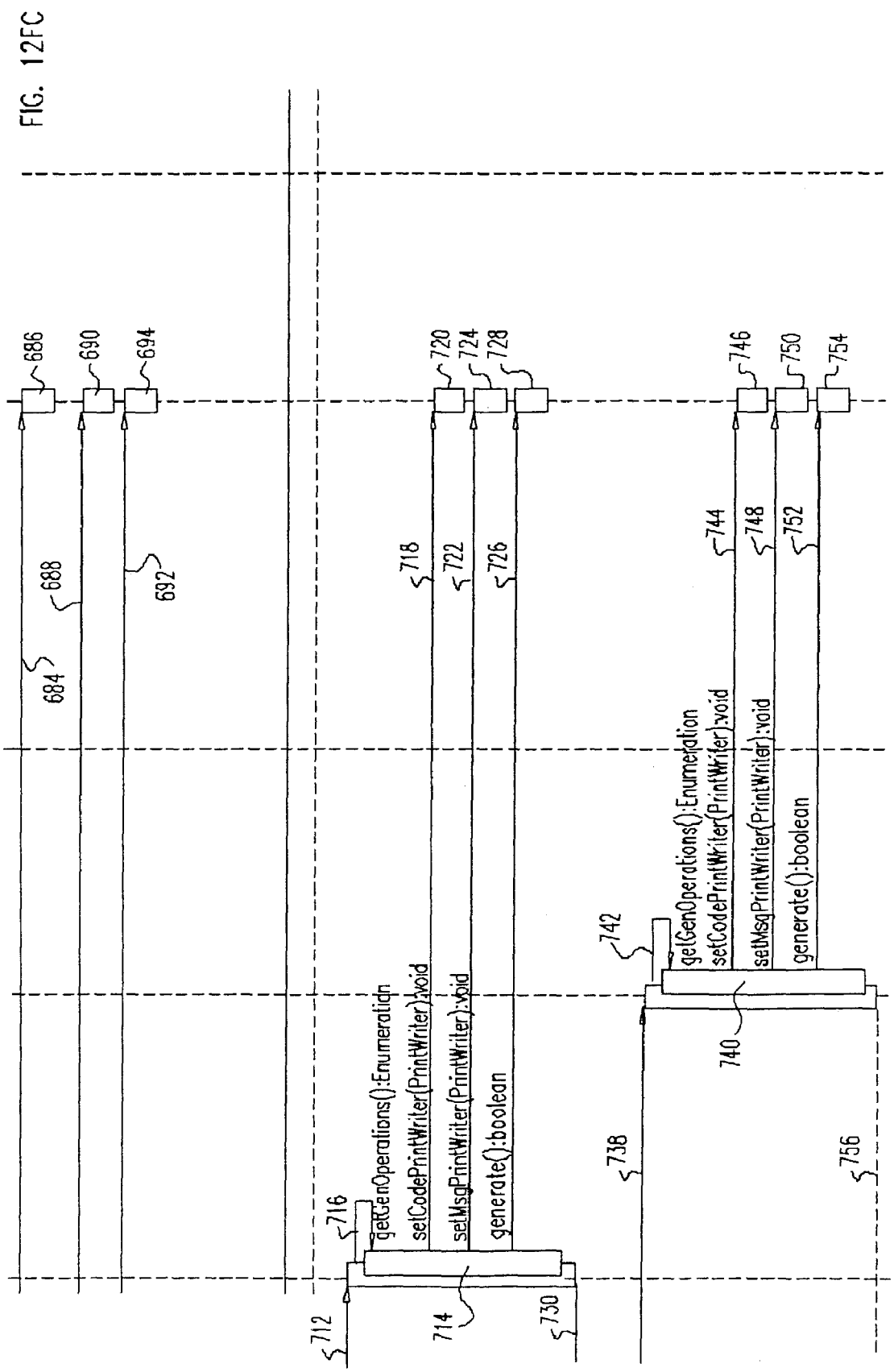
Figure 12F:
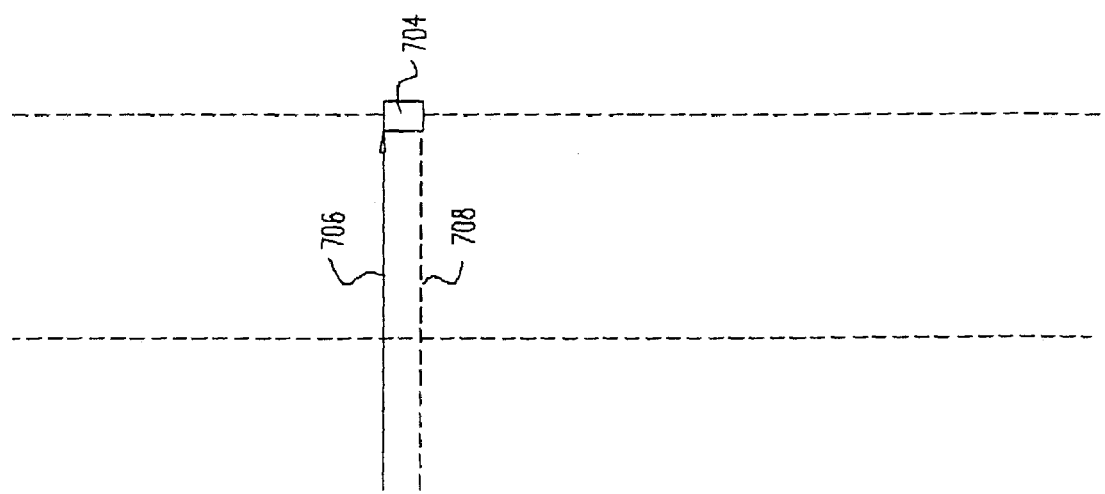
Figure 12G:
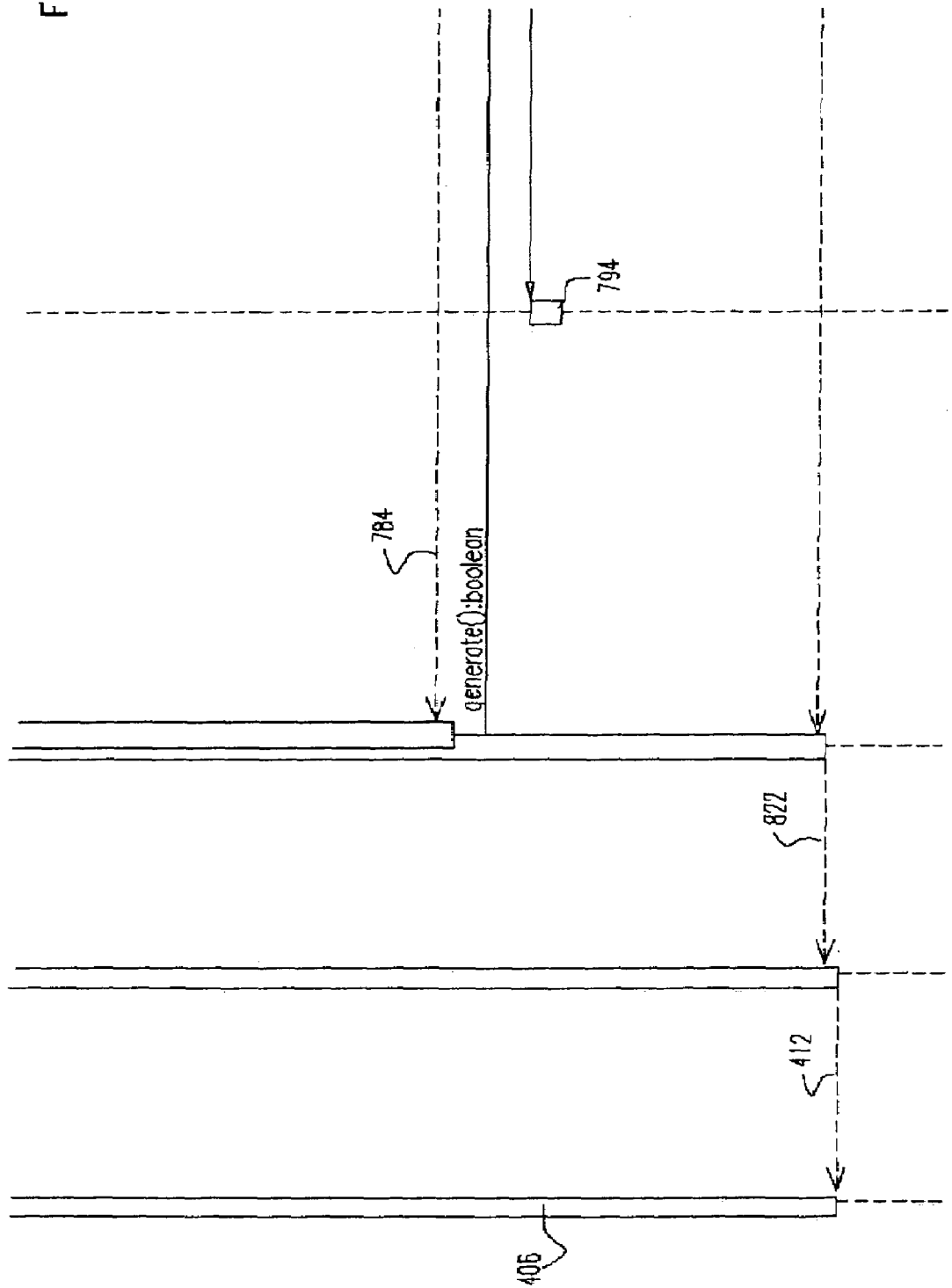
Figure 12G:
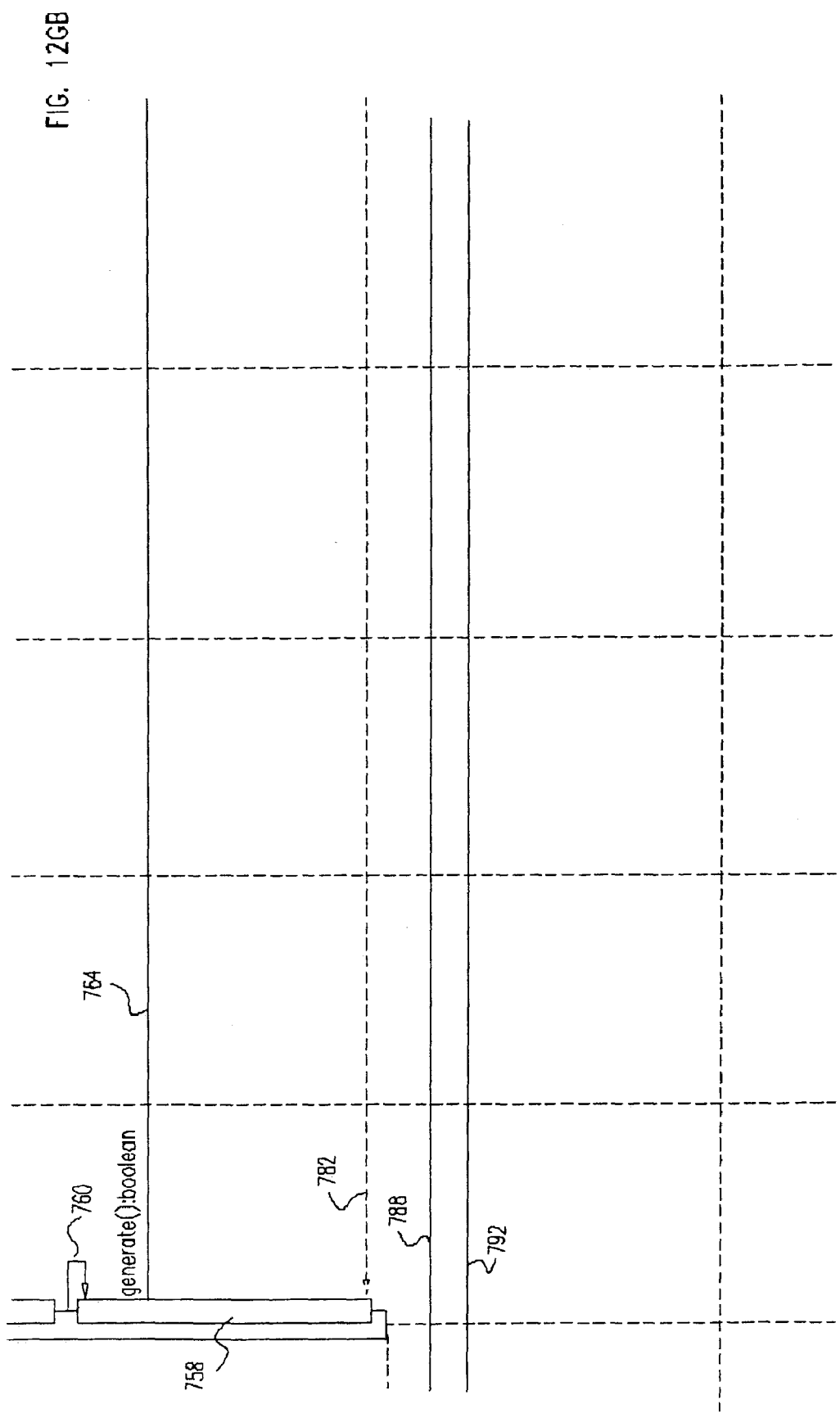

The factory class 92 is a basic infrastructural class that is used by two other classes, the descriptor element factory 274 (FIG. 10), and the generation object factory 398 (FIG. 11). A factory derived from the factory class 92 always produces a single product from a single base class.

A method DynaMIDFactory() 260 is a constructor for the factory class 92. A method register() 262 is used for registration of factory products. A method lookup() 264 checks for the existence of a key in the registration database, and if found, it returns a product class name. A method create() 266 is a safe creation function, which calls the method lookup() 264. The method create() 266 only returns registered product objects, which are also valid instances of the factory product base class. An unsafe creation method, createNoLookup() 268, executes without checking for valid instances of the factory product base class. It does not call the method lookup() 264. Another creation method, createVerboseConstructor() 270 is a private constructor, which enables logging of DescriptorElements. Verbosity of its mode of operation is specified by a parameter productVerboseMode.

Java Compiler.

The Java compiler 78 is linked with the build tool 86 and the wizzle 88. It includes a class constructor, which is the method DynaMIDCompiler() 158.

Logger.

The class PrivateLogger 90 has a method PrivateLogger() 272, which is a class constructor.

Library Operations.

Parser Classes.

Figure 8A:
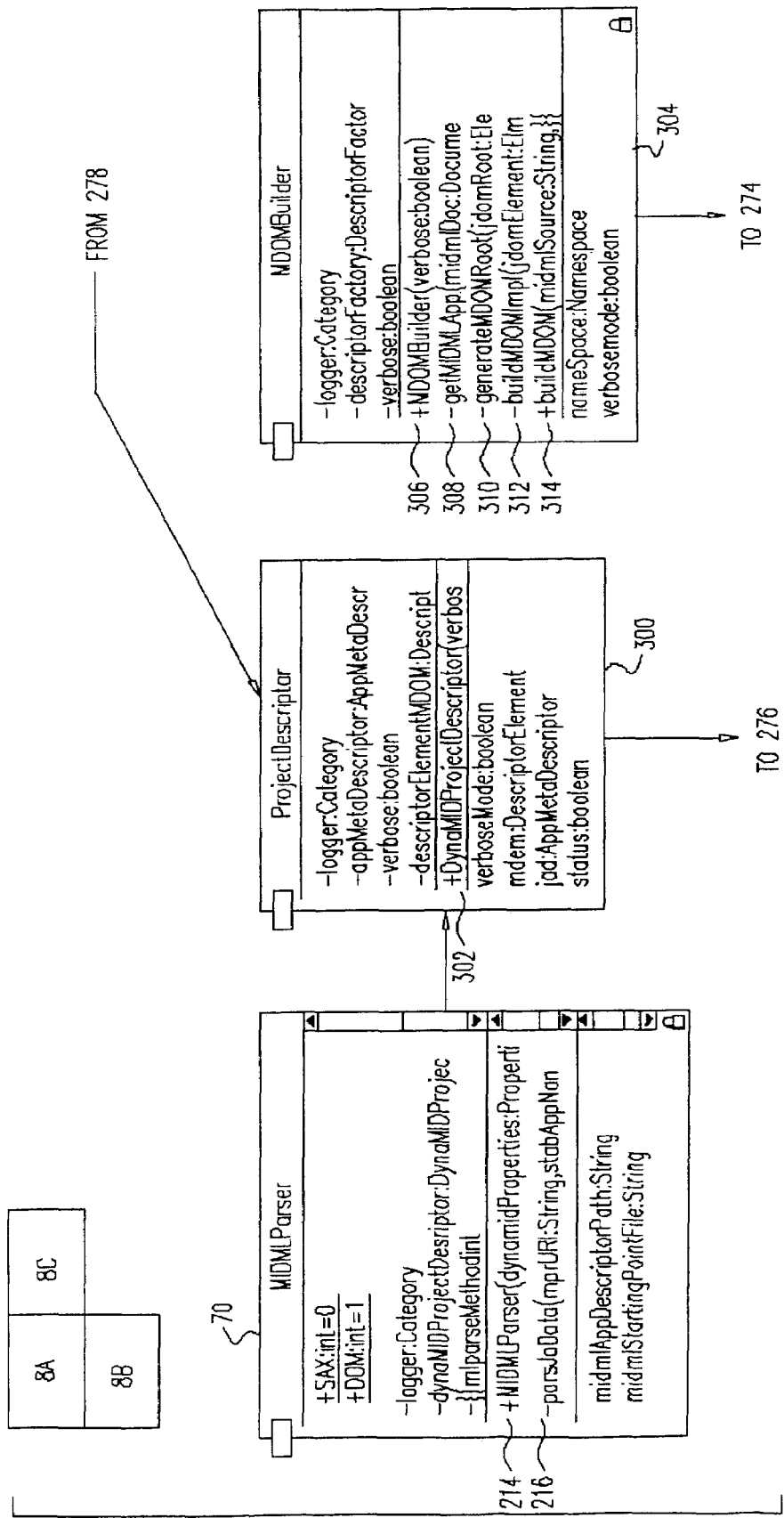
FIG. 8 is a class diagram of a parser shown in FIG. 3 in accordance with a disclosed embodiment of the invention.
Figure 8B:
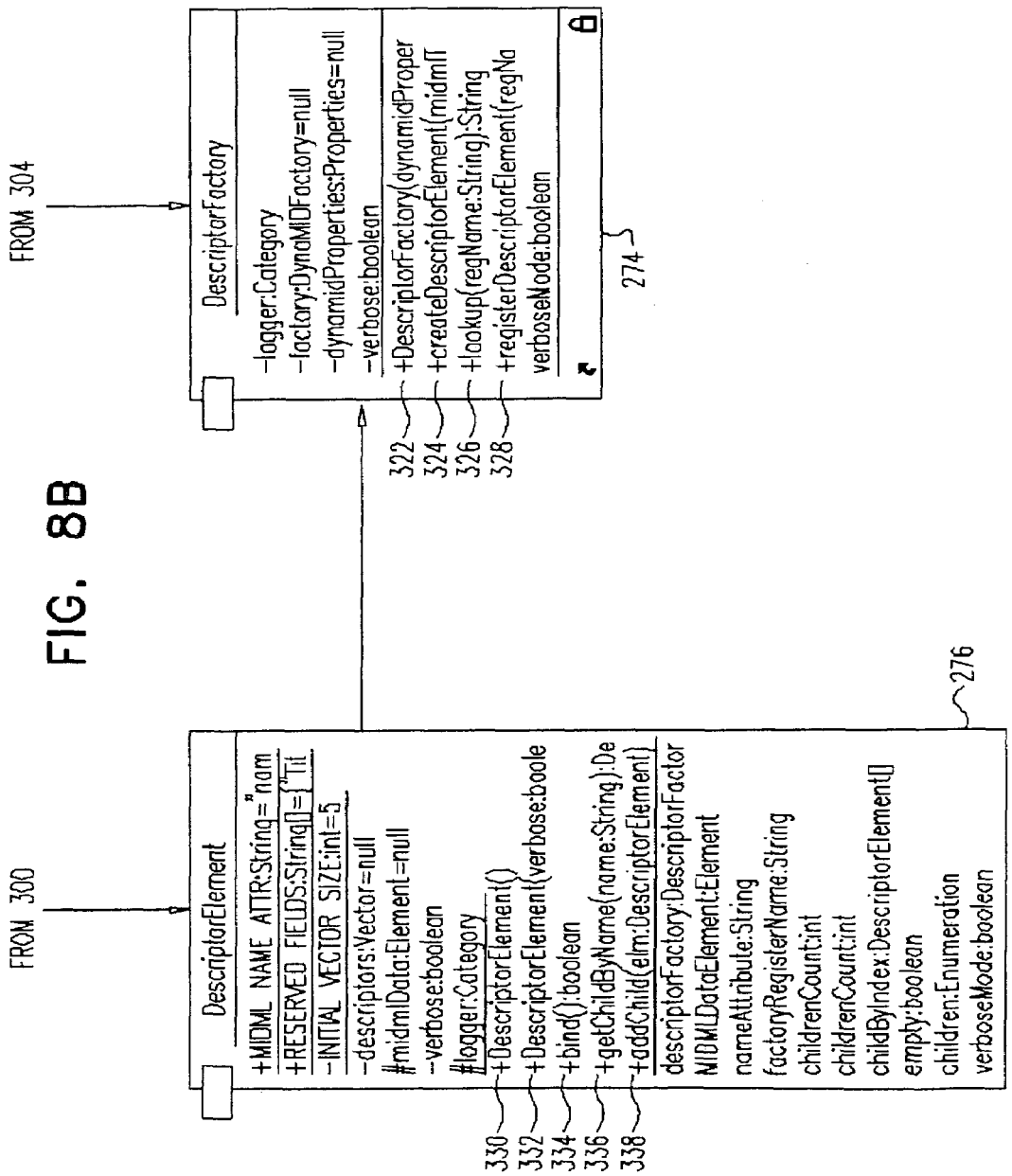
Figure 8C:
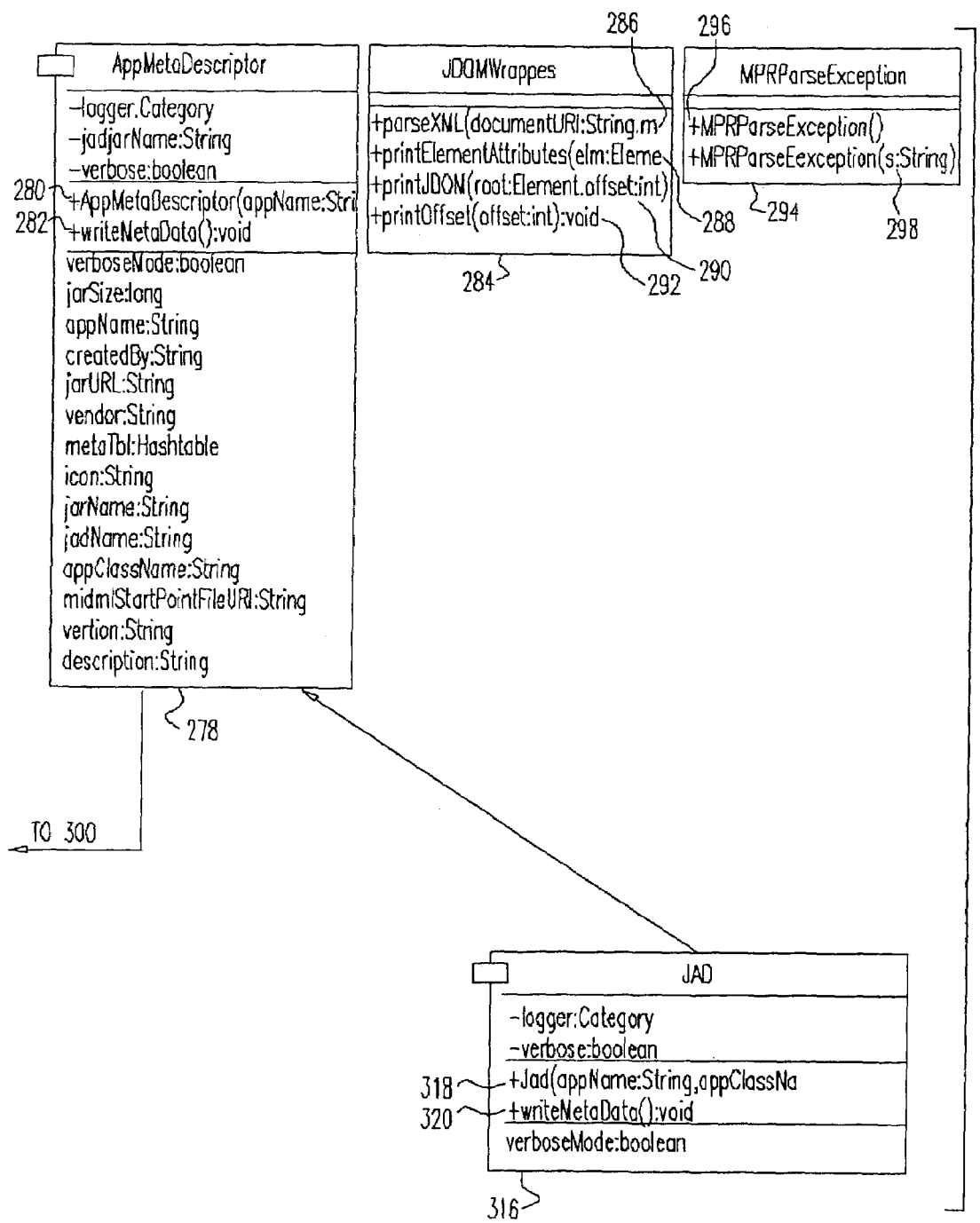

Reference is now made to FIG. 8, which is a class diagram of the parser 70 (FIG. 3), and its associated components. The disclosure of FIG. 8 should be read in conjunction with FIG. 3 and FIG. 4. A descriptor element factory 274, based on the Java factory design, associates a class DescriptorElement 276 with a name. The descriptor element factory 274 includes a mechanism that is used by the parser 70 for producing the class DescriptorElement 276. The class DescriptorElement 276 is the base class for all descriptor elements of the descriptor object model 212 (FIG. 3). Descriptor elements are the building blocks of a MIDML application. Generation of descriptor elements creates a composite tree structure, which is then prompted for Java source code generation.

A class DynaMIDProjectDescriptor 278 is a container for the descriptor object model 212 (FIG. 3), the main data structure used by the parser 70, and the JAD data object AppMetaDescriptor 210. The parser 70 is accessed using the above-noted Java document object model. The class DynamidProjectDescriptor 278 is the main association class between the parser 70, the generator 74, and the packer 80 (FIG. 4). The class DynamidProjectDescriptor 278 is responsible for maintaining the data as the operation of the system progresses, and for maintaining system progress status.

The methods of the class DynamidProjectDescriptor 278 include a method AppMetaDescriptor() 280. This is a class constructor, which constructs a class having default values. A method writeMetaData() 282 generates the metadata of the application descriptor.

A class JDOM wrapper 284 is a wrapper class for the schema interface responsible for facilitating XML parsing and validation. It includes a static parsing method parseXML() 286, and a static method printElementAttributes() 288, which prints the attributes of a JDOM element. A static method printJDOM() 290 recursively prints a JDOM tree. A method printOffset() 292 prints a JDOM tree offset.

A MIDML project parse exception class MPRParseException 294 is provided to deal with parsing errors. It includes a method MPRParseException() 296, which is a class constructor, and a method MPRParseException() 298 is thrown whenever an error occurs while parsing the MIDML project file.

A class ProjectDescriptor 300 is linked with the class DynamidProjectDescriptor 278. The class ProjectDescriptor 300 is the main association class between the parser 70, the generator 74 and the packer 80 (FIG. 4). The class ProjectDescriptor 300 is responsible for holding data and status information as the project progresses. The class ProjectDescriptor 300 is also linked to the class DescriptorElement 276. It has a method DynaMIDProjectDescriptor() 302, which is a class constructor.

A class MDOMBuilder 304 is used in some embodiments to build a MDOM tree, which is a composite tree structure of descriptor elements, using a pre-existing JDOM tree. The JDOM tree is used as a XML interface to the project MIDML code. The class MDOMBuilder 304 is linked with the descriptor element factory 274. The class MDOMBuilder 304 has a method MDOMBuilder() 306, which is a class constructor. The class MDOMBuilder 304 has a method getMIDMLApp() 308, which returns the name of the current MIDML application being generated. A method generateMDOMRoot() 310 generates a root for a MDOM tree. A method buildMDOMImpl() 312 adds JDOM elements to the MDOM tree. A method buildMDOM() 314 sets up internal links within the MDOM tree itself.

The class MDOMBuilder 304 can be implemented as a separate tool to create the MDOM tree. Listing 43 is a pseudocode fragment that discloses a recursive algorithm employed by the class MDOMBuilder 304. The input to the algorithm of Listing 43 is a valid pre-defined XML tree structure, which is traversed. Typically, this tree structure is the JDOM tree. However, other tree structures can be used. Indeed, the algorithm of Listing 43 may be generalized to any given valid XML tree structure, also known as a XML DOM. The XML DOM is a well-known data structure, and is further disclosed, for example, on the Internet at the URL www.w3c.org/xml.

In other embodiments the MDOM tree is constructed on-the-fly, by dynamically binding MIDML data during parsing of the MIDML source, and the class MDOMBuilder 304 is omitted.

A class JAD 316 extends the class DynamidProjectDescriptor 278, and produces a JAD implementation of an application descriptor. It has a method JAD() 318, which is a class constructor. A method writeMetaData() 320 generates the JAD file for the current MIDlet application.

The descriptor element factory 274 has a method DescriptorFactory() 322, which is a class constructor. The method DescriptorFactory() 322 registers products, which is derived from the class DescriptorElement 276. A method createDescriptorElement() 324 performs a lookup for a requested MIDML tag name, calling a method lookup() 326. If the method lookup() 326 is successful a new instance of the corresponding descriptor element is created. A method registerDescriptorElement() 328 actually performs the registration of the new descriptor element.

The class DescriptorElement 276 is linked to the class ProjectDescriptor 300. It has two methods DescriptorElement() 330, 332, which are alternative class constructors. A method bind() 334 is the main operational method for the class DescriptorElement 276. Each descriptor element of the descriptor object model 212 (FIG. 3) is capable of parsing itself from a pre-existing JDOM tree and of filling in its specific MIDML data. A method getChildByName() 336 returns the first child descriptor element of a current descriptor element having a specified name. If the requested element is not found, then the value null is returned. A method AddChild() 338 adds a new descriptor element to a parent-child vector, which is a container holding all descriptor elements at a lower level in the MDOM tree, which are derived from a higher level.

Parser Sequence.

Continuing to refer to FIG. 8, the descriptor element factory 274 is a specific single product class factory. It is instantiated with the class DescriptorElement 276. The class DescriptorElement 276 is the super class for all MIDML descriptors. This factory registers all native MIDML element tags. The registration assigns to each MIDML tag its corresponding DescriptorElement class. New extensible elements of MIDML register themselves in the descriptor element factory 274, a feature that allows the infrastructure 30 (FIG. 3) to be extended. Upon request of a MIDML tag, the descriptor element factory 274 factory may perform a lookup and return the requested descriptor element.

The MDOM iterative binding algorithm to MIDML source data (content) is disclosed as pseudocode in Listing 41. Each descriptor element is created from the descriptor element factory 274 using the current tag name. Each descriptor element is responsible for binding its private data, which resides in its MIDML tag definition. The descriptor element is also responsible for binding all of its MIDML sub-elements. The iterative binding algorithm is activated for each sub-element.

Figure 9:
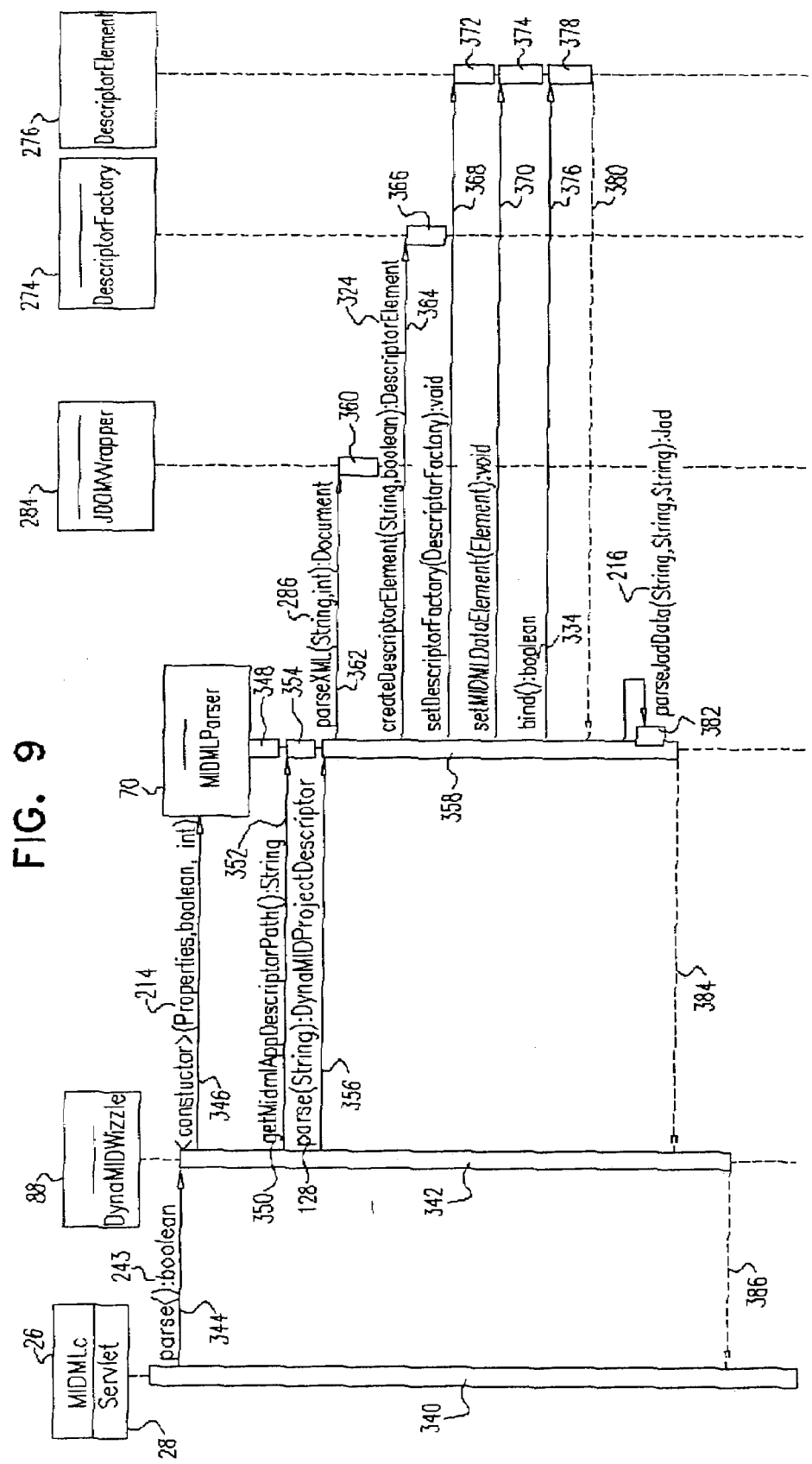
FIG. 9 is a sequence diagram showing the main process of the parser shown in FIG. 8 in accordance with a disclosed embodiment of the invention.

Reference is now made to FIG. 9, which is a sequence diagram showing the main process of the parser 70. The disclosure of FIG. 9 should be read in conjunction with FIG. 3, FIG. 4, and FIG. 8. In an activation 340, the compiler 26 and the servlet 28 set up the parser 70 with the aid of the wizzle 88. The wizzle 88 begins operation in an activation 342 upon receipt of a method invoking the method parse() 243 (FIG. 4) on a message line 344. The wizzle 88 then invokes method MIDMLParser() 214 (FIG. 4), the constructor of the parser 70 on a message line 346, producing an activation 348. The project starting-point is passed to the wizzle 88 as an input.

The parser 70 begins the parsing process by an invocation of a method getmidAppDescriptorPath() 350 by the wizzle 88 on a message line 352, which produces an activation 354. The method getmidAppDescriptorPath() 350 returns a string that contains the project descriptor file path. The parser 70 then receives an invocation of the method parse() 128 (FIG. 4) on a message line 356, to produce an activation 358.

In the activation 358, the class JDOM wrapper 284 is activated in an activation 360 by invocation of the method parseXML() 286 (FIG. 8) on a message line 362.

Next, the parser 70 commands the descriptor element factory 274 to create a descriptor element by invoking the method CreateDescriptorElement() 324 (FIG. 8) on a message line 364, which results in an activation 366. Next, the parser 70 sends commands resulting in the configuration and binding of the class DescriptorElement 276 on message lines 368, 370, which result in activations 372, 374, respectively. This operation culminates in an invocation of the method bind() 334 (FIG. 8) on a message line 376, which results in an activation 378. A completion indication is returned to the parser 70 from the class DescriptorElement 276 to the parser 70 on a message line 380.

In response to the information received from the class DescriptorElement 276, the parser parses JAD data during an activation 382 using the method parseJadData() 216 (FIG. 4). Upon completion of the parsing operation, the parser 70 transmits a message to the wizzle 88 on a message line 384. The wizzle 88 communicates a completion message to the compiler 26 on a message line 386.

MIDML Descriptor Object Model Classes.

Reference is now made to FIG. 10, which is a class diagram of the descriptor object model 212 (FIG. 3). The disclosure of FIG. 10 should be read in conjunction with FIG. 3, FIG. 6, and FIG. 8. The descriptor object model 212 is a tree oriented data structure, which is embodied in the class DescriptorElement 276 (FIG. 8). Descriptor elements are data objects, which bind to the MIDML language elements, creating a hierarchical description of the application structure. MDOM objects are the source for the code generation process for the MIDlet application 194 (FIG. 6). Classes that are used for the class DescriptorElement 276 include the class descriptor element factory 274 (FIG. 8), events 388, a widget 390, and a class screen 392.

A class MidletApp 394 is linked with the class DescriptorElement 276 and the class screen 392. The class screen 392 is linked with the widget 390 and the class DescriptorElement 276. The class DescriptorElement 276 is linked with the descriptor element factory 274, the widget 390, and the events 388. The operations and functions relating to the various classes illustrated in FIG. 10 are described in further detail in other sections hereof.

Generator Classes.

Reference is now made to FIG. 11, which is an object model class diagram showing the principal components of the working objects of the generator 74 (FIG. 3). When the generator 74 is set up, appropriate instances of a class GeneratorObjectModel 396 are created using a generation object factory 398. Factory functionality is extended in the design to define the generation object factory 398. This is a specific single product class factory. The generation object factory 398 is instantiated with the class GeneratorObjectModel 396. This is the super class for all source code-generating objects. Each code-generating object is needed in a well-defined time slot in the code generation process. Thus, code generation objects are constantly reused. The generation object factory 398 registers all native MIDML element tags, assigning each MIDML tag to its corresponding instance of the class GeneratorObjectModel 396. New elements of MIDML can register with the generation object factory 398. Upon a request represented by a MIDML tag, the generation object factory 398 may perform a lookup and return the requested descriptor element. Where a method is referred to herein with respect to different classes by the same name, it will be understood that it performs the same or an analogous function in all such classes.

The generation object factory 398 and the class GeneratorObjectModel 396 are interlinked with one another and with the generator 74.

Each generation object is a generator that is responsible for producing specific MIDML Java source code. The generation object factory 398 is flexible, and its benefits include efficient source code generation, support for extensions to the code generation capabilities of the system, and the capability of generic code generation. Generic code generation means that the entire class hierarchy of the generator object model is replaced with a new class hierarchy describing a different technology.

The generation object factory 398 has a method genFactory() 400, which is a class constructor. A method create() 402 is the principal creation method in the generation object factory 398. In operation, the method create() 402 initially determines if the requested object was previously created. If so, its reference is returned. If the requested object was not previously created, the generation object factory 398 creates a new object, providing that the name of the desired object was previously registered. The method create() 402 then saves a reference to the new object for future requests.

The class GeneratorObjectModel 396 has a method genObjectModel() 404, which is a class constructor.

Generator Sequence.

Reference is now made to FIG. 12, which is a sequence diagram of the operation of the generator 74 (FIG. 3). The disclosure of FIG. 12 should be read in conjunction with FIG. 2, FIG. 3, FIG. 4, FIG. 7, and FIG. 8. FIG. 12 shows the main process of the generator 74.

MIDlet generation assumes a valid MDOM tree as input. Source code generation is incremental and performed in a top-down manner, i.e., the main MIDlet class is generated before its screen or other entities. Generation begins with the descriptor MIDletApp, which is the MDOM root. Generation is a linear process: each step begins upon successful completion of a preceding step, as the steps are dependent. At each generation step the current descriptor element generates itself completely, and then proceeds to generate its independent child elements. The algorithm for the generation procedure is disclosed in pseudocode in Listing 42.

Each of the following entities produces a new class file for its code generation: the descriptor MIDletApp, screens, servlets, and timers. Servlets and timers may be precompiled or may be represented as common classes.

The generator 74 is created by the compiler 26 and servlet 28. In an activation 406, the generator 74 invokes a method generate() 408 on a message line 410. The code generation sequence starts here when the root generation object model 76 is created. The method generate() 408 is propagated throughout the object model in order to create all the code needed for a full MIDlet application. Initially the method generate() 408 causes creation of the workspace directories specified in a tag <Project-Dir>, and the processing of the project descriptor object 72 (FIG. 7). A result is eventually returned on a message line 412 as a Boolean status value. A successful result indicates the presence of generated Java source code files and resources on the disk.

In response to the message on the message line 410, the generation object model 76 (FIG. 3) is activated and propagates the method generate() 408 to a class GenMidletApp 414 on a message line 416. The class GenMidletApp 414 is a class that is responsible for generating the code for three application events that are mapped to the MIDlet abstract class: start, destroy and pause. These events are handled by the methods startApp, destroyApp, and pauseApp. The class GenMidletApp 414 is a root for further propagation of the method generate() 408.

In a series of activations 418 the class GenMidletApp 414 interacts with a class GenHelper 420, which is a helper class for the code generation task. The class GenHelper 420 facilitates sharing of objects among other classes that come into play during generation. Its specific responsibilities include rendering new member names, creating new Java source files, sharing the objects of the build tool 86 (FIG. 4) with the generator classes, and sharing the generated MIDlet class name.

Initially, in an activation 422, invocation of a method getNewJavaClassFile() 424 of the class GenHelper 420 returns a standard Java class PrintWriter for the Java source class file for the current project on a message line 426.

Next, as shown in a block 428, the class GenMidletApp 414, which hold the general MIDlet class definitions, performs a series of subtasks, which include writing the import clause, writing the class definition, writing certain definitions for private members, such as "myMIDlet", which is an automatically generated self-reference according to the MIDML specification. The reference myMIDlet is useful for MIDlet tasks, such as the tasks link() and back(), which are disclosed below in further detail. The class GenMidletApp 414 also writes the screenstack and the display routines.

The class GenMidletApp 414 interacts with a class GenScreen 430, which is the base class for a screen generation class hierarchy. The class GenScreen 430 facilitates the screen generation process and renders services to the underlying implementation derived classes. Each screen has a header and the interface implementation methods, onLoad and onUnload. The screens may contain timers, variables, servlet connections, commands, ticker items and a title. This interaction is iteratively invoked by the class GenMidletApp 414 on a line 434. This method returns an enumeration of the generated screens that comprise the current MIDlet. The class GenScreen 430 then undergoes an activation 436, when the method getGenerateClassName() is invoked by the class GenMidletApp 414 on a message line 438. The generated MIDlet class name is returned by the class GenScreen 430 to the class GenMidletApp 414 on a message line 440.

Next, an activation 442 of the class GenHelper 420 is initiated by the class GenMidletApp 414, which invokes a method getNewMember() on a message line 444. This method returns an automatically generated member name on a message line 446 for use during generation. Thus, string members may be returned by the names string1, string2, etc.

Next, as shown in a block 448, using an iteration process, the class GenMidletApp 414, performs a series of subtasks related to the screens. Screen definitions and screen lazy get methods are written.

Next, the class GenMidletApp 414 iteratively invokes a method getGenServletConnections(), as shown on a line 450. This method is responsible for generating an appropriate servlet connection member. It is an aspect of the invention that the class that actually implements the servlet connection is precompiled, and need not to be generated. This begins an interaction with a class GenTextServletConnection 452, which implements a text protocol for code generation of the method GenServletConnection. The interaction begins in a sub-activation 454. The class GenTextServletConnection 452 undergoes an activation 456 in response to a message from the class GenMidletApp 414 on a message line 458, and returns a result on a message line 460. In the current embodiment a reference to the servlet and all relevant parameters needed to access the are actually generated.

Next, the class GenMidletApp 414 initiates another activation 462 of the class GenHelper 420 by invoking the method getNewMember() on a message line 464. A new member is returned to the class GenMidletApp 414 on a message line 466. All the screens, timers, servlets are represented as members during translation from MIDML source to source code. Such members are provided by the class GenHelper 420.

Next, the class GenMidletApp 414 initiates another activation 468 of the class GenTextServletConnection 452 by invoking a method getURL() on a message line 470. This method returns the URL of a current servlet from the class GenTextServletConnection 452 to the class GenMidletApp 414 on a message line 472.

Next, as shown in block 474, using an iterative process, the class GenMidletApp 414 performs a series of subtasks related to the servlet. Servlet definitions and lazy servlet get methods are written.

The class GenMidletApp 414 now interacts with a class genTimer 476, which generates event handlers, and in particular is responsible for generating the appropriate code to handle the onTime event. A method getGenTimers() is iteratively invoked by the class GenMidletApp 414 on a line 478 in a sub-activation 480. The method getGenTimers() returns an enumeration of the timers that are defined in the MIDML file for the project.

The interaction between the class GenMidletApp 414 and the class genTimer 476 begins when a method generate() is invoked by the class GenMidletApp 414 on a message line 482. An activation 484 is initiated in the class genTimer 476, and a result is returned from the class genTimer 476 to the class GenMidletApp 414 on a message line 486.

Next, the class GenMidletApp 414 initiates another activation 488 of the class GenHelper 420 by invoking the method getNewMember() on a message line 490. A new member is returned to the class GenMidletApp 414 on a message line 492.

Next, as shown in block 494, using an iterative process, the class GenMidletApp 414, performs a series of subtasks related to the timers. Timer definitions and timer lazy get methods are written.

The class GenMidletApp 414 now interacts with a class genApplicationStartEvent 496. This class is responsible for the generation of code for handling the startApp() method of a generated MIDlet descriptor element class, and deals with all operations that are defined in the startApp MIDML tag. An example of a startApp MIDML tag is found, for example in Listing 38.

Interaction between the class GenMidletApp 414 and the class genApplicationStartEvent 496 is initiated in a sub-activation 498 in which the class GenMidletApp 414 iteratively invokes the method getStartAppGenEvent() on line 500. The method getStartAppGenEvent() creates an event GenApplicationStartEvent that returns a method ApplicationStartEvent(). The method ApplicationStartEvent() creates an event for a descriptor element.

A call to the method generate() on a message line 502 by the class GenMidletApp 414 initiates an activation 504 of the class genApplicationStartEvent 496.

As shown in a block 506, during the activation 504 the class genApplicationStartEvent 496 executes an iterative process, which includes write operations of the standard MIDP-1.0 startApp() method, which is invoked when a MIDlet enters an active state. An iterative invocation of a method getGenOperations() on a line 508 causes a series of activations of a base class GenOperation 510. The class GenOperation 510 generates code for elements, which correspond to operations that occur during run time. An enumeration of objects relating to DescriptorElements of the project is returned by the method getGenOperations().

First, a method setCodePrintWriter() is invoked by the class genApplicationStartEvent 496 on a message line 512 to initiate an activation 514 of the class GenOperation 510. The method setCodePrintWriter() sets the Java print writer of a generated element to create an object stream to which generated Java code is written.

Next, the method generate() is invoked by the class genApplicationStartEvent 496 on a message line 516 to initiate an activation 518 of the class GenOperation 510, which produces actual code generation. A result is returned from the class GenOperation 510 to the class genApplicationStartEvent 496 on a message line 520.

Next, the class genApplicationStartEvent 496 interacts with a class genLink 522. The class genLink 522 implements a MIDML link operation, which is the navigation operation of MIDML. The class genApplicationStartEvent 496 invokes a method getDest() on a message line 524 to initiate an activation 526 of the class genLink 522. The method getDest() returns the destination Screen name of a link on a message line 528 from the class genLink 522 to the class genApplicationStartEvent 496. A completion message is then returned by the class genApplicationStartEvent 496 to the class GenMidletApp 414 on a message line 530.

The class GenMidletApp 414 now initiates the generation of code for the pauseApp() method of a generated MIDlet class, which takes place in a sub-activation 532. The class GenMidletApp 414 iteratively invokes a method getPauseAppGenEvent() on a line 534. The method getPauseAppGenEvent() creates an event GenApplicationPauseEvent that returns a method ApplicationPauseEvent(). The method ApplicationPauseEvent() creates an event for a descriptor element. The operation is the same as for the method startApp() disclosed hereinabove, except for a difference in the initial screen link. The details are not repeated in the interest of brevity.

The class GenMidletApp 414 now initiates the generation of code for the destroyApp() method of a generated MIDlet class, which takes place in a sub-activation 536. The class GenMidletApp 414 iteratively invokes a method getEndAppGenEvent() on a line 538. The method getEndAppGenEvent() creates an event GenApplicationDestroyEvent that returns a method ApplicationDestroyEvent(). The method ApplicationDestroyEvent() creates an event for a descriptor element. The operation is the same as for the method startApp() disclosed hereinabove, except for a difference in the initial screen link. As above, the details are not repeated in the interest of brevity.

Next, as shown in a block 540, the class GenMidletApp 414 writes two predefined navigation methods. A method link() enables application flow from one MIDML Screen to another. A method back() enables flow among MIDML screens in a reverse direction.

The class GenMidletApp 414 again interacts with the class GenScreen 430 in a sub-activation 542, which is begun by another iterative invocation of the method GetGenScreens() on a line 544. An activation 546 of the class GenScreen 430 is initiated by an invocation of the method generate() on a message line 548. As shown in a block 550, the class GenScreen 430 writes a class definition and a myMidlet member.

The class GenScreen 430 now invokes a method getNewJavaClassFile(), requesting the name of the name for a Java source class file from the class GenHelper 420 on a message line 552. The method getNewJavaClassFile() returns a Java PrintWriter on a message line 554 directed to the source class file, which is located in the project directory. The method getNewJavaClassFile() is invoked iteratively, as each screen requires its own Java source class file.

The class GenScreen 430 now interacts with a class GenCommand 556 in a sub-activation 558. As shown in a block 560, command definitions and static constructors are iteratively written by the class GenScreen 430. The class GenCommand 556 is responsible for generating source code for a command. The interaction begins by the iterative invocation of a method getGenCommands() by the class GenScreen 430 on a line 562. The method getGenCommands() returns an enumeration of the commands defined in the current screen.

Next, the class GenScreen 430 initiates an activation 564 of the class GenCommand 556 by invoking a method getGenerateClassName() on a message line 566. The method getGenerateClassName() returns a string containing the name of the class being generated on a message line 568.

Next, the class GenScreen 430 initiates an activation 570 of the class GenCommand 556 by invoking a method getConstructor() on a message line 572. The method getConstructor() returns a String representing a constructor call statement on a message line 574.

The class GenScreen 430 now invokes the method getNewMember() to initiate an activation 576 of the class GenHelper 420 on a message line 578. Upon receipt of a response on a message line 580, an interaction occurs between the class GenScreen 430 and an abstract class genMIDPItem 582. The class genMIDPItem 582 is the abstract superclass for all MIDP originated Items, for example the items StringItem, ImageItem. All MIDP item generators inherit from this class.

The interaction begins when a method GetGenItems() is iteratively invoked by the class GenScreen 430 on line 584 in a sub-activation 586. The method GetGenItems() returns an enumeration of servlet connections corresponding to the items defined for the current screen in the project MIDML file. In an iterative process, the class GenScreen 430 writes item definitions and get/set methods, as shown in a block 588.

Next, the class GenScreen 430 initiates an activation 590 of the class genMIDPItem 582 by invoking a method getGenerateClassName() on a message line 592. The method getGenerateClassName() returns a string containing the name of the class being generated on a message line 594.

The class GenScreen 430 again invokes the method getNewMember() to initiate an activation 596 of the class GenHelper 420 on a message line 598. Upon receipt of a response on a message line 600, the class GenScreen 430 initiates an activation 602 of the class genMIDPItem 582 by invoking a method getSetValueBody() on a message line 604. The method getSetValueBody() returns the get and set methods of a user interface object on a message line 606, and is additionally responsible for generating the body of the set method.

Next, the class GenScreen 430 initiates an activation 608 of the class genMIDPItem 582 by invoking a method getGetStringValueBody() on a message line 610. The method getGetStringValueBody() returns the get and set methods of a user interface object on a message line 612, and is additionally responsible for generating the string identifying the get method.

An interaction now occurs between the class GenScreen 430 and a class Genticker 614, which is responsible for generating code for a ticker object. The interaction begins when a method GetGenTicker() is iteratively invoked by the class GenScreen 430 on a line 616 in a sub-activation 618. The method GetGenTicker() returns the ticker that is defined for the current screen in the project MIDML file. As shown in block 620, the class GenScreen 430 writes the screen ticker item.

Next, the class GenScreen 430 initiates an activation 622 of the class Genticker 614 by invoking a method getGenTicker() on a message line 624. The method getGenTicker() returns the ticker definitions string from the class Genticker 614 to the class GenScreen 430 on a message line 626. The ticker definitions string is then written to the screen class file.

The class GenScreen 430 again invokes the method getNewMember() to initiate an activation 628 of the class GenHelper 420 on a message line 630. Upon receipt of a response on a message line 632, the class GenScreen 430 initiates an activation 634 of the class Genticker 614 by invoking the method getSetMethodBody() on a message line 636. The method getSetMethodBody() returns on a message line 638.

Next, the class GenScreen 430 initiates an activation 640 of the class Genticker 614 by invoking the method getGetStringMethodBody() on a message line 642. The method getGetStringMethodBody() is responsible in generating the string that is returned by the method getSetMethodBody(). The method getGetStringMethodBody() returns its result on a message line 644.

Next, the class GenScreen 430 undergoes a series of operations in a sub-activation 646. The class GenScreen 430 initiates an activation 648 of the class GenHelper 420 by invoking a method getMyMIDletClassName() on a message line 650. The method getMyMIDletClassName() returns a generated MIDlet class name. This name is shared by all generator classes that need a reference to the MIDlet. The result is returned on a message line 652.

Next, in the sub-activation 646, the class GenScreen 430 iteratively invokes a method writeConstructor() on a line 654, which produces a constructor for the current screen. Then, a method writeAddCommands() is iteratively invoked on a line 656, which generates add MIDP widget commands, for example a button, which is used to encapsulate an action. Next, a method writeItemsConstruction() is iteratively invoked on a line 658, which generates constructors for individual items in the current screen.

Next, a method writeAppendItems() is iteratively invoked on a line 660 by the class GenScreen 430. The method writeAppendItems() generates append items. The method writeAppendItems() writes the Java code that actually adds an item to a MIDP form screen. MIDP Form screens are disclosed in the above-noted Mobile Information Device Profile (JSR-37), JCP Specification.

Next, a method writeRegisteredListeners() is iteratively invoked in a line 662 by the class GenScreen 430. The method writeRegisteredListeners() generates a "set listeners call", an operation that sets the current screen to listen to action events resulting from commands issued through its own widgets, and to item state events arising from items related to the screen.

The class GenScreen 430 now interacts again with the class GenCommand 556 and with a class genCommandActionEvent 664 in a sub-activation 666. The class genCommandActionEvent 664 is responsible for generating code for MIDP command action events. The sub-activation 666 begins with an iterative invocation of a method writeCommandActionHandler() on a line 668. The method writeCommandActionHandler() generates a command action method for the current screen, and returns a Boolean status.

Next, the method getGenCommands() is invoked on a line 670. Then, interaction with the class GenCommand 556 begins with an invocation of a method getGenEvent() on a message line 672. The method getGenEvent() retrieves an event associated with the current screen. In response, the class GenCommand 556 undergoes an activation 674. The event is returned from the class GenCommand 556 to the class GenScreen 430 on a message line 676.

Interaction with the class genCommandActionEvent 664 now begins by an invocation by the class GenScreen 430 of the method generate() on a message line 678, resulting in an activation 680 of the class genCommandActionEvent 664. During the activation 680, a command action event is retrieved for each command relating to the current screen. Operational code is generated for the command's action method.

The activation 680 begins with an iterative invocation of the method getGenOperations() on a line 682. Now a series of interactions occurs between the class genCommandActionEvent 664 and the class GenOperation 510. First the method setMsgPrintWriter() is invoked by the class genCommandActionEvent 664 on a message line 684, resulting in an activation 686 of the class GenOperation 510.

Next, the method setCodePrintWriter() is invoked by the class genCommandActionEvent 664 on a message line 688, resulting in an activation 690 of the class GenOperation 510.

Next, the method generate() is invoked by the class genCommandActionEvent 664 on a message line 692, resulting in an activation 694 of the class GenOperation 510. Then, the final result of the activation 680 is returned from the class genCommandActionEvent 664 to the class GenScreen 430 on a message line 696.

The class GenScreen 430 now initiates a sub-activation 698 by iteratively invoking a method writeItemStateChangedHandler() on a line 700. The method writeItemStateChangedHandler() generates code for a method that handles a change in the state of an item of the current screen, the ItemStateChanged() method. Next the method getGenItems() is iteratively invoked on a line 702.

Now the class GenScreen 430 initiates an activation 704 of the class genMIDPItem 582 by invoking the method getGenEvent() on a message line 706. The result is returned on a message line 708.

The class GenScreen 430 interacts with a class genItemStateChangedEvent 710. The class genItemStateChangedEvent 710 is responsible for the generation of event handling code relating to changes in an item's state, (ItemStateChanged events). In the interaction, the state events for each item are identified, and the code for a corresponding event-handling operation is generated. Invocation of the method generate() on a message line 712 by the class GenScreen 430 results in an activation 714 of the class genItemStateChangedEvent 710. The activation 714 begins with an iterative invocation of the method getGenOperations() on a line 716.

The class genItemStateChangedEvent 710 now interacts with the class GenOperation 510. The interaction begins when the method setMsgPrintWriter() is invoked by the class genItemStateChangedEvent 710 on a message line 718. The class GenOperation 510 then undergoes an activation 720. Next the class genItemStateChangedEvent 710 invokes the method setCodePrintWriter() on a message line 722 to produce an activation 724 of the class GenOperation 510. The class genItemStateChangedEvent 710 then invokes the method generate() on a message line 726 to produce an activation 728 of the class GenOperation 510, which results in actual code generation. A result is then returned by the class genItemStateChangedEvent 710 to the class GenScreen 430 on a message line 730.

The class GenScreen 430 now initiates a sub-activation 732 by iteratively writing event handler code for the onLoad event of each screen, as indicated by a line 734. The class GenScreen 430 interacts with a class genScreenLoadEvent 736. In this interaction, the state events for each item are identified, and the code for a corresponding onLoad event-handling operation is generated. Invocation of the method generate() on a message line 738 by the class GenScreen 430 results in an activation 740 of the class genScreenLoadEvent 736. The activation 740 begins with an iterative invocation of the method getGenOperations() on a line 742.

The class genScreenLoadEvent 736 now interacts with the class GenOperation 510. The interaction begins when the method setMsgPrintWriter() is invoked by the class genScreenLoadEvent 736 on a message line 744. The class GenOperation 510 then undergoes an activation 746. Next the class genScreenLoadEvent 736 invokes the method setCodePrintWriter() on a message line 748 to produce an activation 750 of the class GenOperation 510. The class genscreenloadevent 736 then invokes the method generate() on a message line 752 to produce an activation 754 of the class GenOperation 510, which results in actual code generation. A result is then returned by the genScreenLoadEvent 736 to the class GenScreen 430 on a message line 756.

The class GenScreen 430 now initiates a sub-activation 758 by iteratively writing event handler code for the onUnLoad event of each screen, as indicated by a line 760. The class GenScreen 430 interacts with a class genscreenUnLoadevent 762. In this interaction, the state events for each item are identified, and the code for a corresponding onUnload event-handling operation is generated. Invocation of the method generate() on a message line 764 by the class GenScreen 430 results in an activation 766 of the class genscreenUnLoadevent 762. The activation 766 begins with an iterative invocation of the method getGenOperations() on a line 768.

The class genscreenUnLoadevent 762 now interacts with the class GenOperation 510. The interaction begins when the method setMsgPrintWriter() is invoked by the class genscreenUnLoadevent 762 on a message line 770. The class GenOperation 510 then undergoes an activation 772. Next the class genscreenUnLoadevent 762 invokes the method setCodePrintWriter() on a message line 774 to produce an activation 776 of the class GenOperation 510. The class genscreenUnLoadevent 762 then invokes the method generate() on a message line 778 to produce an activation 780 of the class GenOperation 510, which results in actual code generation. A result is then returned by the class genscreenUnLoadevent 762 to the class GenScreen 430 on a message line 782.

The class GenScreen 430 now completes its execution by returning a status result to the class GenMidletApp 414 on a message line 784.

The class GenMidletApp 414 now interacts with a class genTimer 786. The method generate() is invoked by the class GenMidletApp 414 on a message line 788, which initiates an activation 790 of the class genTimer 786. In the activation 790, timer class source files are generated. First, the class genTimer 786 invokes the method getNewJavaClassFile() on a message line 792, which produces an activation 794 of the class GenHelper 420. A new Java PrintStream is returned by this activation.

Next, the class genTimer 786 iteratively invokes a method getOnTimerEvent() on a line 796, which creates code for each timer event of the MIDlet. The class genTimer 786 interacts with a class genTimerEvent 798. The class genTimerEvent 798 is responsible for code generation relating to timer events. Invocation of the method generate() on a message line 800 by the class genTimer 786 results in an activation 802 of the class genTimerEvent 798. The activation 802 begins with an iterative invocation of the method getGenOperations() on a line 804.

The class genTimerEvent 798 now interacts with the class GenOperation 510. This interaction begins when the method setMsgPrintWriter() is invoked by the class genTimerEvent 798 on a message line 806 to produce an activation 808 of the class GenOperation 510. Next, the class genTimerEvent 798 invokes the method setCodePrintWriter() on a message line 810 to produce an activation 812 of the class GenOperation 510. The class genTimerEvent 798 then invokes the method generate() on a message line 814 to produce an activation 816 of the class GenOperation 510, which results in actual code generation. A result is then returned by the class genTimerEvent 798 to the class genTimer 786 on a message line 818.

The class genTimer 786 returns a status report to the class GenMidletApp 414 on a message line 820. Then the class GenMidletApp 414 communicates a status report to the generation object model 76 on a message line 822. The above-mentioned final status message of the generator sequence is communicated from the generation object model 76 to the generator 74 on the message line 412.

MIDML Compiler Sequence.

Figure 13:
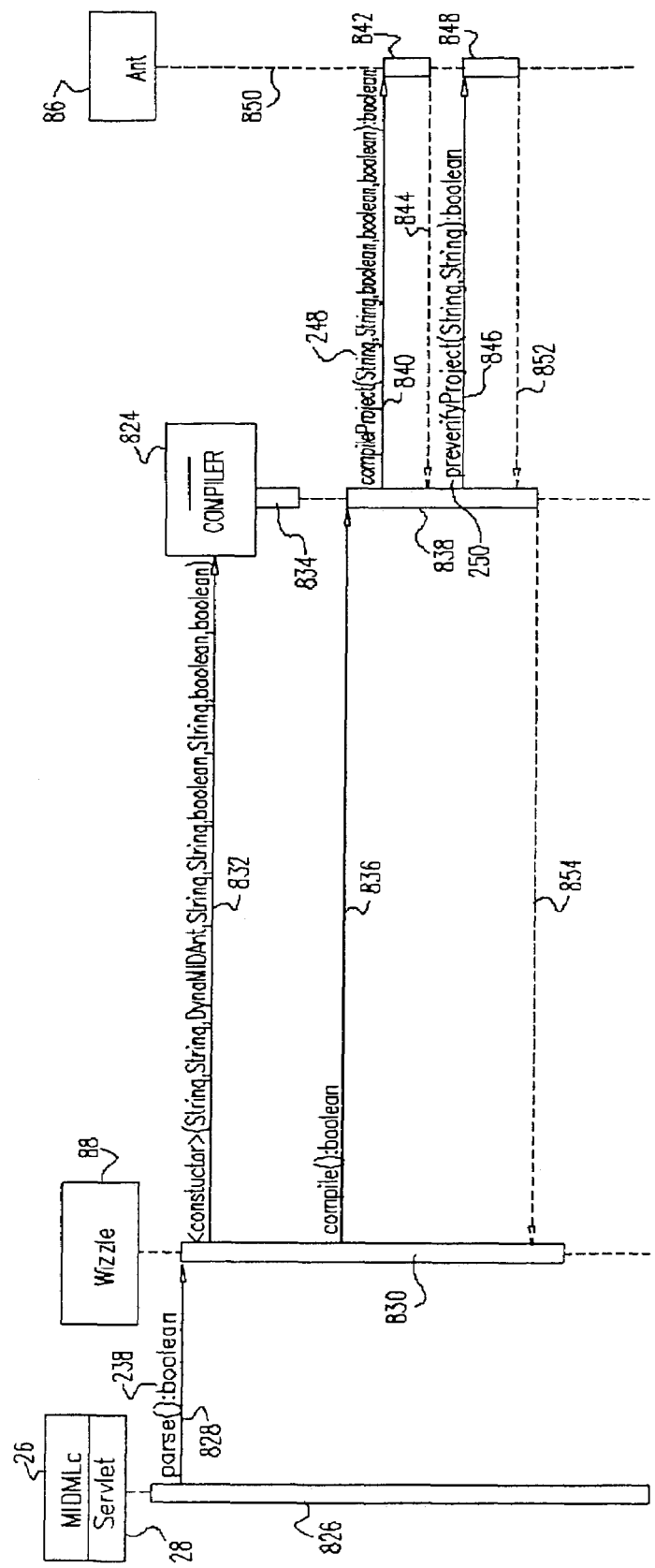
FIG. 13 is a sequence diagram of the main process of a MIDML compiler object, which is created by the compiler and servlet shown in FIG. 3 in accordance with a disclosed embodiment of the invention.

Reference is now made to FIG. 13, which is a sequence diagram of the main process of a MIDML compiler object 824, which is created by the compiler 26 and the servlet 28 (FIG. 3). The disclosure of FIG. 13 should be read in conjunction with FIG. 3, FIG. 4, FIG. 7, and FIG. 8. In an activation 826, following a compiler input, which is a source project path specified in a tag <Project-Dir>, the method compile() 238 (FIG. 4) is invoked to initiate the compilation and pre-verification process on a message line 828.

The wizzle 88 (FIG. 4) receives the message on the message line 828, and is activated in an activation 830. The wizzle 88 activates the constructor of the MIDML compiler object 824 on a message line 832, resulting in an activation 834. Next, the wizzle 88 invokes the compile method of the MIDML compiler object 824 on a message line 836, which causes an activation 838.

The compiler uses the build tool 86 (FIG. 4) as a wrapper for the Java compiler 78 (FIG. 3). During the activation 838, the MIDML compiler object 824 invokes the method compileProject() 248 (FIG. 4) on a message line 840, which instructs the build tool 86 to compile the project. This results in an activation 842.

Upon completion of the compilation, indicated by a message line 844, the MIDML compiler object 824 initiates preverification of the result on a message line 846 by invoking the method preverifyProject() 250 (FIG. 4). This results in an activation 848 of the build tool 86, shown along its object lifeline 850. The results of the preverification process are communicated by the build tool 86 to the MIDML compiler object 824 on a message line 852. The MIDML compiler object 824 reports completion of the Java compilation to the wizzle 88 on a message line 854.

Packer Sequence.

Figure 14:
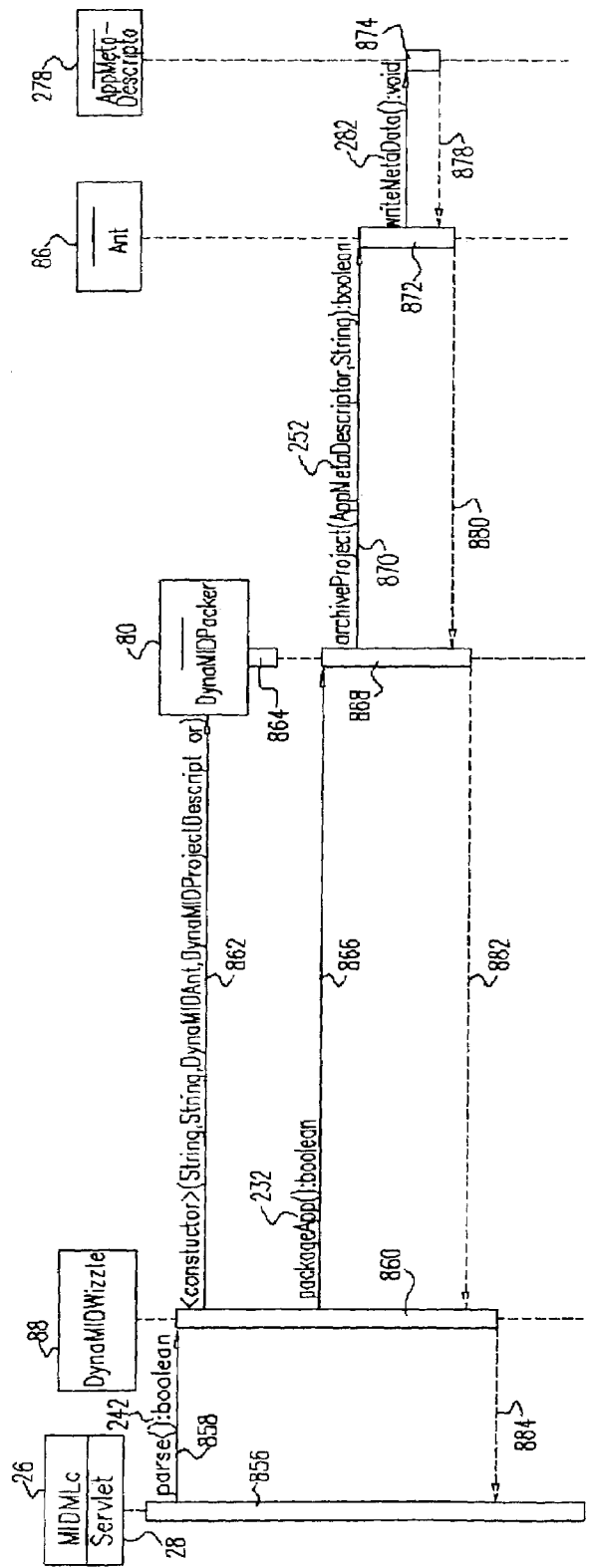
FIG. 14 is a sequence diagram showing the main process of a packer shown in FIG. 3 in accordance with a disclosed embodiment of the invention.

Reference is now made to FIG. 14, which is a sequence diagram shows the main process of the packer 80 (FIG. 3). The disclosure of FIG. 14 should be read in conjunction with FIG. 3, FIG. 4, FIG. 7, and FIG. 8. The packer 80 is created by the compiler 26 and the servlet 28 (FIG. 3).

The compiler input is a source project path specified in a tag <Project-Dir>. In an activation 856, the method archive() 242 (FIG. 4) initiates the archival process on a message line 858. The wizzle 88 (FIG. 4) receives the invocation of the method archive() 242 on the message line 858, and is activated in an activation 860. The wizzle 88 invokes the constructor of the packer 80 on a message line 862, resulting in an activation 864. Next, the wizzle 88 communicates an instruction to the packer 80 that invokes the method packageApp() 232 (FIG. 4) on a message line 866. This produces an activation 868.

The packer 80 invokes the method archiveProject() 252 (FIG. 4) of the build tool 86 (FIG. 4) on a message line 870. The build tool 86 is used as a wrapper for the JAR utility. In an activation 872, the build tool 86 invokes the method writeMetaData() 282 (FIG. 8) of the class DynamidProjectDescriptor 278, which results in an activation 874, and the production of metadata. On completion of this task, a status message is relayed from a JAD descriptor module of the class DynamidProjectDescriptor 278 to the build tool 86, the packer 80, the wizzle 88, the compiler 26 and the servlet 28 on message lines 878, 880, 882 and 884, respectively. Upon receiving the status message on the message line 880, the packer 80 generates the JAD file.

Extensibility.

Referring again to FIG. 3, FIG. 10, and FIG. 11, the infrastructure 30 is seen to be extensible. The modules of the infrastructure 30 provide correlation between a MIDML tag defined by a user, and specific classes of the project descriptor object 72 and the generation object model 76. These classes are loosely coupled, and are integrated in run time. The project descriptor object 72 is integrated with the descriptor object model 212. The generator 74 is integrated with the generation object model 76.

The above-mentioned correlation and integration are performed at run time, and do not require modification or recompilation of the infrastructure 30.

A XML Schema defines an extension tag, which can be added as an element of a MIDML document. Correlation of a newly defined extension tag with the class DescriptorElement 276 (FIG. 10) and the generation object model 76 is accomplished using a configuration properties file, when the classes are precompiled. The properties file contains configuration entries, an example of which is shown in Listing 36. The descriptor element factory 274 (FIG. 10) and the generation object factory 398 (FIG. 11) register the name of the extension tag as a key. The descriptor element factory 274 and the generation object factory 398 register the class names of the project descriptor object 72 and the generation object model 76 as a products class name. These registrations provide correlation between the classes and the tag name. Any needed products can be retrieved from the descriptor element factory 274.

Polymorphic Generation Extensibility Implementation.

Referring again to FIG. 3, FIG. 10, FIG. 11, and FIG. 12, there are important advantages in producing different generation object models for different project descriptors, and registering each model correctly in the generation object factory 398 (FIG. 11). Each generation object model has a corresponding project descriptor accessible during execution of the method generate(), as best seen on the message line 410 (FIG. 12). All necessary MIDML information that needs to be generated is encapsulated within a single associated project descriptor. Every building block of a standard MIDlet application is described in the MIDML file. However, the specific technology to be used is not specified or constrained in the MIDML file. Thus, it is possible to use the same MIDML markup code and the same descriptor object model to generate many versions of a MIDlet application for different technological implementations and for different mobile information devices.

Figure 15:
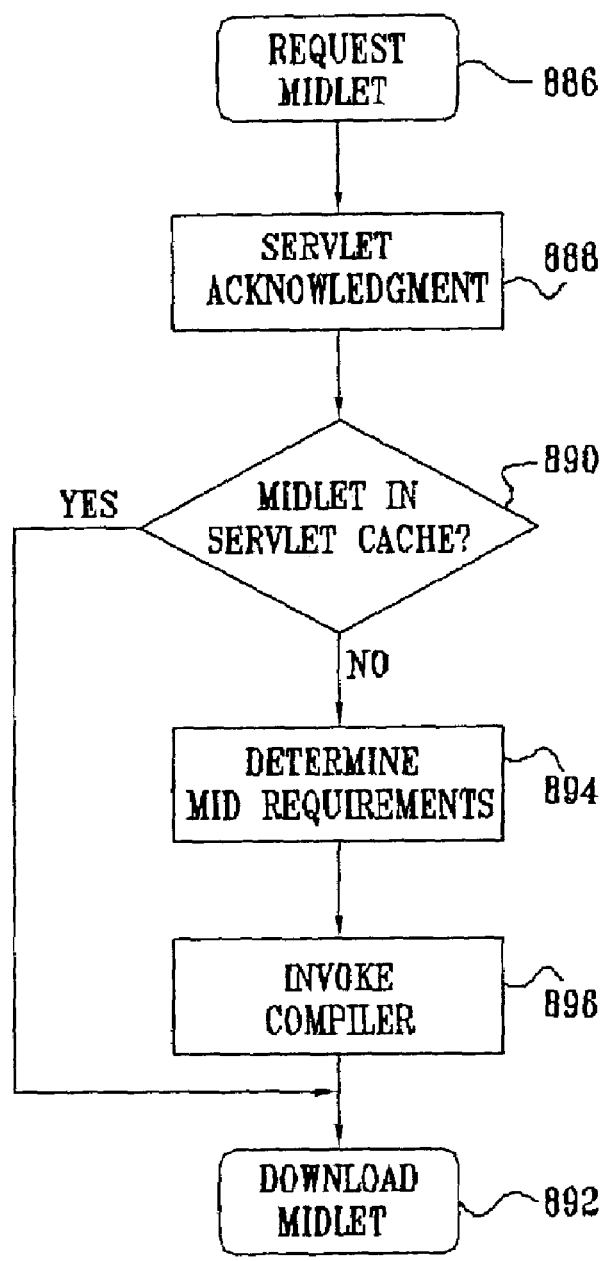
FIG. 15 is a flow diagram illustrating a process, wherein a MIDlet appropriate to a particular mobile information device is generated and downloaded in accordance with a disclosed embodiment of the invention.

Reference is now made to FIG. 15, which is a flow diagram illustrating a process, wherein a MIDlet appropriate to a particular mobile information device is generated and downloaded in accordance with a disclosed embodiment of the invention. The process begins at initial step 886 in which a mobile device user is connected to a data network, typically the Internet, and browses an application catalog or content-provider Web site and requests download of a MIDlet to be executed on the user's particular mobile information device. The request is typically a HTTP request.

Next, in step 888, a servlet running on the Web site acknowledges the HTTP request. The request normally includes an identification of the mobile information device. However, if information is lacking the servlet queries the requestor for additional information in order to adequately determine the identity and characteristics of the mobile information device. The requester may also be prompted to input personal preferences regarding the desired operational characteristics and appearance of the MIDlet that is to run on the particular mobile information device in question.

Next at decision step 890 a determination is made whether a MIDlet is found in the cache that is consistent with the HTTP request of step 888. If the determination at decision step 890 is affirmative, then control proceeds to final step 892, where the requested MIDlet is downloaded to the mobile information device.

If the determination at decision step 890 is negative, then control proceeds to step 894, where the servlet identifies the characteristics of the mobile information device, and identifies resources that are required to produce an updated MIDlet in order to satisfy the request that was received in step 888. These resources typically include MIDML files and library resource files.

Next, a compiler and infrastructural resources, such as are disclosed hereinabove, are invoked in step 896. Here the compiler causes the generation of objects that are adapted to the particular mobile information device, as disclosed in the sections entitled Generator Classes and Generator Sequence. For example, a specialized class (e.g., class GeneratorObjectModel 396 (FIG. 11)) may be instantiated for a specific device, and generates device-specific Java source code. As an additional example, the generated screen classes produce Java source code that differs for devices having different display capabilities. The requestor's personal preferences, if relevant, are also taken into account here.

When the MIDlet has been generated and packaged, control proceeds to final step 892, and the process terminates.

Alternate Embodiment.

Figure 16:
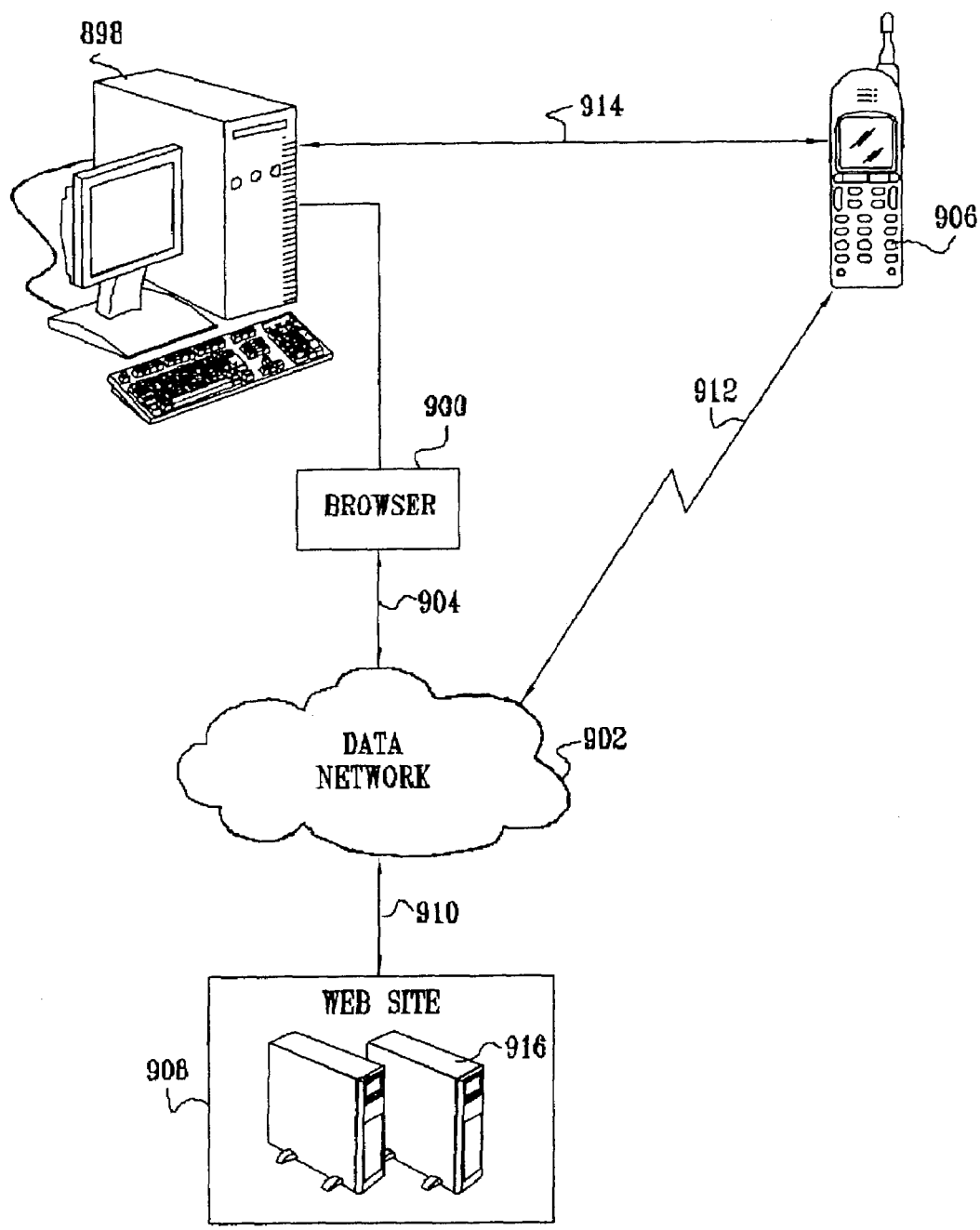
FIG. 16 is a block diagram illustrating an arrangement for generation of an applet in accordance with an alternate embodiment of the invention.

Reference is now made to FIG. 16, which is a block diagram illustrating an arrangement in accordance with an alternate embodiment of the invention. A user of a small computer 898 executes a browser 900. The computer 898 is connected to a data network 902 over a link 904. The user also operates a mobile information device 906, for which MIDlet applications are offered by an electronic commerce web site 908, which is connected to the data network 902 via a link 910. The mobile information device 906 is connected to the data network 902 via a link 912. The mobile information device 906 may also be connected to the computer 898 over a wired or wireless link 914.

The user accesses the web site 908 using the browser 900 and may determine that it is desirable to evaluate an offered MIDlet application. A request is sent to the web site 908 via the data network 902, specifying download of an application having the functionality of the desired MIDlet, but configured as an applet that can be executed on the computer 898. A server 916 of the web site 908 responds by performing the method disclosed in the discussion of FIG. 15. An applet is generated and downloaded to the computer 898 via the link 910 and the link 904.

The user now executes the applet on the computer 898. If the user decides to acquire the offered MIDlet, a second request, specifying download of the MIDlet appropriate to the characteristics of the mobile information device 906, is transmitted to the web site 908. The second request may traverse the link 910 and the link 904. Alternatively, the computer 898 may communicate with the mobile information device 906 over the link 914, which can be a wired or a wireless link. In this case, the mobile information device 906 may then initiate the second request upon receipt of a signal from the computer 898 over the link 914. The request reaches the web site 908 over the link 912 and the link 910.

In any case, the server 916 responds to the second request, again performs the method disclosed in FIG. 15, and generates the MIDlet. Download from the web site 908 can occur directly to the mobile information device 906 via the link 910 and the link 912. Alternatively, the MIDlet can be downloaded to the computer 898 over the link 910 and the link 904, and can be relayed to the mobile information device 906 via the link 914.

Use Cases.

Reference is now made to FIG. 7, which is a block diagram illustrating use cases for the system disclosed with reference to FIG. 1 and FIG. 2. The system is indicated generally as an organizational infrastructure 918. It is believed that understanding of the following use cases will be facilitated by a brief summary of the operation of the system. The developer 98 initially prepares a specification of a MIDlet using a markup language, and submits it to the compiler 26. The compiler 26 parses the specification, and prepares a file in an intermediate code, such as Java source code. This is processed by a code generator, represented as generation components 920, to produce a MIDlet. The developer 98 may provide additional content for the MIDlet, even after it has been generated.

The servlet 28 is a HTTP service interface handles requests of an end user 922. The end user 922 requests the MIDlet via the servlet 28 for download to the mobile information device 40. As explained above, the servlet 28 may respond to the request of the end user 922 by causing the compiler 26 to regenerate or update the MIDlet.

FIG. 7 also illustrates certain administrative functions that are necessary for the operation and maintenance of the system. A deployer 926 is responsible for the maintenance of the servlet 28, aided by a statistics log 924 and server logs 928. The deployer 926 normally is responsible for installation of the system on one or more servers, indicated by block 929.

Use Case 1.

In use case 1, it is intended to generate, compile and package a MIDlet from a MIDML Application. A MIDML developer 98 develops a MIDML Application and deploys it in an accessible web-server or file server. The developer 98 initiates the use-case by activation of the compiler 26 (FIG. 2) with the URL or file path for the MIDML application starting point and all other applicable compiler directives, e.g., directives relating to saving intermediate files, verbose mode operation, use of a log file, and access to external classes and JAR files.

The compiler 26 activates its generation components 920, resulting in the following operations on the MIDML application: parsing, code generation, compilation using a Java compiler, and packaging of the created application. In a successful scenario, the creation of JAR and JAD files for the generated MIDlet is reported to the developer 98.

The system is capable of recognizing and reporting the following failure scenarios:

Failure scenario 1: The compiler 26 cannot find the application starting point. The file may not be accessible due to URL or file path error. An error message is returned to the developer 98.

Failure scenario 2: The compiler 26 found an invalid MIDML file. A XML parser error is returned to the developer 98.

Failure scenario 3: The compiler 26 failed to find the application descriptor in the starting point file. An error message is returned to the developer 98.

Failure scenario 4: The compiler 26 found a dead link to another MIDML file. Generation and compilation stops. An error message is returned to the developer 98 describing the file name and line number of the dead link directive.

Failure scenario 5: The compiler 26 invoked the Java compiler, and the compilation failed. Appropriate Java compiler error messages are returned to the developer 98.

Failure scenario 6: The compiler 26 cannot access the output specified location. The JAD and JAR files cannot be written. An error message is returned to the developer 98.

Use Case 2.

Continuing to refer to FIG. 7, in use case 2 it is intended to service a HTTP request for a MIDML application. A MIDlet is generated, compiled, and packaged from a MIDML application. The MIDlet is sent to the mobile information device 40.

The developer 98 develops the MIDML Application and deploys it in an accessible web-server or file server. Either the developer 98 or the end user 922 can initiate the servlet 28 by sending a HTTP request that is associated with the URL of the servlet 28. The HTPP request parameters indicate the URL for the requested MIDML application, and also includes generation directives for the compiler 26, so that the updated version of the MIDlet can be recompiled as appropriate.

The servlet 28 searches for the requested MIDML application in its cache. If the requested MIDlet is found in the cache and is consistent with the HTPP request, it is downloaded to the mobile information device 40.

Otherwise, the servlet 28 activates generation components 920, in order to parse, generate code, compile using the compiler 26, and package the newly regenerated MIDlet. The servlet 28 then caches the newly regenerated MIDlet, and initiates a download of the JAR and JAD files to the mobile information device 40. Installation of the MIDlet is initiated.

The servlet 28 logs relevant statistical data in the statistics log 924.

In a successful scenario, JAR and JAD files associated with the previously generated or newly regenerated MIDlet are downloaded to the mobile information device 40. In the event of failure, an error message is returned to the developer 98. Except as noted below, generally in the failure scenarios the JAR and JAD files are not created. The system is capable of recognizing and reporting the following failure scenarios:

Failure scenario 1: The servlet 28 cannot find the application starting point. The file or the URL are not accessible. An error message is returned to the developer 98 in an error log file.

Failure scenario 2: The servlet 28 found an invalid MIDML file. A XML parser error is returned to the developer 98 in the error log file.

Failure scenario 3: The servlet 28 failed to find the application descriptor in the starting point file. An error message is returned to the developer 98 in an error log file.

Failure scenario 4: The servlet 28 found a dead link to another MIDML file. Generation and compilation stop. An error message is returned to the developer 98 in an error log file describing the file name and line number of the dead link directive.

Failure scenario 5: The servlet 28 cannot be accessed, for example, due to difficulties with the Web server. An error message is returned to the developer 98, indicating that the service is unavailable.

Failure scenario 6: The servlet 28 has detected a parameter error in the HTTP request. The required parameters are either missing, or have inappropriate values. An error message is returned to the developer 98 in an error log file, indicating an invalid HTTP request.

Failure scenario 7: The Java Application Manager (JAM) of the mobile information device 40 is not able to install the MIDlet, for example due to size constraints. However, the JAR and JAD files have nevertheless been created and may be found in the cache of the servlet.

Failure scenario 8: The end user 922 issues a "cancel and deny installation" instruction for the MIDlet. However, the JAR and JAD files have been created.

Use Case 3

Continuing to refer to FIG. 7, in use case 3 it is intended to successfully install the library 16 (FIG. 2), and either the compiler 26, the servlet 28, or both on a development system available to a software developer, thereby deploying the organizational infrastructure 918. The deployer 926 initiates the installation according to a predetermined installation procedure, and the above-noted components of the set of software components 10 (FIG. 1) are deployed in the organizational infrastructure 918. In a success scenario, an installation testing procedure returns a success message to the deployer 926.

The system is capable of recognizing and reporting the following failure scenarios:

Failure scenario 1: The organizational infrastructure 918 could not be deployed. An error occurred during performance of the installation procedure. An error message is returned to the deployer 926.

Failure scenario 2: The organizational infrastructure 918 was deployed but the installation testing procedure failed. An error message is returned to the deployer 926.

Use Case 4.

Continuing to refer to FIG. 7, in use case 4 it is intended to maintain the servlet 28 by evaluation of the server logs 928. Typically, the deployer 926 consults the server logs 928, which have been produced by compiler 26, and other processes of the organizational infrastructure 918. In a success scenario, the deployer 926 or webmaster receives requested log files, log messages, statistic data, e.g., number of requests per MIDlet, number of created MIDlets, number of generation failures, and response time.

The system is capable of recognizing and reporting the following failure scenario: the organizational infrastructure 918 could not produce the requested logs and statistics.

EXAMPLE

An exemplary MIDML Application Project file for a MIDML MIDlet is presented in Listing 37. This file contains a single element: an application descriptor tag containing MIDML application location-oriented data, i.e., a pointer to the application starting point MIDML source file. The file also contains JAD-oriented data, i.e., the JAR URL, and MIDlet version information.

An exemplary MIDML Application starting point file for the application is shown in Listing 38. This file contains the mandatory tag <midml-app> for a starting point file. The application predefined start event startApp performs the link to the first application screen. An exemplary notification that an application is exiting is presented in Listing 39. A sample form for the application is shown in Listing 40.

It will be appreciated by persons skilled in the art that the present invention is not limited to what has been particularly shown and described hereinabove. Rather, the scope of the present invention includes both combinations and subcombinations of the various features described hereinabove, as well as variations and modifications thereof that are not in the prior art, which would occur to persons skilled in the art upon reading the foregoing description.

Appendix 1.

This appendix defines functional requirements of the markup language MIDML. It lists the general structure of a MIDML application and the functionality exposed to the MIDML developer. MIDML tag definitions and event-handling mechanisms follow simple HTML-like principles.

General Requirements.

Req. 1: A MIDML file is a well formatted XML file using specific MIDML XML schema definitions.

Req. 2: MIDML may include compiler directives in the application descriptor.

Req. 3: MIDML supports generic extending of the language tags via predefined interfaces. Vendor specific tags are enabled.

Req. 4: MIDML allows MIDP 1.0a compliant Java code embedding within MIDML applications.

Req. 5: MIDML renders a user agent sensitive mechanism, exposing the user agent to the MIDML developer.

Req. 6: MIDML may contain user agent specific sections.

Application Structure.

Req. 7: A MIDML application has a XML compliant application descriptor tag, containing the following fields: application name; version; vendor. The descriptor tags are JAD data oriented.

Req. 8: A MIDML application has a starting point file containing the application descriptor tag.

Req. 9: MIDML supports the definition of data variables within the scope of the entire application.

Req. 10: MIDML supports the definition of data variables within the scope of a single application Screen.

Req. 11: MIDML supports reading and assignment operation on data variables.

Req. 12: MIDML data variables can be initialized via external parameters that are supplied once the MIDML application has been parsed and compiled. The external parameters may be supplied using a string initialization mechanism.

Req. 13: MIDML uses a document object model for widgets and data variable access.

Req. 14: MIDML uses a document object model for MIDML document properties access.

Req. 15: MIDML has a mechanism to specify variable persistence storage between independent invocations of the generated MIDlet.

Req. 16: MIDML supports variables persistence storage while the MIDlet is running.

Req. 17: MIDML supports null value initialization for data variables.

Req. 18: MIDML defines the following state events and events handlers: ON_START; ON_PAUSE; ON_DESTROY.

Req. 19: MIDML may allow the addition of user-defined events and event handlers via interfaces. This requirement is supported by the extension mechanism disclosed hereinabove.

Req. 20: MIDML defines a method to activate a link to an application page upon a triggered event.

Req. 21: MIDML defines a method to activate an arbitrary event handler upon a triggered event.

Req. 22: MIDML defines a method to invoke Servlet calls upon a triggered event.

Graphics and User Interface.

Req. 23: MIDML supports all MIDP 1.0a widgets including the Canvas widget, and their respective events.

Req. 24: MIDML enables the user to add new widgets and device specific widgets.

Req. 25: MIDML defines anchor navigation within a MIDlet page.

Req. 26: MIDML defines a paragraph text formatting tag.

Req. 27: MIDML supports the following font attributes for text: font type; size (small, medium, large); style (bold, underlined, italic); face (proportional, mono-space, system).

Req. 28: MIDML supports page heading formats.

Req. 29: MIDML supports line breaks within a MIDlet screen.

Req. 30: MIDML supports a form tag as a collection of user interface widgets.

Req. 31: The MIDML form supports a SUBMIT operation, which sends all the form's widget data to a specified link.

Resources.

Req. 32: MIDML allows the user to embed resources within an application screen.

Req. 33: MIDML allows the user to define remote resources, fetched at run time across a network, such as the Web.

Req.: MIDML supports text document resources.

Req. 34: MIDML supports PNG image resources.

Req. 35: MIDML enables the user to specify a resource location using a URL.

Req. 36: MIDML defines a tag for a simple Boolean servlet activation.

Req. 37: MIDML defines a tag for a text servlet activation.

Req. 38: MIDML defines a mechanism to support definitions of protocols and data-message formats for full servlet interoperability.

Appendix 2.

The functional requirements of the library [LIB] are disclosed in this Appendix. There are three major functions that the library supports: (1) MIDlet code generation; (2) compiling and packing of the generated code; and (3) a MIDP 1.0a abstraction layer containing utilities.

Req. 39: The library generates the MIDlet Java code from a valid MIDML starting point.

Req. 40: The library generates the MIDlet application descriptor file (JAD).

Req. 41: The library supports invocation of the Java compiler (JAVAC) to compile the generated MIDlet Java code.

Req. 42: The library supports invocation of the Java compiler (JAVAC) to compile with licensee open classes (CLASSPATH), including classes physically located on the target MIDP device.

Req. 43: The library supports invocation of the Java compiler (JAVAC) to compile with external classes. Additional classes are packed with the generated MIDlet.jar.

Req. 44: The library code generator component has an option to operate in a verbose mode.

Req. 45: The library code generator component has an option to initialize data variables with parameters.

Req. 46: The library supports invocation of the Java archive utility (JAR) to package the generated MIDlet and the additional files (resources, external classes etc.)

Req. 47: The library returns mal-formatted MIDML syntax errors (including XML parser errors).

Req. 48: The library returns all Java compiler errors with respect to the MIDML source where applicable.

Req. 49: The library returns J2ME platform exceptions with respect to the MIDML source where applicable.

Req. 50: The library code generator component utilizes logical links to create application flow between MIDlet screens.

Req. 51: The library code generator component is able to identify recursive link definitions in the MIDML source in order to enable looping.

Req. 52: The library defines a document object model for the generated MIDlet from the MIDML source.

Req. 53: The MIDML document object mode may be exposed by The library for MIDP 1.0a Java code embedding.

Req. 54: The library supports reading and assignment operations of data variables from the document object model.

Req. 55: The library supports the MIDP 1.0a event model for events defined in the MIDML source.

Req. 56: The library has customization capabilities according to the user agent information.

Req. 57: The library supports parsing and Java code generation from all the MIDML defined tags.

Appendix 3.

This Appendix describes the functional requirements of the compiler application. It lists the compiler flags and operation modes and defines the user interface.

General Requirements.

Req. 58: The compiler is a Java application using the Library (Appendix 2).

Req. 59: The compiler has a command line user interface.

Req. 60: The compiler generates a packaged (JAR) MIDlet application and its respective application descriptor file (JAD) from a valid MIDML starting point file.

Req. 61: The compiler reports all types of errors messages generated by the RTL layer.

Usage Flags.

Req. 62: The compiler input flag is a URL or a file system path, specifying the MIDML application starting point file.

Req. 63: The compiler output flag is a file system path indicating the location of the resulting MIDlet JAD and JAR files.

Req. 64: The compiler has an operation log flag.

Req. 65: The compiler has a verbose flag echoing the operation log to the standard output.

Req. 66: The compiler has a CLASSPATH directive.

Req. 67: The compiler has a MIDML parameters directive.

Req. 68: The compiler has a directive to indicate packing of external classes within the generated MIDlet package (JAR).

Req. 69: The compiler has a makefile directive.

Req. 70: The compiler has a flag for saving intermediate compilation files.

Appendix 4.

This Appendix describes the functional requirements of the servlet application, the servlet operation modes, and Web application behavior.

General Requirements.

Req. 71: The servlet renders a Web interface for MIDlet creation on demand.

Req. 72: The servlet reports all types of error messages generated from the Library layer (Appendix 2) to the host server log file.

Req. 73: The servlet uses a caching mechanism that identifies changes in the requested MIDlet.

Req. 74: The servlet does not generate a new MIDlet if the MIDlet requested is consistent with the cached MIDlet. MIDlet consistency is defined in terms of: file time-stamp; application descriptor information; MIDML parameters; and user agent information.

Req. 75: The servlet logs the following data: number of requests per MIDlet; number of created MIDlets; and number of MIDlet generation failures; and response time.

Usage Flags.

Servlet usage flags have the following type properties:

[Deployment]—Accessible only to the webmaster or deployer responsible for the functioning of the servlet;

[Application]—Flags specific to the MIDML application demands; and

[Dynamic]—Accessible via HTTP requests.

Req. 76: [Dynamic] The servlet input flag is a URL or a file system path, specifying the MIDML application starting point file.

Req. 77: [Application] The servlet output flag is a file system path indicating the location of the resulting MIDlet JAD and JAR files.

Req. 78: [Deployment] The servlet has an operation log flag.

Req. 79: [Deployment] The servlet has a verbose flag, and logs its operation to a server log file.

Req. 80: [Application] The servlet has a CLASSPATH directive.

Req. 81: [Dynamic] The servlet has a MIDML parameters directive.

Req. 82: [Application] The servlet has a directive to indicate packing of external classes within the generated MIDlet package (JAR).

Req. 83: [Application] The servlet has a make-file directive.

Req. 84: [Deployment] The servlet has a flag to enable saving of compilation intermediate files.

COMPUTER PROGRAM LISTINGS

Listing 1

```xml
<?xml version="1.0" ?>
-<xsd:schema xmlns:xsd="http://www.w3.org/2001/XMLSchema"
    targetNamespace="http://www.sun.com/dynamid"
    xmlns="http://www.sun.com/dynamid"
    elementFormDefault="qualified">
    <xsd:include schemaLocation="utils.xsd" />
    <xsd:include schemaLocation="widgets.xsd" />
    <xsd:include schemaLocation="events.xsd" />
    <xsd:include schemaLocation="screens.xsd" />
    <xsd:include schemaLocation="vars.xsd" />
    <xsd:include schemaLocation="operations.xsd" />
    <xsd:include schemaLocation="midmlapp.xsd" />
    <xsd:include schemaLocation="descriptor.xsd" />
-   <!--
    -->
-   <xsd:complexType name="midml-type">
-     <xsd:sequence maxOccurs="unbounded">
        <xsd:element ref="include" minOccurs="0"
            maxOccurs="unbounded" />
-       <xsd:choice>
          <xsd:element name="app-descriptor"
              type="midml-project-descriptor-type" />
          <xsd:element name="midml-app" type=
          "midml-app-type" />
          <xsd:element ref="screen" minOccurs="1"
              maxOccurs="unbounded" />
        </xsd:choice>
      </xsd:sequence>
      <xsd:attribute name="version" type="midml-version-type"
          use="optional" />
    </xsd:complexType>
    <xsd:element name="midml" type="midml-type" />
</xsd:schema>
```

Listing 2

```xml
<?xml version="1.0"?>
<xsd:schema xmlns:xsd="http://www.w3.org/2001/XMLSchema"
            targetNamespace="http://www.sun.com/dynamid"
            xmlns="http://www.sun.com/dynamid"
            elementFormDefault="qualified">
    <xsd:include schemaLocation="utils.xsd"/>
    <xsd:include
            schemaLocation="operations.xsd"/>
            <!-- MIDML Widget-Base-Type -->
    <xsd:complexType name="widget-base-type">
      <xsd:all>
      </xsd:all>
    </xsd:complexType>
            <!-- MIDP-1.0 Items -->
    <xsd:complexType name="item-type">
      <xsd:sequence>
        <xsd:element name="label" type="xsd:string"
            minOccurs="0"/>
        <xsd:element name="onItemStateChanged"
            type="event-handler-type" minOccurs="0"/>
      </xsd:sequence>
      <xsd:attribute name="name"
          type="xsd:string" use="optional"/>
      <xsd:attribute name="persist"
          type="persistence-option-type"
          use="optional"/>
      <xsd:anyAttribute/>
    </xsd:complexType>
    <!-- ChoiceGroup -->
    <xsd:complexType name="choiceGroup-type">
      <xsd:complexContent>
        <xsd:extension base="item-type">
          <xsd:sequence>
            <xsd:element name="choices"
                type="choices-type" minOccurs="1"
                maxOccurs="1"/>
          </xsd:sequence>
          <xsd:attribute name="choiceType"
              type="choice-context-type"
              use="required"/>
        </xsd:extension>
      </xsd:complexContent>
    </xsd:complexType>
    <!-- DateField -->
    <xsd:complexType name="dateField-type">
      <xsd:complexContent>
        <xsd:extension base="item-type">
          <xsd:sequence>
            <xsd:choice>
              <xsd:element name="dateTime"
                  type="xsd:dateTime"/>
              <xsd:element name="date"
                  type="xsd:date"/>
              <xsd:element name="time"
                  type="xsd:time"/>
            </xsd:choice>
            <xsd:element name="timeZone"
                type="xsd:string"
                minOccurs="0"/>
          </xsd:sequence>
        </xsd:extension>
      </xsd:complexContent>
    </xsd:complexType>
    <!-- Gauge -->
    <xsd:complexType name="gauge-type">
      <xsd:complexContent>
        <xsd:extension base="item-type">
          <xsd:sequence>
            <xsd:element name="maxValue"
                type="xsd:integer"/>
            <xsd:element name="value"
                type="xsd:integer"/>
          </xsd:sequence>
          <xsd:attribute name="interactive"
              type="xsd:boolean" use="optional" />
        </xsd:extension>
      </xsd:complexContent>
    </xsd:complexType>
    <!-- ImageItem -->
    <xsd:complexType name="image-item-type">
      <xsd:complexContent>
        <xsd:extension base="item-type">
          <xsd:sequence>
            <xsd:element name="imageSource"
                type="xsd:string"/>
            <xsd:element name="altText"
                type="xsd:string"/>
          </xsd:sequence>
          <xsd:attribute name="layout" type="image
              layout
              type" use="optional"/>
        </xsd:extension>
      </xsd:complexContent>
    </xsd:complexType>
    <!-- StringItem -->
    <xsd:complexType name="string-item-type">
      <xsd:complexContent>
        <xsd:extension base="item-type">
          <xsd:sequence>
            <xsd:element name="text"
                type="xsd:string"/>
          </xsd:sequence>
```

```
            </xsd:extension>
        </xsd:complexContent>
    </xsd:complexType>
    <!-- TextField -->
    <xsd:complexType name="textField-type">
        <xsd:complexContent>
            <xsd:extension base="item-type">
                <xsd:sequence>
                    <xsd:element name="text"
                        type="xsd:string"/>
                </xsd:sequence>
                <xsd:attribute name="constraint" type="text
                    constraint-type"/>
                <xsd:attribute name="maxSize"
                    type="xsd:integer"
                    use="optional"/>
            </xsd:extension>
        </xsd:complexContent>
    </xsd:complexType>
            <!-- MIDP-1.0 Ticker -->
<xsd:complexType name="ticker-type">
    <xsd:simpleContent>
        <xsd:extension base="xsd:string">
            <xsd:attribute name="name" type="xsd:string"
                use="required"/>
            <xsd:attribute name="persist"
                type="persistence
                option-type" use="optional"/>
        </xsd:extension>
    </xsd:simpleContent>
</xsd:complexType>
            <!-- MIDP-1.0 Command Types -->
            <xsd:simpleType name="commandType-type">
                <xsd:restriction base="xsd:string">
                    <xsd:enumeration value="BACK"/>
                    <xsd:enumeration value="CANCEL"/>
                    <xsd:enumeration value="EXIT"/>
                    <xsd:enumeration value="HELP"/>
                    <xsd:enumeration value="ITEM"/>
                    <xsd:enumeration value="OK"/>
                    <xsd:enumeration value="SCREEN"/>
                    <xsd:enumeration value="STOP"/>
                </xsd:restriction>
            </xsd:simpleType>
            <!-- MIDP-1.0 Command -->
    <xsd:complexType name="command-type">
    <!-- Attributes: label, int commandType, int
      priority
    -->
        <xsd:sequence>
            <xsd:element name="onCommandAction"
                type="event
                handler-type" minOccurs="0"/>
        </xsd:sequence>
        <xsd:attribute name="label" type="xsd:string"
            use="required"/>
        <xsd:attribute name="commandType"
            type="commandType
            type" use="required"/>
        <xsd:attribute name="priority"
            type="xsd:integer"
            use="required"/>
    </xsd:complexType>
            <!-- MIDML-1.0 Items-->
<!-- Header, Paragraph, Anchor -->
<!-- Schema Test Elements -->
            <xsd:element name="item" type="item-type" />
            <xsd:element name="stringItem"
                    substitutionGroup="item"
                    type="string-item-type" />
            <xsd:element name="textFieldItem"
                    substitutionGroup="item"
                    type="textField-type" />
            <xsd:element name="imageItem"
                    substitutionGroup="item"
                    type="image-item-type" />
            <xsd:element name="dateFieldItem"
                    substitutionGroup="item"
                    type="dateField-type" />
            <xsd:element name="gaugeItem"
                    substitutionGroup="item"type=
                    "gauge-type" />
            <xsd:element name="choiceGroupItem"
                    type="choiceGroup-type"/>
            <xsd:element name="widget"
                    type="widget-base-type"/>
            <xsd:element name="command"
                    type="command-type"/>
            <xsd:element name="ticker"
                    type="ticker-type"/>
</xsd:schema>
```

Listing 3

```
<?xml version="1.0"?>
<xsd:schema xmlns:xsd="http://www.w3.org/2001/XMLSchema"
    targetNamespace="http://www.sun.com/dynamid"
    xmlns="http://www.sun.com/dynamid"
    elementFormDefault="qualified">
    <xsd:include schemaLocation="utils.xsd"/>
    <xsd:element name="variable" type="variable-type"/>
</xsd:schema>
```

Listing 4

```
<?xml version="1.0"?>
<xsd:schema xmlns:xsd="http://www.w3.org/2001/XMLSchema"
            targetNamespace=
            "http://www.sun.com/dynamid"
            xmlns="http://www.sun.com/dynamid"
            elementFormDefault="qualified">
    <xsd:simpleType name="Class-Name-type">
        <xsd:restriction base="xsd:string">
            <xsd:pattern
                value="(([a-zA-Z])+)(\.(([a-zA-Z])+))*)"/>
        </xsd:restriction>
    </xsd:simpleType>
    <xsd:simpleType name="midml-name-type">
        <xsd:restriction base="xsd:string">
            <xsd:pattern value="[a-zA-Z]([a-zA-Z0-9]+)"/>
        </xsd:restriction>
    </xsd:simpleType>
    <xsd:simpleType name="midml-reference-type">
        <xsd:restriction base="xsd:string">
            <xsd:pattern
                value="([a-zA-Z]([a-zA-Z0-9]+)(\.[a-zA-Z]
                ([a-zA-Z0-9]+))*)"/>
            <xsd:whiteSpace value="collapse"/>
        </xsd:restriction>
    </xsd:simpleType>
    <xsd:simpleType name="midml-version-type">
        <xsd:restriction base="xsd:string">
            <xsd:pattern value="[0-9]\.[0-9]{1,3}|[1-9]{1,3}\
                [0-9]{1,3}"/>
        </xsd:restriction>
    </xsd:simpleType>
    <xsd:complexType name="include-type">
        <xsd:attribute name="href" type="xsd:anyURI"/>
    </xsd:complexType>
    <xsd:simpleType name="source-type">
        <xsd:restriction base="xsd:string">
            <xsd:enumeration value="MIDP-1.0"/>
            <xsd:enumeration value="MIDML-1.0"/>
        </xsd:restriction>
    </xsd:simpleType >
    <xsd:simpleType name="persistence-option-type">
        <xsd:restriction base="xsd:string">
```

-continued

```
                <xsd:enumeration value="SCREEN"/>
                <xsd:enumeration value="APPLICATION"/>
        </xsd:restriction>
</xsd:simpleType>
<xsd:simpleType name="text-constraint-type">
        <xsd:restriction base="xsd:string">
                <xsd:enumeration value="CONSTRAINT_MASK"/>
                -->
                <xsd:enumeration value="ANY"/>
                <xsd:enumeration value="EMAILADDR"/>
                <xsd:enumeration value="NUMERIC"/>
                <xsd:enumeration value="PASSWORD"/>
                <xsd:enumeration value="PHONENUMBER"/>
                <xsd:enumeration value="URL"/>
        </xsd:restriction>
</xsd:simpleType>
<!-- MIDP-1.0 Choice-Enumeration-Type -->
<xsd:simpleType name="choice-context-type">
        <xsd:restriction base="xsd:string">
                <xsd:enumeration value="SINGLE"/>
                <xsd:enumeration value="MULTIPLE"/>
        </xsd:restriction>
</xsd:simpleType >
<xsd:complexType name="choice-type">
        <xsd:simpleContent>
                <xsd:extension base="xsd:string">
                        <xsd:attribute name="name" type=
                        "midml-name-type"/>
                        <xsd:attribute name="selected" type="xsd:boolean"/>
                        <xsd:attribute name="image" type="xsd:anyURI"
                                use="optional"/>
                </xsd:extension>
        </xsd:simpleContent>
</xsd:complexType>
<xsd:complexType name="choices-type">
        <xsd:sequence>
                <xsd:element name="choice" type="choice-type"
                        maxOccurs="unbounded"/>
        </xsd:sequence>
</xsd:complexType>
<xsd:simpleType name="image-layout-type">
        <xsd:restriction base="xsd:string">
                <xsd:enumeration value="LAYOUT_CENTER"/>
                <xsd:enumeration value="LAYOUT_DEFAULT"/>
                <xsd:enumeration value="LAYOUT_LEFT"/>
                <xsd:enumeration value="LAYOUT_NEWLINE_
                AFTER"/>
                <xsd:enumeration value="LAYOUT_NEWLINE_
                BEFORE"/>
                <xsd:enumeration value="LAYOUT_RIGHT"/>
        </xsd:restriction>
</xsd:simpleType >
<!-- MIDP-1.0 Font-Size-Type -->
<xsd:simpleType name="font-size-type">
        <xsd:restriction base="xsd:string">
                <xsd:enumeration value="SIZE_LARGE"/>
                <xsd:enumeration value="SIZE_MEDIUM"/>
                <xsd:enumeration value="SIZE_SMALL"/>
        </xsd:restriction>
</xsd:simpleType >
<!-- MIDP-1.0 Font-Face-Type -->
<xsd:simpleType name="font-face-type">
        <xsd:restriction base="xsd:string">
                <xsd:enumeration value="FACE_MONOSPACE"/>
                <xsd:enumeration value="FACE_PROPORTIONAL"/>
                <xsd:enumeration value="FACE_SYSTEM"/>
        </xsd:restriction>
</xsd:simpleType >
<!-- MIDP-1.0 Font-Style-Type -->
<xsd:simpleType name="font-style-type">
        <xsd:restriction base="xsd:string">
                <xsd:enumeration value="STYLE_BOLD"/>
                <xsd:enumeration value="STYLE_ITALIC"/>
                <xsd:enumeration value="STYLE_PLAIN"/>
                <xsd:enumeration value="STYLE_UNDERLINED"/>
        </xsd:restriction>
</xsd:simpleType >
<!-- MIDML Variable Definition -->
<xsd:complexType name="variable-type">
        <xsd:simpleContent>
                <xsd:extension base="xsd:string">
                        <xsd:attribute name="name" type="midml-name-type"
                                use="required"/>
                        <xsd:attribute name="persist"
                                type="persistence-option-type" use="optional"/>
                </xsd:extension>
        </xsd:simpleContent>
</xsd:complexType>
<xsd:complexType name="boolean-variable-type">
        <xsd:simpleContent>
                <xsd:extension base="xsd:boolean">
                        <xsd:attribute name="name" type="midml-name-type"
                                use="required"/>
                        <xsd:attribute name="persist" type="persistence-
                                option-type" use="optional"/>
                </xsd:extension>
        </xsd:simpleContent>
</xsd:complexType>
<!-- include global element -->
<xsd:element name="include" type="include-type"/>
</xsd:schema>
```

Listing 5

```
<?xml version="1.0"?>
<xsd:schema xmlns:xsd="http://www.w3.org/2001/XMLSchema"
        targetNamespace="http://www.sun.com/dynamid"
        xmlns="http://www.sun.com/dynamid"
        elementFormDefault="qualified">
        <xsd:include schemaLocation="utils.xsd"/>
                <xsd:include schemaLocation="vars.xsd"/>
                <!--xsd:include schemaLocation="widgets.xsd"/-->
                <xsd:simpleType name="assign-operator-type">
                        <xsd:restriction base="xsd:string">
                                <xsd:pattern value="([a-zA-Z]([a-zA-Z0-9]+)
(\.[a-zA-Z]([a-zA-Z0-9]+))*)\s*=\s*([a-zA-Z]
        ([a-zA-Z0-9]+)(\.[a-zA-Z]([a-zA-Z0-9]+))*)"/>
                                <xsd:pattern value="([a-zA-Z]([a-zA-Z0-9]+)
                                        (\.[a-zA-Z]([a-zA-Z0-9]+))*)
                                        \s*=\s*(\-)*\p{Nd}+"/>
                                <xsd:pattern value="([a-zA-Z]([a-zA-Z0-9]+)
                                        (\.[a-zA-Z]([a-zA-Z0-9]+))*)
                                        \s*=\s*\p{Nd}*\p{L}+\p{Nd}*"/>
                                <xsd:whiteSpace value="collapse"/>
                        </xsd:restriction>
                </xsd:simpleType>
        <xsd:complexType name="if-operator-type">
                <xsd:sequence>
                        <xsd:element name="then" type="event-handler-type"
                                minOccurs="0"/>
                        <xsd:element name="else" type="event-handler-type"
                                minOccurs="0"/>
                </xsd:sequence>
                <xsd:attribute name="eval" type="midml-reference
                        type"/>
        </xsd:complexType>
        <!-- cancel the timer element that was prevoisely defined -->
        <xsd:complexType name="activate-timer-type">
                <xsd:attribute name="timer" type="midml-reference
                        type"/>
        </xsd:complexType>
                <!-- cancel the timer element that was previously
                        defined -->
        <xsd:complexType name="cancel-timer-type">
                <xsd:attribute name="timer" type="midml-reference
                        type"/>
        </xsd:complexType>
        <xsd:complexType name="activate-servlet-type" >
                <xsd:attribute name="servlet" type="midml
                        reference-type"/>
        </xsd:complexType>
        <xsd:complexType name="link-type">
```

-continued

```
                <xsd:attribute name="ref" type="midml-reference
                    type" use="required"/>
        </xsd:complexType>
        <xsd:simpleType name="signal-type">
                <xsd:restriction base="xsd:string">
                        <xsd:enumeration value="pauseApp" />
                        <xsd:enumeration value="destroyApp" />
                        <xsd:enumeration value="startApp" />
                        <xsd:enumeration value="reloadScreen" />
                        <xsd:enumeration value="unloadScreen" />
                </xsd:restriction>
        </xsd:simpleType>
        <xsd:complexType name="event-handler-type">
                <xsd:sequence minOccurs="0" maxOccurs=
                "unbounded">
            <xsd:element name="activateServlet"     type="activate
                servlet-type"       minOccurs="0"
                maxOccurs="unbounded"/>
            <xsd:element name="activateTimer" type="activate
                timer-type"       minOccurs="0"
                maxOccurs="unbounded"/>
            <xsd:element name="cancelTimer"      type="cancel
                timer-type"       minOccurs="0"
                maxOccurs="unbounded"/>
            <xsd:element name="link"          type="link-type"
                minOccurs="0" maxOccurs="unbounded"/>
            <xsd:element name="if"          type="if
                operator-type"         minOccurs="0"
                maxOccurs="unbounded"/>
            <xsd:element name="signal"
                type="signal-type"
                minOccurs="0" maxOccurs="unbounded"/>
            <xsd:element name="assign"
                type="assign-operator-type"     minOccurs="0"
                maxOccurs="unbounded"/>
                </xsd:sequence>
        </xsd:complexType>
        <!-- servlet activation global element - representing
            the inheritence group -->
        <xsd:element name="activateServlet" type="activate
            servlet-type"/>
<!-- activate-timer-type activation global element -->
<xsd:element name="activateTimer" type="activate-timer
    type"/>
<!-- activate-timer-type activation global element -->
<xsd:element name="cancelTimer" type="cancel-timer
    type"/>
        <!-- scope activation global element -->
<xsd:element name="eventHandler" type="event-handler
    type"/>
<!-- assign-type activation global element -->
<xsd:element name="assign" type="assign-operator-type"/>
        <!-- assign-type activation global element -->
<xsd:element name="signal" type="signal-type"/>
<!-- link-type activation global element -->
        <xsd:element name="link" type="link-type"/>
        <!-- if-type activation global element -->
<xsd:element name="if" type="if-operator-type"/>
</xsd:schema>
```

Listing 6

```
<?xml version="1.0"?>
<xsd:schema xmlns:xsd="http://www.w3.org/2001/XMLSchema"
    targetNamespace="http://www.sun.com/dynamid"
    xmlns="http://www.sun.com/dynamid"
    elementFormDefault="qualified">
    <xsd:include schemaLocation="utils.xsd"/>
    <xsd:include schemaLocation="operations.xsd"/>
    <xsd:include schemaLocation="infra.xsd"/>
    <!--
    -->
    <xsd:complexType name="midml-app-type">
        <xsd:sequence>
```

```
                <xsd:choice maxOccurs="unbounded">
                    <xsd:element ref="include" minOccurs="0" />
                    <xsd:element ref="screen" minOccurs="0" />
                    <xsd:element ref="servlet" minOccurs="0" />
                    <xsd:element ref="timer" minOccurs="0" />
                    <xsd:element name="var" type ="variable-type"
                        minOccurs="0" maxOccurs="unbounded"/>
                    <xsd:any minOccurs="0"/>
                </xsd:choice>
                <!--
                    mandatory predefined event handlers.
                -->
                <xsd:element name="startApp" type="event
                    handler-type" minOccurs="1" maxOccurs="1"/>
                <xsd:element name="pauseApp" type="event
                    handler-type" minOccurs="1" maxOccurs="1"/>
                <xsd:element name="destroyApp" type="event
                    handler-type" minOccurs="1" maxOccurs="1"/>
        </xsd:sequence>
        <xsd:attribute name="name" type="midml-name
            type"/>
        <xsd:attribute name="icon" type="xsd:anyURI"
            use="optional"/>
    </xsd:complexType>
</xsd:schema>
```

Listing 7

```
<?xml version="1.0"?>
<xsd:schema xmlns:xsd="http://www.w3.org/2001/XMLSchema"
    targetNamespace="http://www.sun.com/dynamid"
    xmlns="http://www.sun.com/dynamid"
    elementFormDefault="qualified">
        <xsd:include schemaLocation="utils.xsd"/>
        <xsd:include schemaLocation="widgets.xsd"/>
        <xsd:include schemaLocation="infra.xsd"/>
        <!-- MIDML Screen-Base-Type -->
        <xsd:complexType name="screen-base-type">
            <xsd:sequence>
                <xsd:element name="title" type="xsd:string"
minOccurs="0" maxOccurs="1"/>
                <xsd:element name="ticker" type="ticker-type"
minOccurs="0" maxOccurs="1"/>
                <xsd:element name="var" type="variable-type"
                    minOccurs="0" maxOccurs="unbounded"/>
                <xsd:element name="command" type=
                    "command-type"
                    minOccurs="0" maxOccurs="unbounded"/>
                <xsd:element name="servlet" type="servlet-type"
                    minOccurs="0" maxOccurs="unbounded"/>
                <xsd:element name="timer" type="timer-type"
                    minOccurs="0" maxOccurs="unbounded"/>
                <xsd:element name="onLoad" type ="event-handler
                    type" minOccurs="0"/>
                <xsd:element name="onUnload" type ="event-handler
                    type" minOccurs="0"/>
            </xsd:sequence>
            <xsd:attribute name="persist" type="persistence
                option-type" use="optional"/>
            <xsd:attribute name="name" type="midml-name-type"
                use="required"/>
            <xsd:anyAttribute/>
    </xsd:complexType>
    <!-- MIDP-1.0 Screens -->
    <!-- Alert, Form, List, TextBox -->
    <!-- List -->
    <!--
    <xsd:complexType name="list-type">
        <xsd:complexContent>
            <xsd:extension base="screen-base-type">
                <xsd:sequence>
                    <xsd:element name="choices"
                        type="choices-type" />
                    <xsd:element name="onSelect" type="event
```

```
                handler-type"/>
        </xsd:sequence>
        <xsd:attribute name="context" type="choice
            context-type" />
    </xsd:extension>
  </xsd:complexContent>
</xsd:complexType>
<!-- Form -->
<xsd:complexType name="form-type">
  <xsd:complexContent>
    <xsd:extension base="screen-base-type">
        <xsd:sequence maxOccurs="unbounded">
            <xsd:element ref="item" minOccurs="0"
                maxOccurs="unbounded"/>
        </xsd:sequence>
    </xsd:extension>
  </xsd:complexContent>
</xsd:complexType>
<!-- TextBox -->
<xsd:complexType name="textbox-type">
  <xsd:complexContent>
    <xsd:extension base="screen-base-type">
        <xsd:sequence>
            <xsd:element name="text" type=
                "xsd:string"/>
        </xsd:sequence>
        <xsd:attribute name="constraint" type="text
            constraint-type" use="required"/>
        <xsd:attribute name="maxSize" type="text
            constraint-type" use="required"/>
    </xsd:extension>
  </xsd:complexContent>
</xsd:complexType>
<!-- Alert -->
<xsd:simpleType name="alertType-type">
    <xsd:restriction base="xsd:string">
        <xsd:enumeration value="ALARM"/>
        <xsd:enumeration value="CONFIRMATION"/>
        <xsd:enumeration value="ERROR"/>
        <xsd:enumeration value="INFO"/>
        <xsd:enumeration value="WARNING"/>
    </xsd:restriction>
</xsd:simpleType>
<xsd:complexType name="alert-type">
  <xsd:complexContent>
    <xsd:extension base="screen-base-type">
        <xsd:sequence>
            <xsd:element name="message" type=
                "xsd:string"/>
            <xsd:element name="image"    type=
                "xsd:string"/>
            <xsd:element name="sound"    type=
                "xsd:boolean"/>
        </xsd:sequence>
        <xsd:attribute name="type" type="alertType
            type"/>
        <xsd:attribute name="timeOut"
            type="xsd:integer"/>
    </xsd:extension>
  </xsd:complexContent>
</xsd:complexType>
<!-- MIDML-1.0 Predefined Screens -->
<xsd:element name="screen" type="screen-base-type"/>
<xsd:element name="list-screen"
    substitutionGroup="screen" type="list-type"/>
<xsd:element name="form-screen"
    substitutionGroup="screen" type="form-type"/>
<xsd:element name="alert-screen"
    substitutionGroup="screen" type="alert-type"/>
<xsd:element name="textBox-screen"
    substitutionGroup="screen" type="textbox-type"/>
</xsd:schema>
```

Listing 8

```
<?xml version="1.0"?>
<xsd:schema xmlns:xsd="http://www.w3.org/2001/XMLSchema"
    targetNamespace="http://www.sun.com/dynamid"
    xmlns="http://www.sun.com/dynamid"
    elementFormDefault="qualified">
    <!--xsd:include schemaLocation="utils.xsd"/-->
    <xsd:include schemaLocation="operations.xsd"/>
    <xsd:complexType name="event-type">
        <xsd:sequence>
            <xsd:element name="action" type = "event-handler
                type"/>
        </xsd:sequence>
    </xsd:complexType>
</xsd:schema>
```

Listing 9

```
<?xml version="1.0"?>
<xsd:schema xmlns:xsd="http://www.w3.org/2001/XMLSchema"
    targetNamespace="http://www.sun.com/dynamid"
    xmlns="http://www.sun.com/dynamid"
    elementFormDefault="qualified">
    <xsd:include schemaLocation="utils.xsd"/>
        <xsd:include schemaLocation="operations.xsd"/>
    <!-- QAZ eyalto: definitions of timer-type -->
    <!-- MIDP 1.0 timer type -->
    <xsd:complexType name="timer-type">
        <xsd:sequence>
            <xsd:element name="onTime" type="event-handler
                type"/>
        </xsd:sequence>
        <xsd:attribute name="name" type="midml-name-type"
            use="required"/>
        <xsd:attribute name="delay" type="xsd:positiveInteger"
            use="required"/>
        <xsd:attribute name="schedule" type="xsd:time"
            use="optional"/>
    </xsd:complexType>
    <!-- MIDML servlet types -->
    <xsd:simpleType name="servlet-protocol-type">
        <xsd:restriction base="xsd:string">
            <xsd:enumeration value="NONE"/>
            <xsd:enumeration value="TEXT"/>
            <xsd:enumeration value="BOOLEAN"/>
        </xsd:restriction>
    </xsd:simpleType>
    <xsd:simpleType name="http-method-type">
        <xsd:restriction base="xsd:string">
            <xsd:enumeration value="POST"/>
            <xsd:enumeration value="GET"/>
            <xsd:enumeration value="HEAD"/>
        </xsd:restriction>
    </xsd:simpleType>
    <xsd:complexType name="param-type">
        <xsd:simpleContent>
            <xsd:extension base="xsd:string">
                <xsd:attribute name="name" type=
                    "midml-name-type"/>
            </xsd:extension>
        </xsd:simpleContent>
    </xsd:complexType>
    <!-- Servlet Type Decleration -->
    <xsd:complexType name="servlet-type">
        <xsd:sequence>
            <!-- Servlet Parmeters Decleration -->
            <xsd:element name="param"    type="param-type"
                minOccurs="0" maxOccurs="unbounded"/>
        </xsd:sequence>
        <xsd:attribute name="name"    type="midml-name
            type" use="required"/>
        <xsd:attribute name="protocol"    type="servlet
            protocol-type" use="optional"/>
        <xsd:attribute name="method"    type="http-method
```

```
            type" use="required"/>
        <xsd:attribute name="url"    type="xsd:anyURI"
            use ="required"/>
    </xsd:complexType>
    <xsd:complexType name="text-servlet-type">
        <xsd:complexContent>
            <xsd:extension base="servlet-type">
            </xsd:extension>
        </xsd:complexContent>
    </xsd:complexType>
    <xsd:complexType name="boolean-servlet-type">
        <xsd:complexContent>
            <xsd:extension base="servlet-type">
                <xsd:sequence>
                    <xsd:element name="response" type="boolean
                        variable-type"/>
                </xsd:sequence>
            </xsd:extension>
        </xsd:complexContent>
    </xsd:complexType>
    <!-- activate-timer-type activation global element -->
<xsd:element name="timer" type="timer-type"/>
    <!-- servlet global element that implement the servelt
        hierarchy-->
    <xsd:element name="servlet" type="servlet-type"/>
    <xsd:element name="textServlet" substitutionGroup="servlet"
type="text-servlet-type"/>
    <xsd:element name="booleanServlet"
    substitutionGroup="servlet" type="boolean-servlet-type"/>
</xsd:schema>
```

Listing 10

```
<?xml version="1.0"?>
<xsd:schema xmlns:xsd="http://www.w3.org/2001/XMLSchema"
    targetNamespace="http://www.sun.com/dynamid"
    xmlns="http://www.sun.com/dynamid"
    elementFormDefault="qualified">
        <xsd:include schemaLocation="utils.xsd"/>
    <xsd:simpleType name="File-Size-type">
        <xsd:restriction base="xsd:nonNegativeInteger">
            <xsd:minInclusive value ="100" fixed="true"/>
        </xsd:restriction>
    </xsd:simpleType>
    <xsd:simpleType name="MicroEdition-Configuration-type">
        <xsd:restriction base="xsd:string">
            <xsd:enumeration value="CLDC-1.0"/>
            <xsd:enumeration value="CDC-1.0" />
        </xsd:restriction>
    </xsd:simpleType>
    <xsd:simpleType name="MicroEdition-Profile-type">
        <xsd:restriction base="xsd:string">
            <xsd:enumeration value="MIDP-1.0"/>
        </xsd:restriction>
    </xsd:simpleType>
    <xsd:complexType name="Optional-Property-type">
        <xsd:sequence>
            <xsd:element name="Key"    type="xsd:string" />
            <xsd:element name="Value" type="xsd:string" />
        </xsd:sequence>
    </xsd:complexType>
    <!--
        midlet oriented descriptor type
    -->
    <xsd:complexType name="midlet-descriptor-type">
        <xsd:sequence>
            <!-- reference to the midmlappp file file -->
            <xsd:element name="midlet-name"    type="xsd:string"/>
            <xsd:element name="icon"    type="xsd:anyURI"/>
        </xsd:sequence>
    </xsd:complexType>
    <!--
        jad oriented descriptor type
```

```
    can be extended with a futur inheritence mechanism
    -->
    <xsd:complexType name="jad-descriptor-type">
        <xsd:sequence>
            <!-- MIDlet's go here -->
            <xsd:element name="MIDlet-Descriptor"
                type="midlet-descriptor-type" />
            <!-- Required -->
            <xsd:element name="MIDlet-Jar-Size"
                type="File-Size-type" minOccurs="0" maxOccurs=
                "1"/>
            <xsd:element name="MIDlet-Jar-URL"
                type="xsd:anyURI" />
            <xsd:element name="MIDlet-Name" type="xsd:string" />
            <xsd:element name="MIDlet-Vendor"
                type="xsd:string" />
            <xsd:element name="MIDlet-Version"
                type="midml-version-type" />
            <xsd:element name="MicroEdition-Configuration"
                type="MicroEdition-Configuration-type" />
            <xsd:element name="MicroEdition-Profile"
                type="MicroEdition-Profile-type" />
            <!-- optional -->
            <xsd:element name="MIDlet-Data-Size"
                type="xsd:positiveInteger" minOccurs="0"
                maxOccurs="1"/>
            <xsd:element name="MIDlet-Delete-Confirm"
                type="xsd:boolean" minOccurs="0" maxOccurs="1"/>
            <xsd:element name="MIDlet-Description"
                type="xsd:string" minOccurs="0" maxOccurs="1"/>
            <xsd:element name="MIDlet-Icon" type="xsd:anyURI"
                minOccurs="0" maxOccurs="1"/>
            <xsd:element name="MIDlet-Info-URL" type=
                "xsd:anyURI"
                minOccurs="0" maxOccurs="1"/>
            <xsd:element name="MIDlet-Property" type="Optional
                Property-type" minOccurs="0"
                maxOccurs="unbounded" />
        </xsd:sequence>
    </xsd:complexType>
    <!--
    midml project oriented descriptor type
    -->
    <xsd:complexType name = "midml-project-descriptor-type">
        <xsd:sequence>
            <!--name of the midml app described by
                the descriptor ->
            <xsd:element name="app-start-file"
                type="xsd:anyURI" />
            <!-- the app descriptor for the midmlapp contains the
                url if the app instance-->
            <xsd:element name="descriptor" type="jad-descriptor
                type" />
        </xsd:sequence>
    </xsd:complexType>
    <xsd:element name="jad-descriptor" type ="jad-descriptor
        type"/>
</xsd:schema>
```

Listing 11

```
<HTML>
<!- - example for a static midlet URL - -->
<a href="http://israel.sun.com/staticMIDlets/packman.jad"/>
<!- - example for a dynamic midlet URL - -->
<a
href="http://israel.sun.com/DynaMID/servlets/dynamicPackman.jad
"/>
</HTML>
```

Listing 12

```
http://student2.israel.sun.com/dynamid/servlets/MIDMLServlet
```

Listing 13

```
http://sun.dynamid.com/midlets/MyMidlet?
   dynamid=nowarn=false;debug=none;
   & midlet=username=David;id=032803402;&
```

Listing 14

```
<midml
    xmlns="http://www.sun.com/dynamid"
    xmlns:xsi="http://www.w3.org/2001/XMLSchema-instance"
    xsi:schemaLocation="http://www.sun.com/dynamid
        midml.xsd"
    version="1.0">
.
.
Source code / Project file Elements
.
.
</midml>
```

Listing 15

```
<app-descriptor>
    <app-start-file>
        file://c: /DynaMID/midml/dynaMIDlet.midml
    </app-start-file>
    <descriptor>
        <MIDlet-Descriptor>
            <midlet-name>dynaMIDlet</midlet-name>
            <icon>http://www.icons.com/myicons/jamaika.png</icon>
        </MIDlet-Descriptor>
        <MIDlet-Name>dynaMIDlet</MIDlet-Name>
        <MIDlet-Vendor>DynaMID Factories inc.</MIDlet-Vendor>
        <MIDlet-Version>1.0</MIDlet-Version>
        <MicroEdition-Configuration>CLDC-1.0
        </MicroEdition-Configuration>
        <MicroEdition-Profile>MIDP-1.0</MicroEdition-Profile>
        <MIDlet-Delete-Confirm>true</MIDlet-Delete-Confirm>
        <MIDlet-Description>text</MIDlet-Description>
        <MIDlet-Info-URL>http://www.DynaMID.com/midlet.html
        </MIDlet-Info-URL>
    </descriptor>
</app-descriptor>
```

Listing 16

```
<midml
xmlns="http://www.sun.com/dynamid"
    xmlns:xsi="http://www.w3.org/2001/XMLSchema-instance"
    xsi:schemaLocation="http://www.sun.com/dynamid
        midml.xsd"
    version="1.0">
    <midml-app name="MIDlet-Application-Name">
    <!- - includes - ->
    <!- - variables, screens definitions - ->
```

-continued

```
    <!- - application event handlers - ->
    <onStartApp>
        <!- - operations - ->
        .
        .
        .  <!- A link to the applications first screen - ->
           <link ref="Application-First-Screen"/>
    </onStartApp>
    <onPauseApp>
        .
        .
        <!- - operations - ->
        .
        .
    </onPauseApp>
    <onDestroyApp>
        .
        .
        <!- - operations - ->
        .
        .
    </onDestroyApp>
    <onResumeApp>
        .
        .
        <!- - operations - ->
        .
        .
    </onResumeApp>
    </midml-app>
</midml>
```

Listing 17

```
<include href=
    "http://www.dynaMID.com/forms/WaitAllertSample.midml"/>
```

Listing 18

```
<command
    label="Command-Name" commandType="CANCEL" priority="2">
    <onCommandAction>
    </onCommandAction>
</command>
```

Listing 19

```
<ticker>
    <tickerText>UISampleForm ticker</tickerText>
</ticker>
```

Listing 20

```
<gaugeItem interactive="false">
    <label>GaugeItem</label>
    <maxValue>100</maxValue>
    <value>50</value>
    <onItemStateChanged>
```

Listing 21

```
        .
        <!-- operations -->
        .
        .
        </onItemStateChanged>
    </gaugeItem>
```

Listing 22

```
<textFieldItem
        name="tickerTextField" maxSize="30" constraint="ANY">
    <label>Title</label>
    <text>UISampleForm</text>
    <onItemStateChanged>
        .
        <!-- operations -->
        .
        .
    </onItemStateChanged>
</textFieldItem>
```

Listing 23

```
<dateFieldItem>
    <label>DateFieldItem</label>
    <!-- uncomment one of 3 fields that define
         the date context: DATE/TIME/DATE_TIME -->
    <dateTime>1999-05-31T13:20:00-05:00</dateTime>
    <!-- date>1999-05-31</date -->
    <!-- time>12:59:59.999</time -->
    <timeZone> </timeZone>
    <onItemStateChanged>
    </onItemStateChanged>
</dateFieldItem>
```

```
<choiceGroupItem name="myChoiceGroup" choiceType="SINGLE">
    <label>choiceGroupItem</label>
    <choices>
        <choice name="myChoice1"
            selected="true" image="/res/1.png"> choice text 1
        </choice>
        <choice name="myChoice2"
            selected="true" image="/res/2.png"> choice text 2
        </choice>
    </choices>
    <onItemStateChanged>
    </onItemStateChanged>
</choiceGroupItem>
```

Listing 24

```
<stringItem name="strTitle">
    <label>ItemLabel</label>
    <text>Welcome to MIDML</text>
    <onItemStateChanged>
    </onItemStateChanged>
</stringItem>
```

Listing 25

```
<imageItem name="myImage" layout="LAYOUT_DEFAULT">
    <label>ImageItem</label>
    <imageSource>http://myImages/image1.png</imageSource>
    <altText>The Alt. Text</altText>
    <onItemStateChanged>
    </onItemStateChanged>
</imageItem>
```

Listing 26

```
<timer name="timerTest" delay="100" schedule="17:00">
    <onTime>
        .
        <!-- operations -->
        .
        .
    </onTime>
</timer>
```

Listing 27

```
<alert-screen name="WaitAlertSample" type="INFO" timeOut="20">
    <title>Please Wait</title>
    <ticker> </ticker>
    <message>Please wait while loading...</message>
    <image> </image>
    <sound>true</sound>
</alert-screen>
```

Listing 28

```
<form-screen name="UISampleForm">
    <!-- base type elements -->
    <title>UISampleForm</title>
    <ticker>
        <tickerText>UISampleForm ticker</tickerText>
    </ticker>
    <!-- form widgets items and variables -->
    <!-- screen event handlers -->
    <onLoad>
        .
        <!-- operations -->
        .
        .
```

Listing 29

```
        </onLoad>
        <onUnLoad>
        .
            <!-- operations -->
        .
        .
        </onUnLoad>
    </form-screen>
```

Listing 30

```
<textBox-screen
    name="TextBoxSample" maxSize="20" constraint="ANY">
    <!-- base type elements -->
    <title>UISampleForm</title>
    <ticker>
        <tickerText>UISampleForm ticker</tickerText>
    </ticker>
    <!-- form widgets items and variables -->
    <!-- screen event handlers -->
    <onLoad>
    </onLoad>
    <onUnLoad>
    </onUnLoad>
</form-screen>
```

Listing 31

```
<list-screen name="UISampleList">
    <!-- base type elements -->
    <title>UISampleList</title>
    <ticker>
        <tickerText>UISampleList ticker</tickerText>
    </ticker>
    <!-- list choices -->
    <!-- screen event handlers -->
    <choices>
        <choice
            name="myChoice1" selected="true" image="/res/1.png">
            choice text 1
        </choice>
        <choice
            name="myChoice2" selected="true" image="/res/2.png">
            choice text 2
        </choice>
    </choices>
    <onLoad>
    </onLoad>
    <onUnLoad>
    </onUnLoad>
    <onSelect>
    </onSelect>
</form-screen>
```

```
<variable name="myVar" persist="SCREEN"> Data </variable>
```

Listing 32

```
<alert-screen name="WaitAlertSample" type="INFO" timeOut="20"
persist="APPLICATION">
    <title>Please Wait</title>
    <message>Please wait while loading...</message>
    <image></image>
    <sound>true</sound>
</alert-screen>
```

Listing 33

```
<if eval="BOOLEAN expression">
    <then>
    .
        <!-- Operations -->
    .
    .
    </then>
    <else>
    .
        <!-- Operations -->
    .
    .
    </else>
</if>
```

Listing 34

```
<booleanServlet
    name="testBoolServlet"
    method="GET"
    url="http://dyanmid.sun.com/dyanServ">
    <param name="login">nl133575</param>
    <param name="password">XCCDEECFD$2$!@ED</param>
</booleanServlet>
```

Listing 35

```
<textServlet
    name="testTextServlet"
    method="GET"
    url="http://dyanmid.sun.com/dyanServ">
    <param name="inputData">This is the data</param>
</textServlet>
```

Listing 36

```
# extension configuration:
# ------------------------------
# define the extensions entries configuration in entry name
    dynamid.extensions
# i.e.
dynamid.extensions= "Extension1", "Extension2", ...
# every.extension entry has the following configuration:
# i.e.
```

```
dynamid.extensions.ENTRY-NAME.tagname= "correlated
    tag name"
dynamid.extensions.ENTRY-NAME.descriptor="correlated
    descriptor class"
dynamid.extensions.ENTRY-NAME
    generator="correlated generator class"

# extension configuration example
dynamid.extensions = AcmeCellLogin
dynamid.extensions.AcmeCellLogin.tagname = acmecellLogin
dynamid.extensions.AcmeCellLogin.descriptor =
    com.acmecell.AcmeCellLoginDescriptor
dynamid.extensions.AcmeCellLogin.generator =
    com.acmecell.AcmeCellLoginGenerator
```

Listing 37

```
dynaMIDlet.mpr
<!--
    MIDML Application Project file for DynaMIDlet.midml
        application
    this file MIDML file contains a single element, which is
    the app-descriptor containing
    + MIDML apploction description oriented
        data ( i.e. app-start-file )
    + JAD oriented data ( i.e., jar-url MIDlet-Version etc' )
-->
<midml
    xmlns="http://www.sun.com/dynamid"
    xmlns:xsi="http://www.w3.org/2001/XMLSchema-instance"
    xsi:schemaLocation="http://www.sun.com/dynamid
                midml.xsd"     version="1.0">
    <app-descriptor>
        <app-start-file>
            file://c:/Projects/DynaMID/samples/midml/
            DynaMIDlet.midml
        </app-start-file>
        <descriptor>
            <MIDlet-Descriptor>
                <midlet-name>DynaMIDlet</midlet-name>
                <icon>http://www.icons.com/myicons/jamaika.png
                </icon>
            </MIDlet-Descriptor>
            <MIDlet-Jar-URL>
                http://www.myGeneratedMidlet.com/generated/
                midlets.jar
            </MIDlet-Jar-URL>
            <MIDlet-Name>dynaMIDlet</MIDlet-Name>
            <MIDlet-Vendor>DynaMID Factories inc.
            </MIDlet-Vendor>
            <MIDlet-Version>1.0</MIDlet-Version>
            <MicroEdition-Configuration>CLDC-1.0</MicroEdition-
                Configuration>
            <MicroEdition-Profile>MIDP-1.0</MicroEdition-Profile>
            <MIDlet-Delete-Confirm>true</MIDlet-Delete-Confirm>
            <MIDlet-Description>
                this is the first generated midlet in the world !!
            </MIDlet-Description>
            <MIDlet-Info-URL>
                http://www.DynaMID.com/first/Generated/midlet.html
            </MIDlet-Info-URL>
        </descriptor>
    </app-descriptor>
</midml>
```

Listing 38

```
dynaMIDlet.midml
<!--
    MIDML Application starting point file. for the DynaMIDlet
        application
    This file contains the mandatory element <midml-app> for a
        starting point file
    startApp- application predefined start event performs the
        link to the first application screen.
    DynaMIDlet defines a form and includes another form defined
        in another file.
-->
<midml
    xmlns="http://www.sun.com/dynamid"
    xmlns:xsi="http://www.w3.org/2001/XMLSchema-instance"
    xsi:schemaLocation="http://www.sun.com/dynamid
                midml.xsd"     version="1.0">
    <midml-app name="DynaMIDlet">
        <include
            href="http://stam.include.forms/
            GoodByeAlert.midml"/>
        <form-screen name="UISampleForm" source="MIDP-1.0">
            <!-- base type elements -->
            <title>UISampleForm</title>
            <ticker>UISampleForm ticker</ticker>
            <!-- form elements and variables-->
            <var name="defaultTicker">UISampleForm ticker</var>
            <var name="defaultTitle">UISampleForm</var>
            <command label="Cancel" commandType="CANCEL"
                priority="2">
                <onCommandAction>
                    <assign>
                        DynaMIDlet.UISample.title =
                            DynaMIDlet.UISample.defaultTitle
                    </assign>
                    <assign>
                        DynaMIDlet.UISample.ticker =
                            DynaMIDlet.UISample.defaultTicker
                    </assign>
                    <assign>
                        DynaMIDlet.tickerTextField =
                            DynaMIDlet.UISample.defaultTicker
                    </assign>
                    <assign>
                        DynaMIDlet.titleTextField =
                            DynaMIDlet.UISample.defaultTitle
                    </assign>
                </onCommandAction>
            </command>
            <command label="Exit" commandType="EXIT"
                priority="2">
                <onCommandAction>
                    <link ref="DynaMIDlet.GoodByeAlert" />
                    <signal>destroyApp</signal>
                </onCommandAction>
            </command>
            <command label="Ok" commandType="OK"
                priority="1">
                <onCommandAction>
                    <assign>
                        DynaMIDlet.UISample.defaultTitle =
                            DynaMIDlet.UISample.titleTextField
                    </assign>
                    <assign>
                        DynaMIDlet.UISample.defaultTicker =
                            DynaMIDlet.UISample.tickerTextField
                    </assign>
                    <assign>
                        DynaMIDlet.UISample.title =
                            DynaMIDlet.UISample.titleTextField
                    </assign>
                    <assign>
                        DynaMIDlet.UISample.ticker =
                            DynaMIDlet.UISample.tickerTextField
                    </assign>
                </onCommandAction>
            </command>
            <stringItem>
                <label></label>
                <text>this is the first sample app</text>
            </stringItem>
            <imageItem layout="LAYOUT_CENTER">
            <imageSource>http://www.mypics.com/image.png</imageSource>
                <altText>[sample image]</altText>
```

```
            </imageItem>
            <textFieldItem name="titleTextField" maxSize="18"
                    constraint="ANY">
                <label>Title</label>
                <text>UISampleForm</text>
            </textFieldItem>
            <textFieldItem name="tickerTextField" maxSize="30"
                    constraint="ANY">
                <label>Title</label>
                <text>UISampleForm</text>
            </textFieldItem>
        <form-screen>
        <var name="placeHolder">simple place holder</var>
        <startApp>
            <link ref="DynaMIDlet.UISampleForm"/>
        </startApp>
        <pauseApp></pauseApp>
        <destroyApp>
        </destroyApp>
        </midml-app>
</midml>
```

Listing 39

```
GoodByeAlert.midml
<midml
    xmlns="http://www.sun.com/dynamid"
        xmlns:xsi="http://www.w3.org/2001/XMLSchema-instance"
        xsi:schemaLocation="http://www.sun.com/dynamid
                midml.xsd"    version="1.0">
        <alert-screen name="GoodByeAlert" type="INFO" timeOut="60" >
            <title>GoodBye</title>
            <ticker>
                <tickerText>Bye buy Bye buy ;-)</tickerText>
            </ticker>
            <message>Thank you for using DynaMID, Goodbye</message>
            <image></image>
            <sound>true</sound>
        </alert-screen>
</midml>
```

Listing 40

```
UISampleForm.midml
<midml
    xmlns="http://www.sun.com/dynamid"
        xmlns:xsi="http://www.w3.org/2001/XMLSchema-instance"
        xsi:schemaLocation="http://www.sun.com/dynamid
                    midml.xsd"
    version="1.0">
    <includehref=
      "http://www.dynaMID.com/forms/WaitAllertSample.midml"/>
    <form-screen name="UISampleForm" source="MIDP-1.0">
        <!-- base type elements -->
        <title>UISampleForm</title>
        <ticker>
            <tickerText>UISampleForm ticker</tickerText>
        </ticker>
        <!-- form elements and variables-->
        <var name="defaultTicker">UISampleForm ticker</var>
        <var name="defaultTitle">UISampleForm</var>
        <command label="Cancel" commandType="CANCEL"
            priority="2">
            <onCommandAction>
                <assign>
                    DynaMIDlet.UISample.title =
                    DynaMIDlet.UISample.defaultTitle
                </assign>
                <assign>
                    DynaMIDlet.UISample.ticker =
                    DynaMIDlet.UISample.defaultTicker
                </assign>
                <assign>
                    DynaMIDlet.tickerTextField =
                    DynaMIDlet.UISample.defaultTicker
                </assign>
                <assign>
                    DynaMIDlet.titleTextField =
                    DynaMIDlet.UISample.defaultTitle
                </assign>
            </onCommandAction>
        </command>
        <command label="Wait" commandType="SCREEN" priority="2">
            <onCommandAction>
                <link ref="DynaMIDlet.WaitAllertSample"/>
            </onCommandAction>
        </command>
        <command label="Exit" commandType="EXIT" priority="2">
            <onCommandAction>
                <signal>destroyApp</signal>
            </onCommandAction>
        </command>
        <command label="Ok" commandType="OK" priority="1">
            <onCommandAction>
                <assign>
                    DynaMIDlet.UISample.defaultTitle =
                    DynaMIDlet.UISample.titleTextField
                </assign>
                <assign>
                    DynaMIDlet.UISample.defaultTicker =
                    DynaMIDlet.UISample.tickerTextField
                </assign>
                <assign>
                    DynaMIDlet.UISample.title =
                    DynaMIDlet.UISample.titleTextField
                </assign>
                <assign>
                    DynaMIDlet.UISample.ticker =
                    DynaMIDlet.UISample.tickerTextField
                </assign>
            </onCommandAction>
        </command>
        <stringItem>
            <label></label>
            <text>this is the first sample app</text>
        </stringItem>
        <imageItem layout="LAYOUT_CENTER">
    <imageSource>http://www.mypics.com/image.png</imageSource>
            <altText>[sample image]</altText>
        </imageItem>
        <textFieldItem name="titleTextField" maxSize="18"
                constraint="ANY">
            <label>Title</label>
            <text>UISampleForm</text>
        </textFieldItem>
        <textFieldItem name="tickerTextField" maxSize="30"
                constraint="ANY">
            <label>Title</label>
            <text>UISampleForm</text>
        </textFieldItem>
    </form-screen>
</midml>
```

Listing 41

```
bind( ):
    1) bind to specific private data
    2) get children list (data that was not bound as private
        specific data)
```

```
   3) for every child in the list create a descriptor object
      (using : factory.create(<tag name>)
   4) for every descriptor object perform descriptor.bind( )
```

Listing 42

```
generate( ):
   generate all current private data from the root descriptor
   generate class file
   generate common MIDlet code
   generate private mandatory methods and members
   iterate over the children descriptors
   for each descriptor child element create a Generator object
   (this done with enumerations)
   for each newly created generator object assign its current
   respective MIDML descriptor
   for each new generator call its generate( ) method.
```

Listing 43

```
BuildMDOM (jdomElement, mdomElement)
// Assuming a valid JDOM (parsed document tree)
      Valid ← true
      // Build the MDOM tree structure
      While (has-children? JdomElement AND Valid)
            currentJDOMElement ← jdomElement.getNextChild( )
            currentMDOMElement ←
               factory.createDescriptor
               (currentJDOMElement.getTagName)
            currentMDOMElement.setMIDMLDataElement
               (currentJDOMElement)
            // recurse here
            validationElement ←
               BuildMDOM(currentJDOMElement,
                     currentMDONElement)
            if (validationElement == null)
               Valid ← false
            mdomElement.addChild (currentMDOMElement)
      End while
      If (Valid)
         Valid = mdomElement.bind( )
      If (!Valid)
         return null
         return mdomElement
end.
```

The invention claimed is:

1. A method for generating computing application for a mobile information device, comprising the steps of:
   maintaining a cache of versions of said computing application for respective types of said mobile information device;
   preparing a descriptor object model of said computing application from a specification thereof, said descriptor object model being organized as a hierarchical tree;
   maintaining respective generator object models for said types of said mobile information device for use with said descriptor object model;
   receiving a request to download said computing application for one of said types of said mobile information device;
   determining that said cache lacks a respective version of said computing application required by said one type of said mobile application device, and responsively thereto, performing the steps of:
   performing an incremental traversal of said descriptor object model and at each of a plurality of increments of said traversal performing the steps of:
   identifying a descriptor object of said descriptor object model that requires an output code file that includes an application element to be generated;
   invoking said respective generator object model corresponding to said one type of said mobile application device to call a generator class corresponding to said descriptor object;
   generating said output code file using said generator class;
   arranging said output code file in a hierarchical file collection of output code files produced in other increments of said traversal; and
   downloading said output code file.

2. The method according to claim 1, wherein said traversal is a top-down traversal of said tree.

3. The method according to claim 1, wherein a subsequent increment of said traversal is performed only following a successful performance of an immediately preceding increment thereof.

4. The method according to claim 1, wherein said descriptor object is an application descriptor.

5. The method according to claim 1, wherein said application element is a screen.

6. The method according to claim 5, wherein said generator class comprises a program for loading said screen.

7. The method according to claim 5, wherein said generator class comprises a program for unloading said screen.

8. The method according to claim 5, wherein said step of generating said output code file comprises generating code for a command that is displayed on said screen.

9. The method according to claim 1, wherein said descriptor object is a user defined object.

10. The method according to claim 1, wherein said application element is a serviet.

11. The method according to claim 10, wherein said generator class comprises a program for establishing a connection to said servlet.

12. The method according to claim 1, wherein said application element is a timer.

13. The method according to claim 12, wherein said generator class comprises a program for handling an event that is triggered by expiration of a delay interval.

14. The method according to claim 1, wherein said application element is a ticker.

15. The method according to claim 1, wherein said step of generating said output code file comprises generating a program for identifying a state event of an item.

16. The method according to claim 1, wherein said step of generating said output code file comprises generating an event handler for a start event.

17. The method according to claim 1, wherein said step of generating said output code file comprises generating an event handler for a pause event.

18. The method according to claim 1, wherein said step of generating said output code file comprises generating an event handler for a destroy event.

19. The method according to claim 1, wherein said step of generating said output code file comprises generating a screen linking program that enables navigation from a first screen to a second screen.

20. The method according to claim 1, wherein said specification comprises tags of a markup language that correspond to functions of said application, and said markup language comprises a plurality of schemas and a root element.

21. The method according to claim 20, wherein said tags comprise a directory tag that specifies a location of source code.

22. The method according to claim 21, wherein said source code is Java source code.

23. The method according to claim 20, wherein said tags comprise a user-defined tag that extends said markup language.

24. A computer software product, comprising a computer-readable medium in which computer program instructions are stored, which instructions, when read by a computer, cause the computer to perform a method for generating a computing application for a mobile information device, comprising the steps of:
- maintaining a cache of versions of said computing application for respective types of said mobile information device;
- preparing a descriptor object model of said application from a specification thereof, said descriptor object model being organized as a hierarchical tree;
- maintaining respective generator object models for said types of said mobile information device for use with said descriptor object model;
- receiving a request to download said computing application for one of said types of said mobile information device;
- determining that said cache lacks a respective version of said computing application required by said one type of said mobile application device, and responsively thereto, performing the steps of:
- performing an incremental traversal of said descriptor object model and at each of a plurality of increments of said traversal performing the steps of:
- identifying a descriptor object of said descriptor object model that requires an output code file that includes an application element to be generated;
- invoking said respective generator object model corresponding to said one type of said mobile application device to call a generator class corresponding to said descriptor object;
- generating said output code file using said generator class;
- arranging said output code file in a hierarchical file collection of output code files produced in other increments of said traversal; and
- downloading said output code file.

25. The computer software product according to claim 24, wherein said traversal is a top-down traversal of said tree.

26. The computer software product according to claim 24, wherein a subsequent increment of said traversal is performed only following a successful performance of an immediately preceding increment thereof.

27. The computer software product according to claim 24, wherein said descriptor object is an application descriptor.

28. The computer software product according to claim 24, wherein said application element is a screen.

29. The computer software product according to claim 28, wherein said generator class comprises a program for loading said screen.

30. The computer software product according to claim 28, wherein said generator class comprises a program for unloading said screen.

31. The computer software product according to claim 28, wherein said step of generating said output code file comprises generating code for a command that is displayed on said screen.

32. The computer software product according to claim 24, wherein said descriptor object is a user defined object.

33. The computer software product according to claim 24, wherein said application element is a servlet.

34. The computer software product according to claim 33, wherein said generator class comprises a program for establishing a connection to said servlet.

35. The computer software product according to claim 24, wherein said application element is a timer.

36. The computer software product according to claim 35, wherein said generator class comprises a program for handling an event that is triggered by expiration of a delay interval.

37. The computer software product according to claim 24, wherein said application element is a ticker.

38. The computer software product according to claim 24, wherein said step of generating said output code file comprises generating a program for identifying a state event of an item.

39. The computer software product according to claim 24, wherein said step of generating said output code file comprises generating an event handler for a start event.

40. The computer software product according to claim 24, wherein said step of generating said output code file comprises generating an event handler for a pause event.

41. The computer software product according to claim 24, wherein said step of generating said output code file comprises generating an event handler for a destroy event.

42. The computer software product according to claim 24, wherein said step of generating said output code file comprises generating a screen linking program that enables navigation from a first screen to a second screen.

43. The computer software product according to claim 24, wherein said specification comprising tags of a markup language that correspond to functions of said application, and said markup language comprises a plurality of schemas and a root element.

44. The computer software product according to claim 43, wherein said tags comprise a user-defined tag that extends said markup language.

45. A data processing system for generating a mobile information device computing application, comprising:
- a computer readable memory; and
- a processor accessing said memory; said memory having a data structure stored therein, said data structure including:
- a descriptor object model that is derived from a specification of said application, said descriptor object model being organized as a hierarchical tree, said descriptor object model having descriptor objects that are adapted to induce generation of different application elements;
- a generator that is linked to said descriptor object model for generating generator classes and output code;
- said memory further storing a cache of versions of said computing application for respective types of said mobile information device, and respective generator object models for said types of said mobile information device for use with said descriptor object model, said generator object models having generator objects;
- wherein said processor is operative to:
- receive a request to download said computing application for one of said types of said mobile information device;

determine that said cache lacks a respective version of said computing application required by said one type of said mobile application device;

identify a descriptor object of said descriptor object model that requires an output code file that includes an application element to be generated;

control said generator, wherein said generate activates said respective generator object model corresponding to said one type of said mobile application device, calls a generator class corresponding to said descriptor object, produces said output code file using said generator class and arranges said output code file in a hierarchical file collection; and thereafter download said output code file to service said request.

46. The data processing system according to claim 45, wherein said output code comprises Java source code.

47. The data processing system according to claim 45, further comprising a link between said generator and a build tool, said generator having a program for accessing said build tool to obtain an identification of a project directory.

48. The data processing system according to claim 47, wherein said generator has a program for structuring said project directory.

49. The data processing system according to claim 45, wherein said generator performs is a top-down traversal of said tree.

50. The data processing system according to claim 49, wherein a subsequent increment of said traversal is performed only following a successful performance of an immediately preceding increment thereof.

51. The data processing system according to claim 45, wherein a descriptor object of said descriptor object model is an application descriptor.

52. The data processing system according to claim 45, wherein said application elements comprise a screen.

53. The data processing system according to claim 52, wherein one of said generator classes comprises a program for loading said screen.

54. The data processing system according to claim 52, wherein one of said generator classes comprises a program for unloading said screen.

55. The data processing system according to claim 52, wherein said output code comprises for a command that is displayed on said screen.

56. The data processing system according to claim 45, wherein said descriptor object is a user defined object.

57. The data processing system according to claim 45, wherein said application elements comprise a servlet.

58. The data processing system according to claim 57, wherein one of said generator classes comprises a program for establishing a connection to said servlet.

59. The data processing system according to claim 45, wherein said application elements comprise a timer.

60. The data processing system according to claim 59, wherein one of said generator classes comprises a program for handling an event that is triggered by expiration of a delay interval.

61. The data processing system according to claim 45, wherein said application elements comprise a ticker.

62. The data processing system according to claim 45, wherein said output code comprises a program for identifying a state event of an item.

63. The data processing system according to claim 45, wherein said output code comprises a screen linking program that enables navigation from a first screen to a second screen.

64. The data processing system according to claim 45, wherein said specification comprising tags of a markup language that correspond to functions of said application, said markup language comprising a plurality of schemas and a root element.

65. The data processing system according to claim 64, wherein said generator comprises a generation object factory, and said generator objects are registered in said generation object factory.

66. The data processing system according to claim 65, wherein said generator object model comprises a class structure that is created by said generation object factory.

67. The data processing system according to claim 65, wherein at least a portion of said generator objects are reused by said generator when generating said output code.

68. The data processing system according to claim 65, wherein said generation object factory is adapted to register a user-defined generator object that corresponds to an extension of said markup language.

* * * * *